(12) United States Patent
Moore et al.

(10) Patent No.: US 7,291,784 B2
(45) Date of Patent: Nov. 6, 2007

(54) FIRE RESISTANT AND/OR WATER RESISTANT ENCLOSURE FOR OPERABLE COMPUTER DIGITAL DATA STORAGE DEVICE

(75) Inventors: Robby Jay Moore, Auburn, CA (US); Steven D. Goldsberry, Auburn, CA (US); John Arthur Hendricks, Toledo, OH (US)

(73) Assignee: Auburn I.P. Holdings, LLC, Auburn, CA (US)

( * ) Notice: Subject to any disclaimer, the term of this patent is extended or adjusted under 35 U.S.C. 154(b) by 0 days.

(21) Appl. No.: 11/285,854

(22) Filed: Nov. 23, 2005

(65) Prior Publication Data

US 2007/0017685 A1     Jan. 25, 2007

Related U.S. Application Data

(63) Continuation-in-part of application No. 11/112,552, filed on Apr. 22, 2005, now Pat. No. 7,211,742.

(60) Provisional application No. 60/710,400, filed on Aug. 23, 2005, provisional application No. 60/704,745, filed on Aug. 2, 2005, provisional application No. 60/704,746, filed on Aug. 2, 2005, provisional application No. 60/704,763, filed on Aug. 2, 2005, provisional application No. 60/630,696, filed on Nov. 24, 2004.

(51) Int. Cl.
*H02G 3/08* (2006.01)

(52) U.S. Cl. .................. 174/50; 174/17 VA; 312/409; 361/694

(58) Field of Classification Search .................. 174/50, 174/17 VA, 53, 66; 361/694–695; 454/184; 312/409, 400, 223.1
See application file for complete search history.

(56) References Cited

U.S. PATENT DOCUMENTS

| 6,158,833 | A | * | 12/2000 | Engler | 312/409 |
| 6,548,753 | B1 | * | 4/2003 | Blackmon et al. | 174/50 |
| 2004/0064631 | A1 | * | 4/2004 | Kishon et al. | 711/100 |

* cited by examiner

*Primary Examiner*—Dhiru R. Patel
(74) *Attorney, Agent, or Firm*—Bruce H. Johnsonbaugh

(57) ABSTRACT

A fire and/or water resistant enclosure is provided for housing an operable digital data storage device. The enclosure is a low cost, preferably molded enclosure having various embodiments for providing resistance to fire and/or water. In one embodiment, a fan cooperates with one or more hatchless ventilation passageways to cool the digital data storage device. Passageways are sized to be sufficiently small to limit the transfer of heat through those passages sufficiently to prevent damage to the data storage device and to prevent loss of data stored thereon. Another embodiment provides a water resistant pouch surrounding the data storage device which may be made of flexible foil or of finned relatively robust and non-flexible thermal conductor. The enclosure in some embodiments utilizes a fan and in some embodiments operates without a fan. Similarly, the enclosure in some embodiments utilizes movable hatches and in other embodiments is hatchless in design.

10 Claims, 45 Drawing Sheets

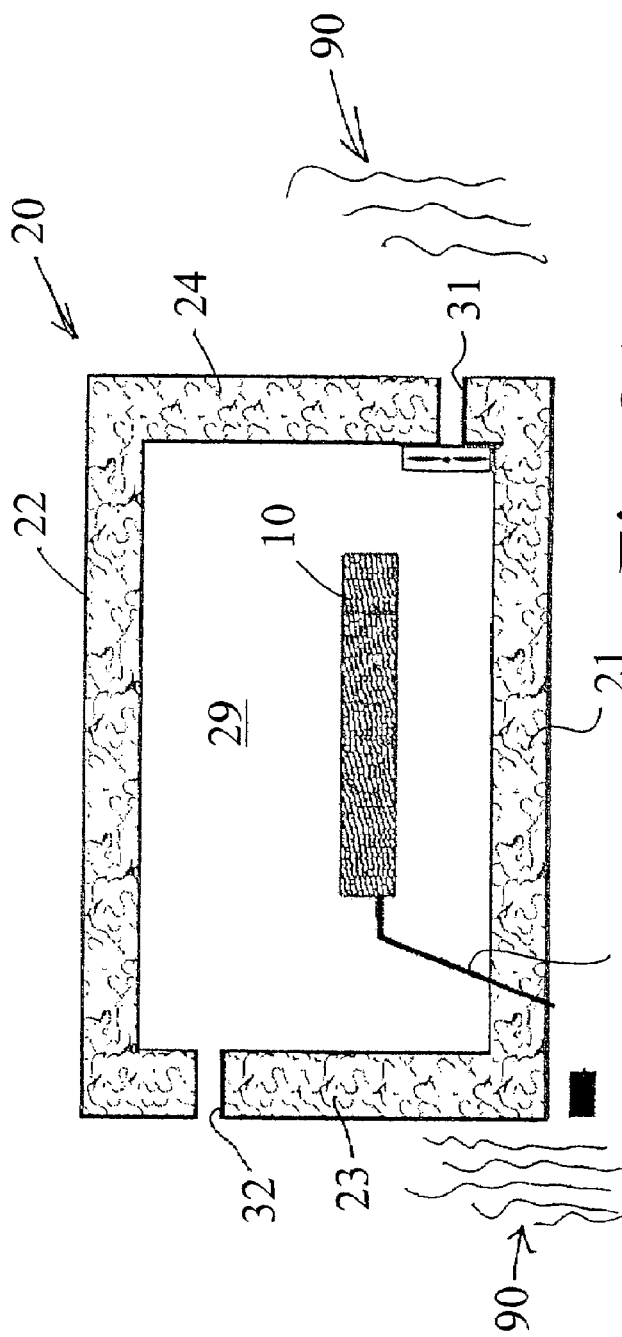
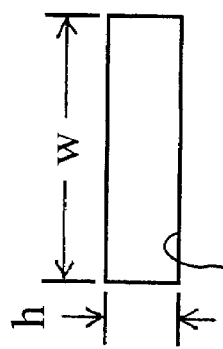
Fig. 2A
Fig. 2B

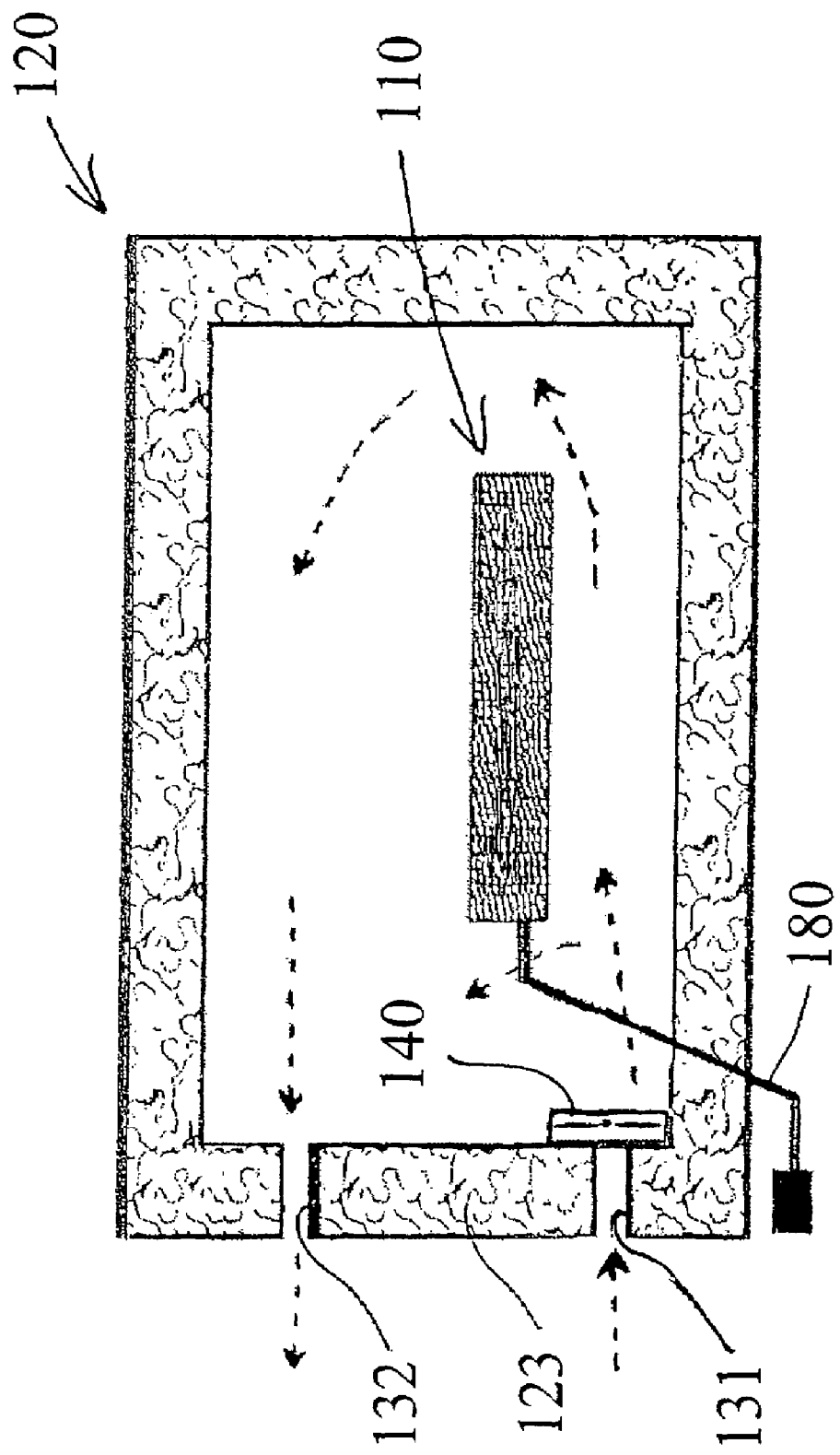

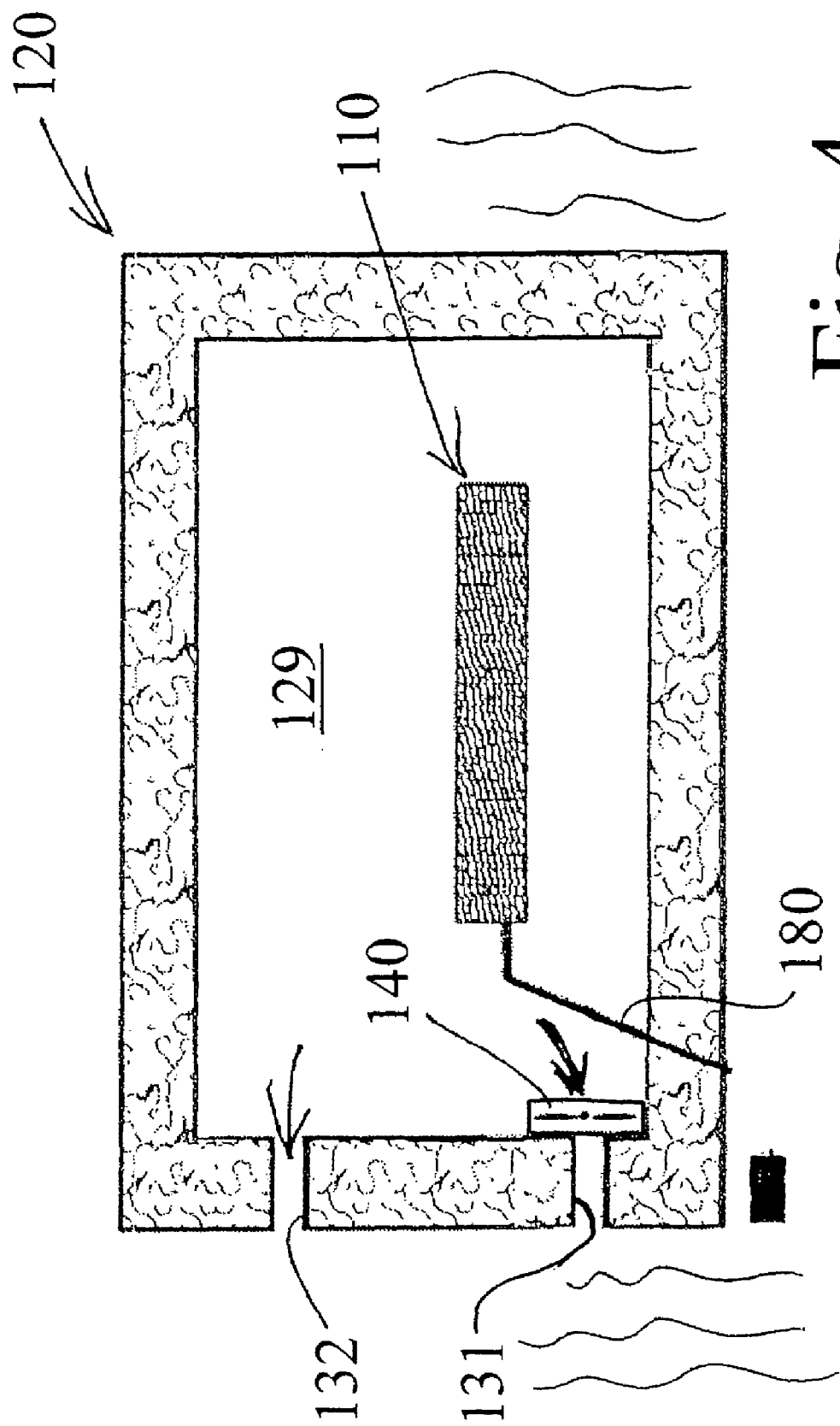

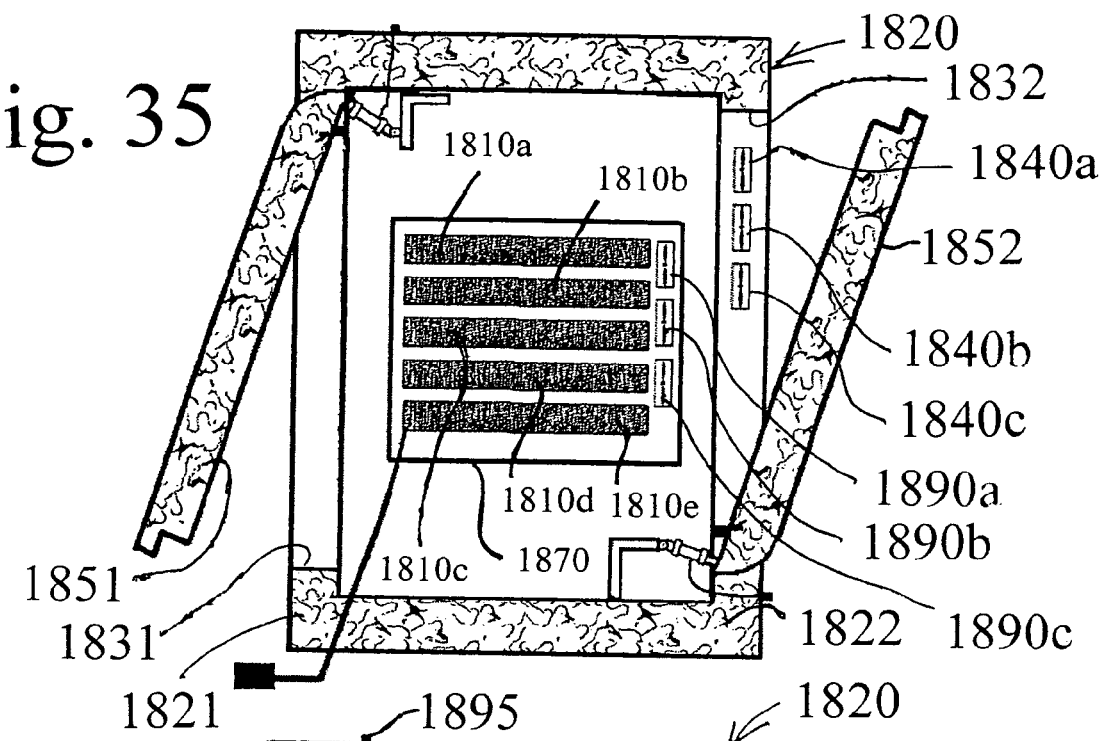
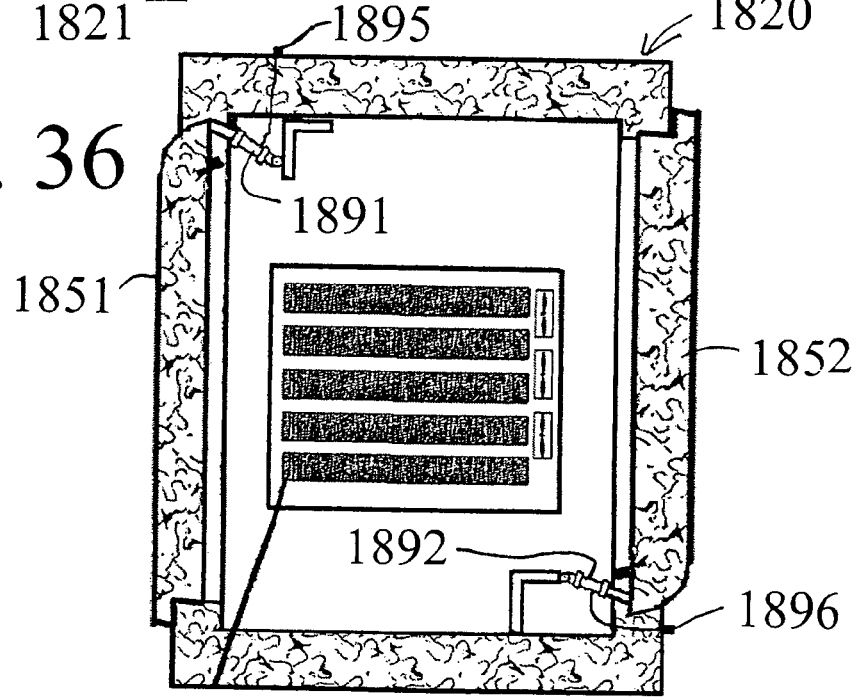

FIRE RESISTANT AND/OR WATER RESISTANT ENCLOSURE FOR OPERABLE COMPUTER DIGITAL DATA STORAGE DEVICE

CROSS REFERENCE TO RELATED APPLICATIONS

This application is a continuation-in-part of regular U.S. patent application Ser. No. 11/112,552 filed on Apr. 22, 2005 now U.S. Pat. No. 7,211,742. This application claims the benefit of and priority from U.S. provisional applications Ser. Nos. 60/630,696 filed on Nov. 24, 2004; 60/704,745 filed on Aug. 2, 2005; 60/704,746 filed on Aug. 2, 2005; 60/704,763 filed on Aug. 2, 2005 and 60/710,400 filed on Aug. 23, 2005.

BACKGROUND AND BRIEF SUMMARY OF INVENTION

The present invention relates generally to apparatus for protecting an operable computer digital data storage device from damage and loss of data resulting from fire or water exposure. More particularly, the present invention provides for the first time a compact, low cost, fire and/or water resistant enclosure for an operable computer digital data storage device. Typical computer digital data storage devices include computer hard drives, optical disk drives, solid state memory devices, tape drives, computers, or any other device which can actively read and write digital data with the intent of storing and retrieving computerized digital data.

As digital data storage devices become able to store staggering amounts of data, the loss of a digital data storage device in disasters such as fire or flood becomes more and more catastrophic. There is clearly a need to provide a compact, reliable fire and/or water resistant enclosure for operating digital data storage devices.

The present invention provides a compact, low cost, fire and/or water resistant enclosure for an operable computer digital data storage device. The present invention includes several alternate embodiments, all of which are intended to provide low cost, reliable enclosures for operating hard drives. The embodiments include, for example, hatchless enclosures with and without fans; water resistant enclosures with and without movable hatches; free convection enclosures with and without movable hatches, low cost enclosures molded of gypsum with integrally molded component supports; and enclosures with intumescent or meltable materials which, in the presence of fire, seal off passageways otherwise used to cool the data storage device.

A preferred embodiment of the present invention avoids the use of movable hatches, such as shown and described in U.S. patent application Ser. No. 11/112,552, referenced above, which application is hereby included herein by reference. The hatchless embodiment of the present invention also avoids the requirement of any fire or smoke sensing apparatus. Elimination of those components results in a significantly lower cost device. The linchpin for the preferred embodiment is the discovery that vents of a sufficiently small size will prevent damage by fire while simultaneously allowing enough forced air ventilation in the absence of fire to cool the operating storage device! We have tested the concept with a prototype subjected to fire, with no loss of data and no serious damage to the hard drive storage device! We believe that as the internal air temperature starts to rise in the presence of fire, the internal air expands and flows outwardly through the small vent or vents. (The fan or blower that forces air through the vents loses power and stops operating at the outset of a fire.) The outward flow of expanding air counteracts the flow of external heat from the fire through the small vents into the internal chamber. The small vent or vents can be designed as tortuous or labyrinthian passages to reduce the amount of external heat from a fire that flows into the inner chamber.

Our discovery is confirmed by the following calculation. Assuming constant atmospheric pressure, the internal volume of air will expand proportionally to the temperature rise in Kelvin ($T_{kelvin}=T_{centigrade}+273.15$) according to the ideal gas theory and Boyle's Law [$(P_1V_1)/T_1=(P_2V_2)/T_2$]. Assuming an initial temperature of 298 K (25° C.) and a final temperature of 373 K (100° C.), the internal chamber volume of air is expected to increase by approximately 25%. Therefore, it is believed that 25% of the volume of air in the inner chamber will slowly flow outwardly through the vent or vents as the temperature of the inner chamber gradually increases by 75° C. By sizing the inner chamber and vents appropriately, we have discovered that an insulated and vented chamber can be sufficiently fire resistant to prevent loss of data from most fires!!

We are unaware of any prior art fire resistant enclosures for active data storage devices wherein vents in the walls remain open in the absence of fire and in the presence of fire. The prior art does include the Olzak et al U.S. Pat. No. 6,153,720 which teaches an aircraft recorder. The enclosure for the recorder includes vents which are normally closed but become opened in the presence of fire; a phase changing, heat absorbing layer melts and drains through the vents. The vents allow equalization of pressure if the recorder falls into the ocean. The Olzak et al enclosure does not teach or suggest forced air ventilation (or any ventilation) for an operating digital data storage device wherein significant amounts of heat are generated. It is simply not usable for the purpose of the present invention.

A second preferred embodiment of the invention includes a water resistant and heat conductive "pouch" (or covering) which surrounds the data storage device. The "pouch" and data storage device are both positioned inside a fire resistant enclosure. Heat generated by the data storage device is conducted through the "pouch" (preferably metal) and is thereafter transferred to the exterior of the fire resistant enclosure by a variety of techniques. The "pouch" is fully submersible and protects the hard drive and data in up to 30 feet of water.

The prior art includes water and fire resistant enclosures for paper documents (see Gelb et al U.S. Pat. No. 4,992,310); however, such enclosures are wholly unsuitable for an operating hard drive. The prior art also includes cooling jackets for data storage devices, but the cooling jackets are not water resistant (see Cheon U.S. published application 2004/0190255).

The prior art includes a relatively large enclosure for operable digital data storage devices, such as the Engler U.S. Pat. No. 6,158,833, which dissipates heat generated by the digital data storage device by conduction through the insulated walls of the container. The Engler design requires a relatively large enclosure since it does not provide any active or fan-driven cooling system. The present invention, in contrast, provides a compact enclosure a fraction of the size of the Engler enclosure. The compact size of the present invention in one embodiment is achieved primarily because of a forced-air cooling system not present in the Engler device.

The prior art includes other digital data storage device enclosures with "passive" cooling systems, such as Pihl et al U.S. Pat. No. 5,479,341 which cools by convection through a partially open vent door. This technique is "free convection" because no fan or other active device is used to cause the convection. The Kikinis U.S. Pat. No. 5,623,597 utilizes a rather complex, passive heat exchanger with a rather large heat sink structure. That design requires a cumbersome insulation injection mechanism to fill the heat sink space when a threshold temperature is sensed. The present invention includes a "free convection" embodiment having a much simpler and more robust design than the prior art.

The prior art also includes the Kishon et al published U.S. application No. U.S. 2004/0064631 dated Apr. 1, 2004. The Kishon et al device utilizes passive conduction of heat generated by the data storage device through screws extending from ambient air to the device cover (see paragraph [0021]). This technique is limited by the relatively low amount of heat transferable through the metal screws. The active, fan-driven cooling provided by the present invention achieves a much greater cooling capacity.

The prior art also includes forced air cooling systems for operational digital data storage drives, but not used together with a compact, fire resistant enclosure.

A primary object of the invention is to provide a fire resistant and/or water resistant enclosure for an operable computer digital data storage device which is robust in design and inexpensive to produce.

A further object of the invention is to provide a fire resistant and water resistant enclosure for an operating data storage device having a hatchless enclosure which avoids the requirement of any fire or smoke sensing apparatus.

A further object of the invention is to provide a fire resistant enclosure for an operational digital data storage device utilizing vents of a sufficiently small size to prevent damage by fire while simultaneously allowing enough forced air ventilation to pass therethrough in the absence of fire to cool the operating storage device.

Another object of the invention is to provide a fire resistant enclosure for an active data storage device wherein vents in the walls of the enclosure remain open in the absence of fire and in the presence of fire.

A further object of the invention is to provide a fire resistant and water resistant enclosure for operating data storage devices molded of gypsum or other suitable molding material wherein mounts or components are integrally molded into the enclosure molding; itself.

Another object-of the invention is to provide a fire resistant enclosure for an operational hard drive wherein an intumescent or meltable material is utilized to block passageways which otherwise provide ventilation for the hard drive.

A further object of the invention is to provide an enclosure for an operating hard drive wherein a heat conductive "pouch" surrounds the hard drive, which is submersible and protects the hard drive and data storage thereon in up to 30 feet of water.

Other objects and advantages of the invention will become apparent from the following description and drawings wherein:

BRIEF DESCRIPTION OF THE DRAWINGS

FIGS. 1-26 illustrate embodiments of the invention wherein the enclosure is hatchless and a fan is utilized to drive air over the data storage device;

FIG. 1 illustrates a hatchless embodiment of the invention with ventilation passageways formed in opposite walls and with the data storage device operational;

FIG. 2A illustrates the enclosure of FIG. 1 in the presence of fire;

FIG. 2B illustrates the inlet opening 31 of the enclosure shown in FIG. 2A;

FIG. 3 illustrates an alternate embodiment wherein the enclosure has inlet and outlet passageways in the same wall;

FIG. 4 illustrates the embodiment of FIG. 3 in the presence of fire;

FIG. 5 illustrates a further embodiment wherein the enclosure utilizes tortuous pathways for the inlet and outlet ventilation passageways;

FIG. 6 illustrates the embodiment of FIG. 5 in the presence of fire;

FIG. 7 illustrates a further embodiment wherein the enclosure has a single elongated passageway that serves both as an inlet and outlet passageway;

FIG. 8 illustrates the embodiment of FIG. 7 in the presence of fire;

FIG. 9 illustrates an embodiment wherein the inlet and outlet passageways are formed in opposite walls and are lined with an intumescent material;

FIG. 10 illustrates the embodiment of FIG. 9 in the presence of fire;

FIG. 11 illustrates a further embodiment wherein elongated tubes are positioned in the ventilation passageways, the tubes being lined with intumescent material;

FIG. 12 illustrates the embodiment of FIG. 11 in the presence of fire;

FIG. 13 illustrates an enclosure housing a plurality of data storage devices and having ventilation openings lined with intumescent material;

FIG. 14 illustrates the embodiment of FIG. 13 in the presence of fire;

FIG. 15 illustrates a further embodiment wherein the enclosure has inlet and outlet passageways formed in a single side wall and wherein both inlet and outlet passageways are lined with intumescent material and wherein the exterior of the enclosure is also lined with intumescent material;

FIG. 16 illustrates the embodiment of FIG. 15 in the presence of fire;

FIG. 17 illustrates an embodiment wherein the enclosure has walls made of metal or other high strength material and wherein the entire exterior of the enclosure is lined with intumescent material;

FIG. 18 illustrates the embodiment of FIG. 17 in the presence of fire;

FIG. 19 illustrates an embodiment wherein the inlet and outlet passageways of the enclosure have a perforated plate which extends across the opening of the passageways and which is lined with intumescent material;

FIG. 20 illustrates the embodiment of FIG. 19 wherein the intumescent material has expanded in the presence of fire and has occluded the perforations in the plates and has occluded the ventilation passageways;

FIG. 21 illustrates an embodiment wherein the enclosure has elongated tubes carried by the inlet and outlet ventilation passageways and wherein those tubes are lined with a meltable material;

FIG. 22 illustrates the embodiment of FIG. 21 after it has been exposed to fire and the meltable material has coagulated and formed blobs which have occluded or completely blocked the tubes;

FIG. 23 illustrates an embodiment wherein the inlet and outlet passageways of the enclosure are formed by a plurality of hollow tubes which are lined with a meltable material;

FIG. 24 illustrates the embodiment of FIG. 23 after exposure to fire;

FIG. 25 illustrates an embodiment wherein the inlet and outlet passageways are formed of a plurality of tubes which are inclined downwardly at the exterior edge of the enclosure;

FIG. 26 illustrates the embodiment of FIG. 25 after exposure to fire;

FIG. 27 illustrates an embodiment wherein the enclosure is hatchless, has no ventilation passageways and utilizes a Peltier device to cool the data storage device;

FIG. 28 illustrates the embodiment of FIG. 27 after exposure to fire;

FIG. 29 illustrates an enclosure which is hatchless and has no ventilation passageways wherein an external PC board minimizes power to the storage device and shuts off power if the sensed temperature inside the enclosure becomes too high;

FIG. 30 illustrates the embodiment of FIG. 29 after exposure to fire;

FIG. 31 illustrates an enclosure which is hatchless and which has no ventilation passageways wherein an external and internal heat sink are thermally connected to a meltable link;

FIG. 32 illustrates the embodiment of FIG. 31 after exposure to fire;

FIGS. 33-40 illustrate embodiments of the invention wherein a "pouch" surrounds the data storage device to provide water resistance;

FIG. 33 illustrates an enclosure having a flexible foil bag as a "pouch" which encloses the data storage device and provides water resistance;

FIG. 34 illustrates an embodiment wherein a foil bag with an elastomeric or waterproof coating forms a "pouch" surrounding the data storage device;

FIG. 35 illustrates an enclosure housing a plurality of data storage devices, wherein the data storage devices are surrounded by a thermally conductive "pouch" which provides water resistance;

FIG. 36 illustrates the enclosure of FIG. 35 after the device has been exposed to fire;

FIG. 37 illustrates an enclosure wherein the water resistant "pouch" surrounding the data storage device includes a finned heat sink together with a foil bag covered with an elastomeric or other waterproof coating;

FIG. 38 illustrates an enclosure wherein the water resistant "pouch" is a relatively stiff and inflexible metal container having two parts with a perimeter gasket;

FIG. 39 illustrates an embodiment wherein the water resistant "pouch" is a finned heat sink and metal container surrounding the data storage device;

FIG. 40 illustrates an embodiment wherein the water resistant "pouch" comprises a heat sink having internal and external fins;

FIG. 43 illustrates a molded enclosure with the components in place inside the enclosure;

FIG. 44 illustrates the enclosure of FIG. 43 with the individual components removed to highlight the nature of the mold;

FIG. 45 illustrates another molded enclosure with the components in place;

FIG. 46 illustrates the enclosure of FIG. 45 without the components in place;

FIG. 47 illustrates an enclosure with an inlet hatch formed in the bottom wall and having a hinged top or upper wall;

FIG. 48 illustrates the enclosure of FIG. 47 with an optional spring attached to the cover;

FIG. 49 illustrates an enclosure wherein the only ventilation is a hinged cover or top wall actuated by a solenoid;

FIG. 50 illustrates the enclosure of FIG. 49 after exposure to fire;

FIG. 51 illustrates an enclosure having an inlet passageway on one side wall and an outlet passageway on the opposite side wall with movable hatches;

FIG. 52 illustrates the enclosure of FIG. 51 after exposure to fire;

FIG. 53 illustrates an "free convection" enclosure having an inlet passageway in a side wall and an outlet passageway in the cover or top wall;

FIG. 54 shows the enclosure of FIG. 53 after exposure to file wherein the movable hatches have been closed;

FIG. 55 illustrates a "free convection" enclosure wherein the inlet is formed in the bottom wall, the outlet is formed in the cover or top wall and having movable hatches adjacent the openings;

FIG. 56 illustrates the enclosure of FIG. 55 after exposure to fire;

FIG. 57 illustrates an enclosure having a plurality of inlet passageways formed in the side walls and end walls close to the bottom wall of the enclosure and outlet passageways formed in the side walls and end walls near the cover or top wall, all passageways lined with temperature activated material;

FIG. 58 illustrates the enclosure of FIG. 57 after exposure to fire;

FIG. 59 illustrates a two-part enclosure wherein the first or upper part is shown in its first or raised position wherein the ventilation passageways are open;

FIG. 60 illustrates the enclosure of FIG. 59 after exposure to fire wherein the first or upper part of the enclosure moves downwardly by gravity and closes the ventilation passageways;

FIG. 61 illustrates a "free convection" enclosure having an inlet in the bottom wall and an outlet in the cover or top wall;

FIG. 62 illustrates the enclosure after exposure to fire;

FIG. 63 illustrates a "free convection" enclosure having internal hatches adjacent the inlet in the bottom wall and the outlet passageway formed in the cover or top wall;

FIG. 64 illustrates the enclosure of FIG. 63 after exposure to fire;

FIG. 65 illustrates a "free convection" enclosure wherein an external hatch is positioned adjacent the outlet passageway;

FIG. 66 illustrates the enclosure of FIG. 65 after exposure to fire;

FIG. 67 illustrates an enclosure having a perforated plate lined with intumescent coating as its cover or top wall and an inlet passageway formed in its bottom wall and having a fan for forcibly driving cooling air across the data storage device;

FIG. 68 illustrates the enclosure of FIG. 67 after exposure to fire;

FIG. 69 illustrates an enclosure having a third passageway through which power and data cables extend to a data storage device; the passageways carry perforated plates lined with intumescent material; and FIG. 70 illustrates the enclosure of FIG. 69 after exposure to fire.

DETAILED DESCRIPTION OF THE DRAWINGS

A) Hatchless Enclosure with Slotted Passageways and Fan

Figure 1:
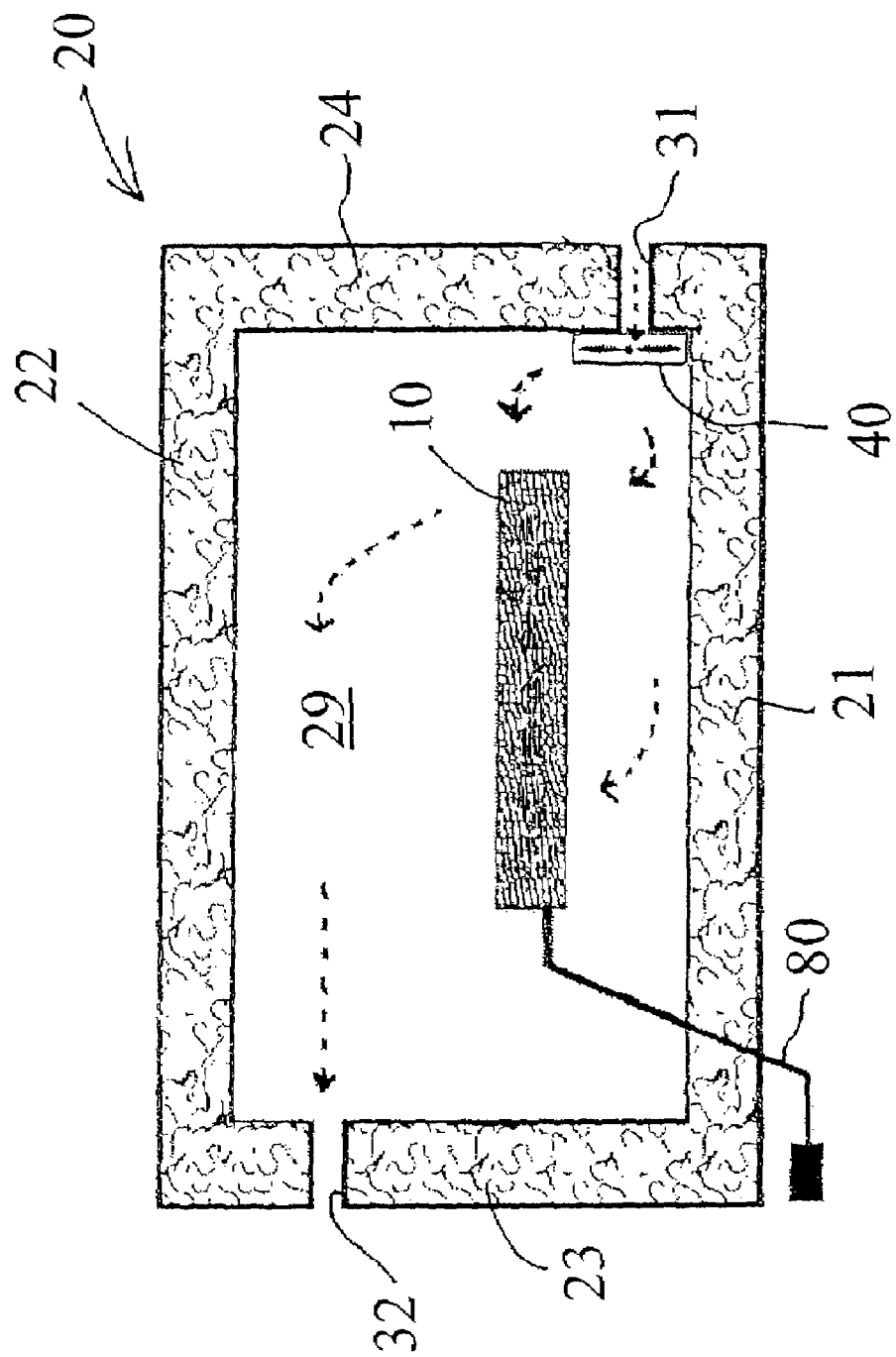

FIG. 1 illustrates a first embodiment of the present invention. A data storage device is shown generally as 10 which is most commonly a computer hard drive. The storage device 10 is connected by a data and power connection 80 which extends through the bottom wall 21 of enclosure 20. Side walls 23 and 24 each have a slit or passageway 31 or 32 formed therethrough for allowing the flow of input air through passageway 31 and exhaust air through passageway 32 as shown by the arrows in FIG. 1. A fan 40 is mounted on the inside of wall 24 adjacent the inlet passageway or vent 31 and is powered through the data and power connection 80 by a line not shown in the interest of clarity. It is to be understood that enclosure 20 includes lower wall 21, upper wall 22, side walls 23 and 24 and end walls, not shown. Enclosure 20 also includes a doorway or access cover (not shown) to gain access to storage device 10. A doorway or access cover to allow access to data storage device is provided in each of the embodiments described below. Reference is made to application Ser. No. 11/112,552 which includes a detailed description of the enclosure 20 which is not repeated here.

FIG. 2A is a schematic representation of the device of FIG. 1 as being subjected to a fire shown generally as 90. At the outset of the fire, the data and power connection is typically damaged or melted and fan 40 simply stops rotating. The fire 90 may commonly reach temperatures of 900° to 950° C. The ordinary operating temperature of the inner chamber 29 of enclosure 20 is approximately 25-30° C. The inner chamber may reach temperatures of approximately 90-95° C. without causing loss of data in the storage device 10. As noted above, as the temperature of the air in the inner chamber 29 of enclosure 20 slowly rises in response to fire, the air inside chamber 29 expands and flows outwardly through passageways 31 and 32 as shown by the arrows in FIG. 2. This flow of the expanding air counteracts and minimizes the amount of heat transmitted from fire 90 into the inner chamber 29 through passageways 31 and 32. Passageways or vents 31 and 32 are typically rectangular in shape, as shown in FIG. 2B, and have a height H of approximately 0.1 inch and a width of approximately 0.5 inch for an inner chamber 29 having a volume of approximately 120 cubic inches.

In the embodiment shown in FIG. 1, a single fan 40 draws air in through the inlet vent or slit 31 and forces the air across storage device 10 and outwardly through the outlet vent 32. The inlet and outlet vents are formed on opposite sides of the storage device 10 in opposing side walls 23 and 24 of enclosure 20.

FIGS. 3 and 4 illustrate a second embodiment of the invention wherein enclosure 120 is similar to the enclosure 20 shown in FIGS. 1 and 2 except that the inlet passageway 131 and the outlet passageway 132 are both formed in the same side wall 123. Fan 140 blows incoming air underneath storage device 110, as shown by the arrows in FIG. 3, and above storage device 110 and outwardly through exhaust passageway or vent 132.

As shown in FIG. 4, at the onset of fire, fan 140 stops rotating when the data and power connection 180 is severed by the fire. As the fire slowly causes air in the inner chamber 129 to rise in temperature, the air in the inner chamber 129 expands and flows outwardly through the vents 131 and 132, as shown by the arrows in FIG. 4.

Figure 5:
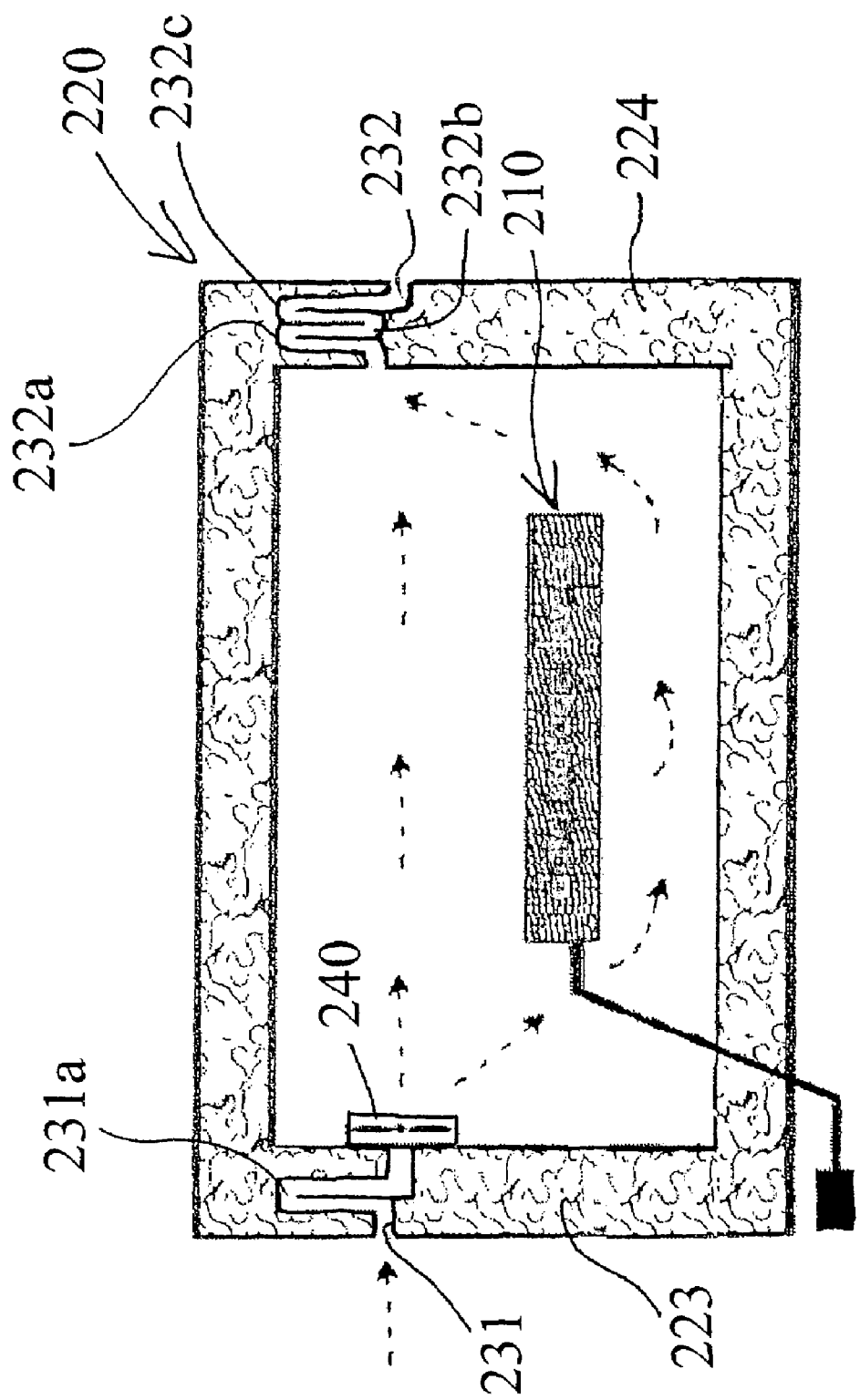
Figure 6:
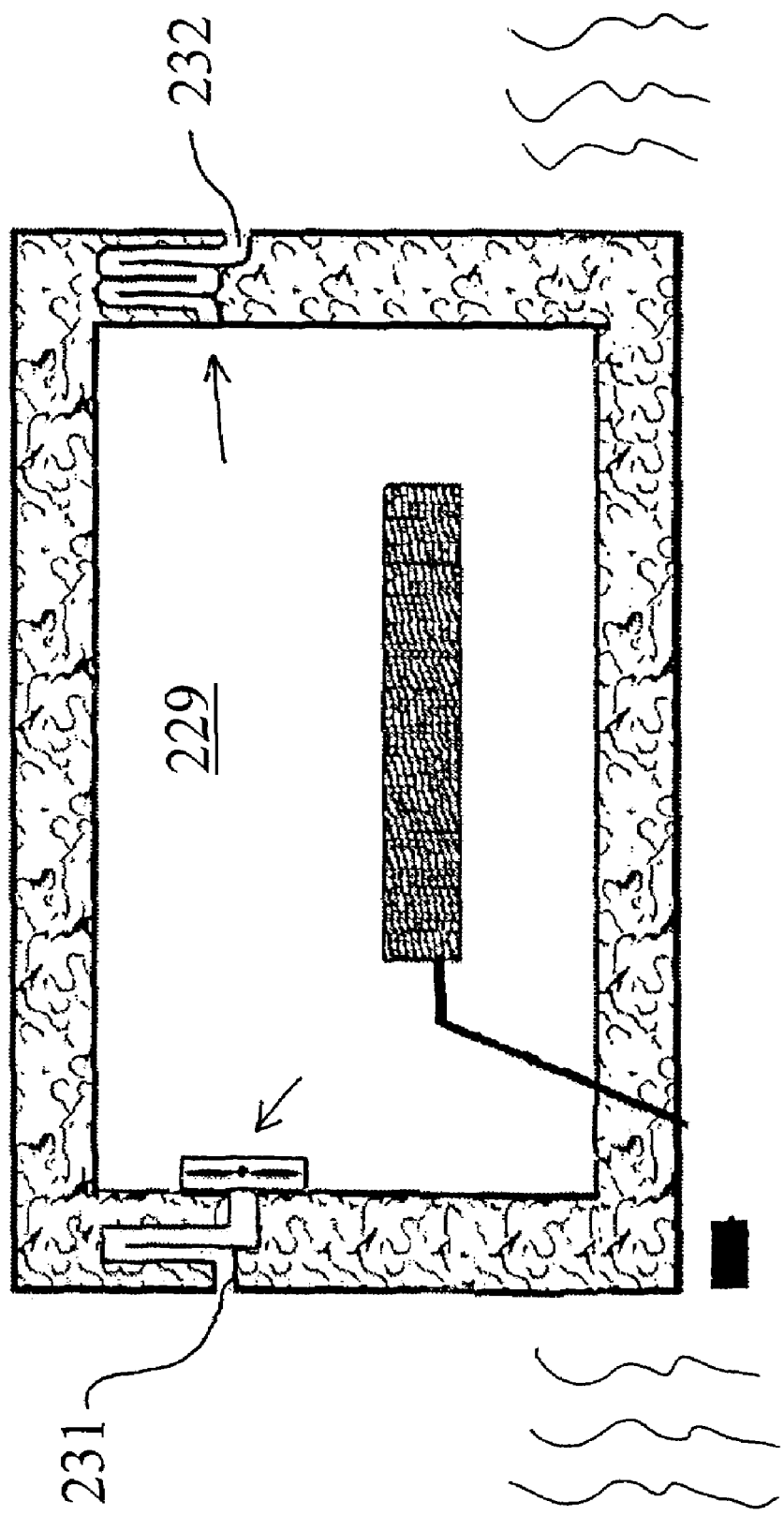

FIGS. 5 and 6 illustrate a third embodiment of the invention wherein the enclosure 220 houses storage device 210 and wherein tortuous pathways are utilized as the inlet 231 and exhaust passageways formed in walls 223 and 224. Fan 240 draws air into the tortuous inlet passageway 231 and blows it across storage device 210 and outwardly through the tortuous exhaust passageway 232. As shown in FIG. 5, the inlet passageway includes a single 180° directional turn at 231a. The exhaust passageway includes a series of three 180° turns 232a, 232b and 232c. The tortuous pathways may have cross sections that are either cylindrical or rectangular. Those passageways are integrally formed in the side walls 223 and 224 when those walls are initially molded of gypsum or other fire resistant material.

FIG. 6 illustrates the onset of fire and illustrates how fan 240 has stopped and the expanding air from the inner chamber 229 flows outwardly through passageways 231 and 232 as the internal temperature slowly increases.

Figure 7:
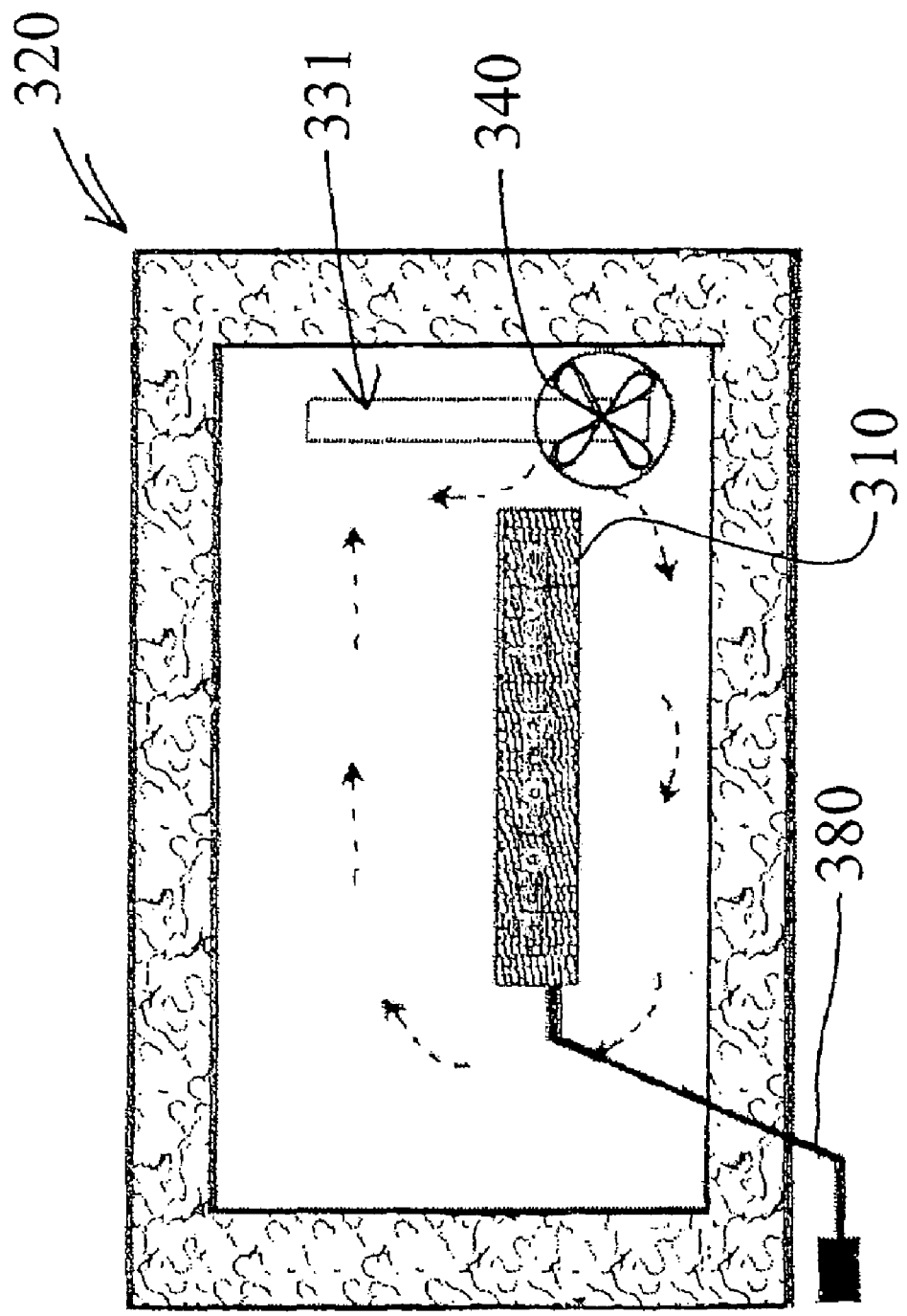
Figure 8:
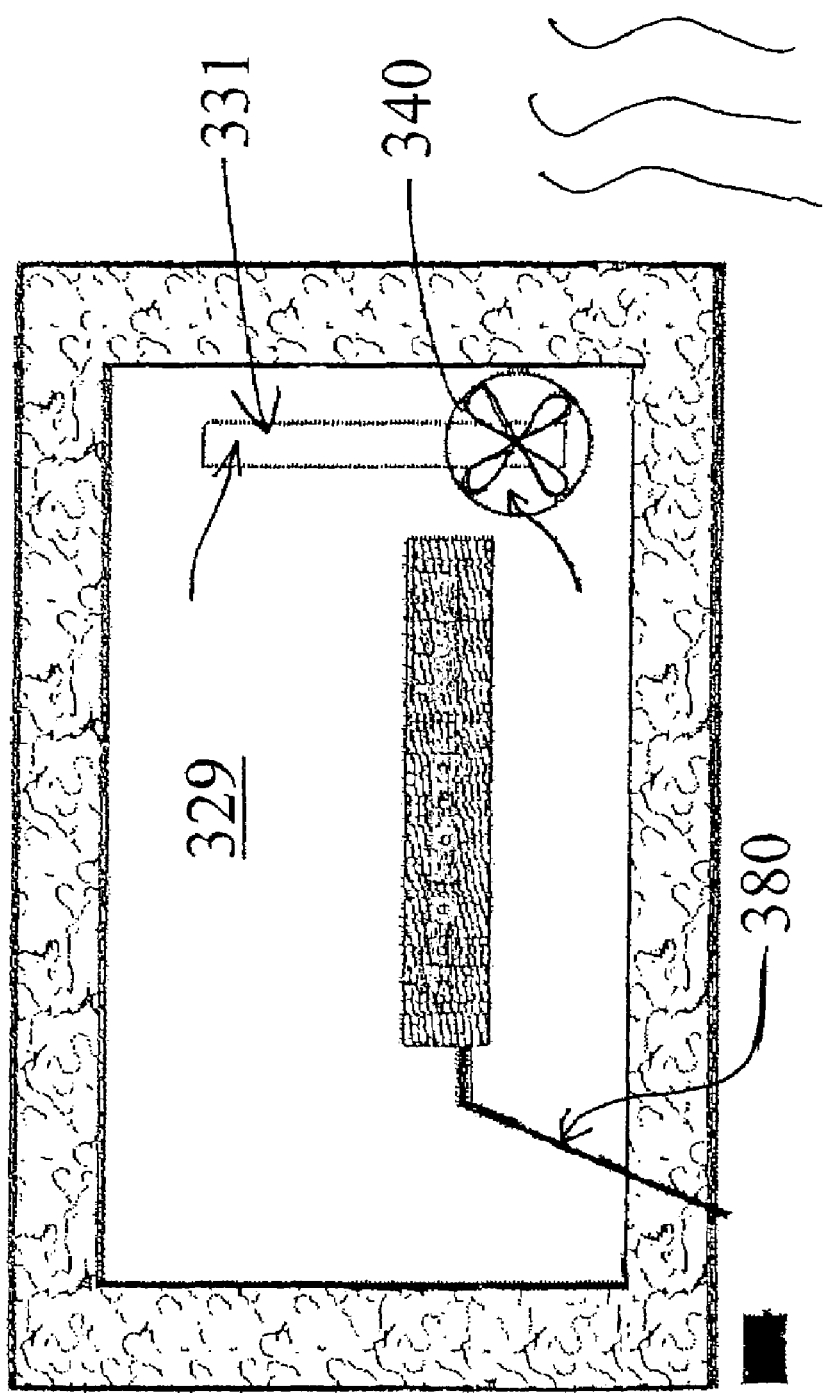

FIGS. 7 and 8 include a fourth embodiment wherein enclosure 320 houses data storage device 310. In this embodiment, a single rectangular slit 331 is formed in the back wall (not shown) of enclosure 320. The slit or vent 331 serves as an inlet and outlet vent. Fan 340 draws ambient air in through the lower part of vent 331 and exhausts the air through the upper part of vent 331, as shown by the airflow arrows in FIG. 7.

FIG. 8 illustrates the device of FIG. 7 subject to fire. The fan 340 stops operating. As air in the inner chamber 329 slowly becomes heated by the fire, the expanding air enters passageway 331, as shown by the arrows in FIG. 8.

B) Hatchless Enclosure with Intumescent or Meltable Material and Fan

FIGS. 9-26 illustrate embodiments of the invention wherein an intumescent or meltable material is utilized to seal the enclosure in the event of fire.

Figure 9:
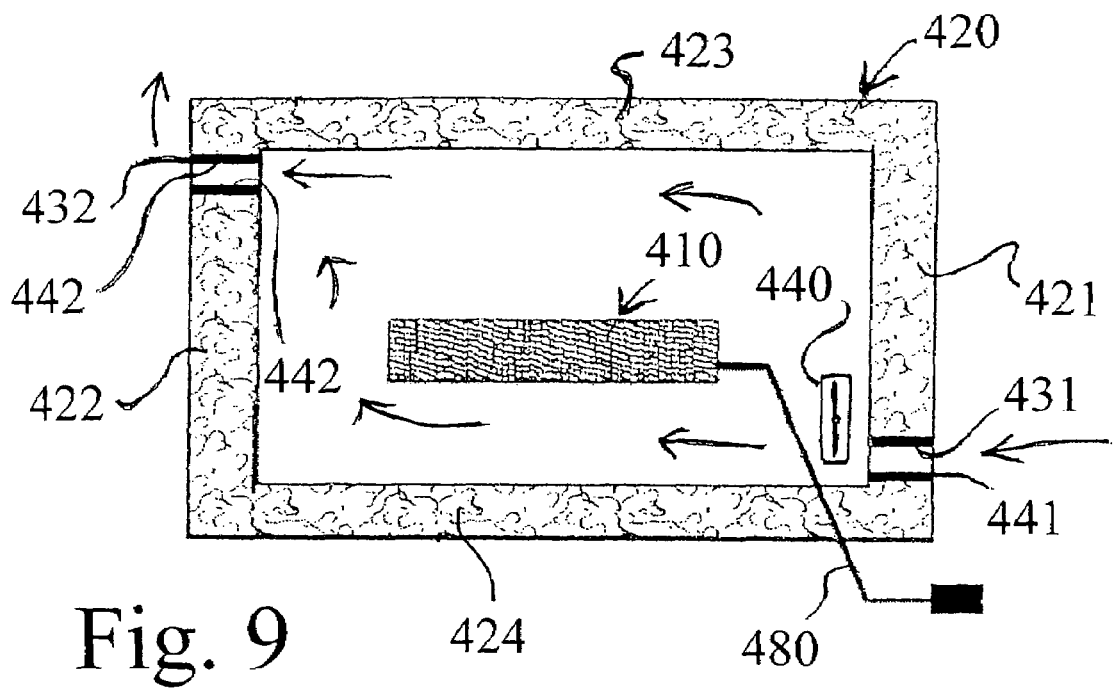

As shown in FIG. 9, an operational data storage device 410 is carried within enclosure 420 and receives its power input and data input through line 480 which is embedded in the lower wall 424 of enclosure 420. Enclosure 420 has side walls 421 and 422, top 423, bottom 424 and end walls not shown. Data storage device 410 is kept cool by fan 440 which draws ambient air in through inlet passageway 431 formed in side wall 421 of enclosure 420, across data storage device 410 and outwardly through exhaust passageway 432 formed in side wall 422 of enclosure 420. In accordance with the invention, passageways 431 and 432 are lined with intumescent linings 441 and 442, respectively. Intumescent linings 441 and 442 completely cover the surface of passageways 431 and 432.

Figure 10:
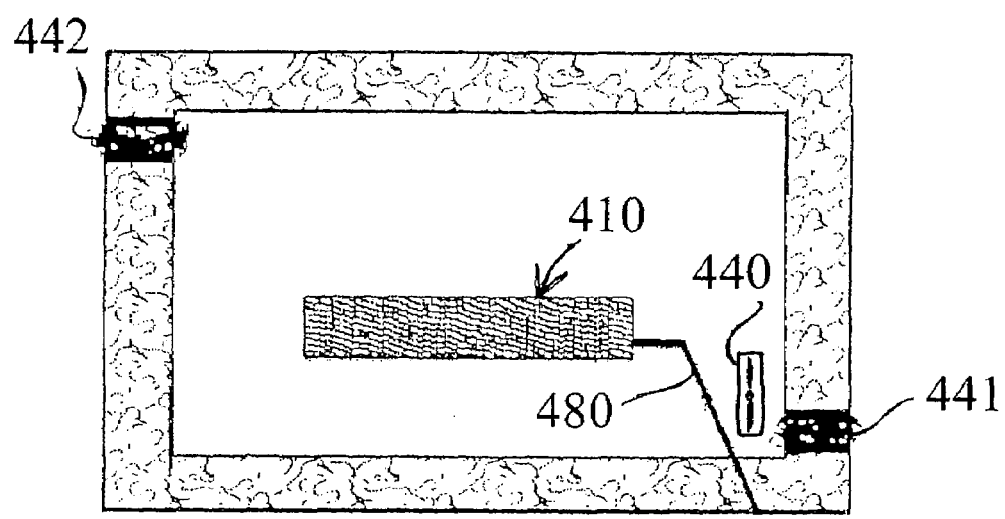

In the event of fire, as shown in FIG. 10, the data and power line 480 either melts or becomes disabled. Data storage device 410 shuts down and fan 440 ceases operation. The intumescent linings 441 and 442 expand and totally seal off inlet and outlet passageways 431 and 432. Passageways 431 and 432 may have cross sections that are rectangular, circular, or other shapes. Passageways 431 and 432 may also include mesh or perforated openings with intumescent coatings. The cross sectional shape of passageways 431 and 432 is critical only in the sense that enough cooling air may be passed through them by fan (or other blower means) 440 and that the intumescent lining completely occludes the passageways in the event of fire.

The fire resistant enclosure 420 shown in FIGS. 9 and 10 is preferably made of gypsum or other fireproof material. The enclosure 420 may include an access panel or door (not shown) which facilitates the installation and removal of data storage device 410 and fan 440.

Figure 11:
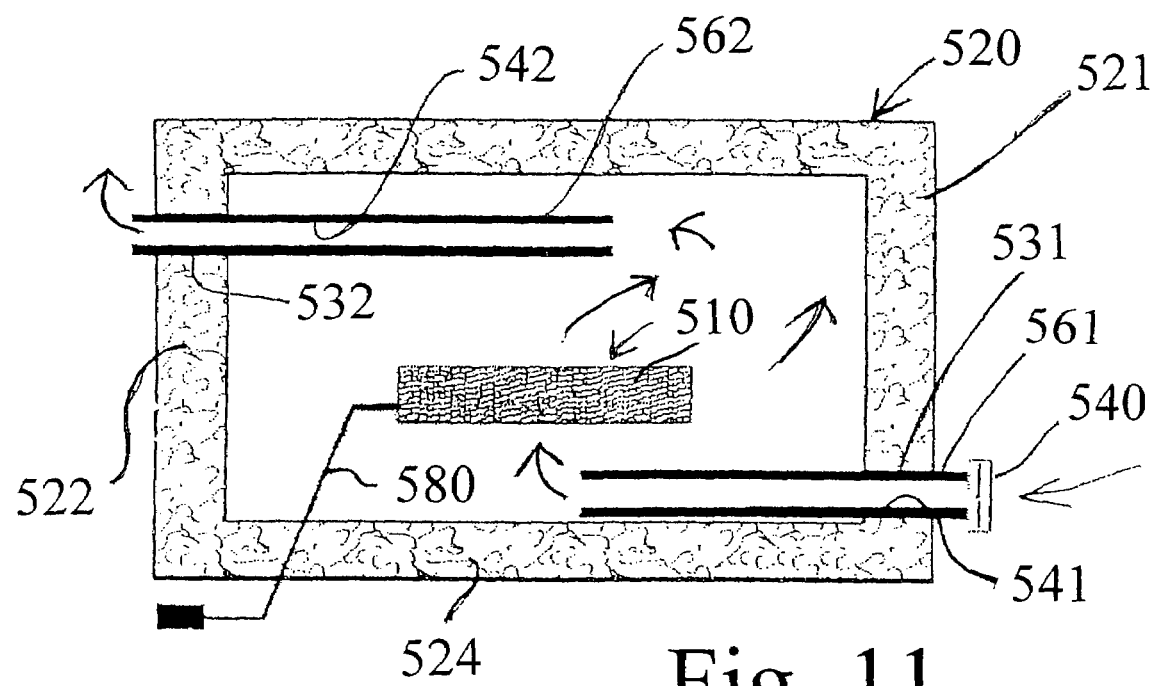
Figure 12:
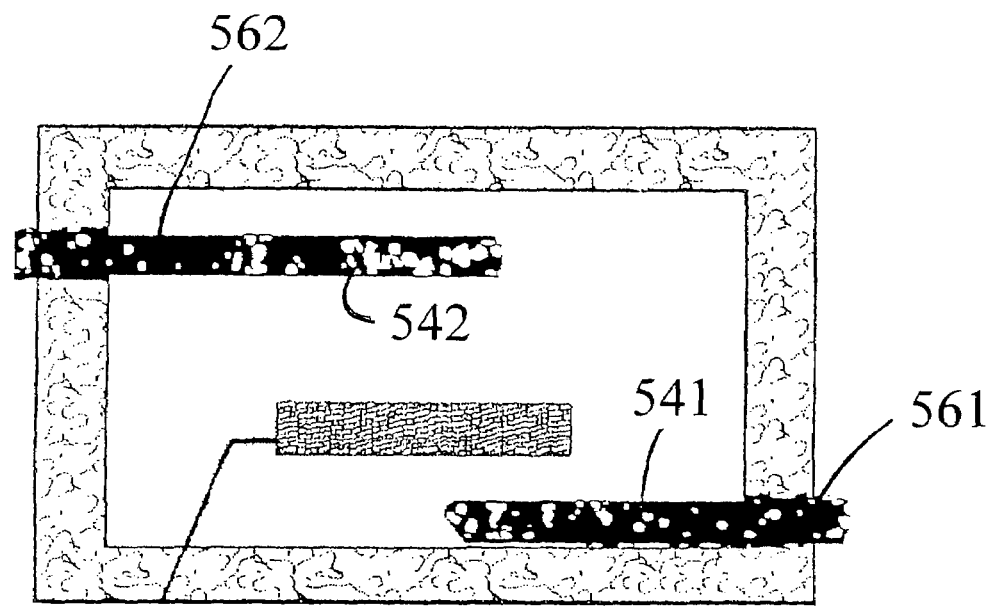

FIGS. 11 and 12 illustrate an embodiment wherein enclosure 520 (preferably made of gypsum or other fireproof material) houses a data storage device 510 having a power and data input line 580 embedded in lower wall 524. A fan 540 is carried at the exterior end of an insulating tube 561 which extends through inlet passageway 531 formed in side wall 521 of enclosure 520. The insulating tube may be a steel, aluminum or ceramic tube capable of withstanding the temperatures in issue. The insulating tube 561 must be capable of carrying an intumescent lining 541 which completely covers the inner surface of insulating tube 561. A longer length of the length of the tube 561 provides greater assurance that the intumescent material 541 will completely seal off the interior space of tube 561. Shorter tubes may be used for applications that do not require excessive fireproof capabilities. Similarly, a second insulating tube 562 is carried by outlet passageway 532 which extends through wall 522 of enclosure 520. As shown in FIG. 12, in the event of fire, the intumescent lining 541 in tube 561 and the intumescent lining 542 in tube 562 expands and completely seals inlet tube 561 and exhaust tube 562 and prevents the temperatures of the fire from entering from the exterior of enclosure 520 and through passageways 531 and 532 into the interior space of enclosure 520.

Figure 13:
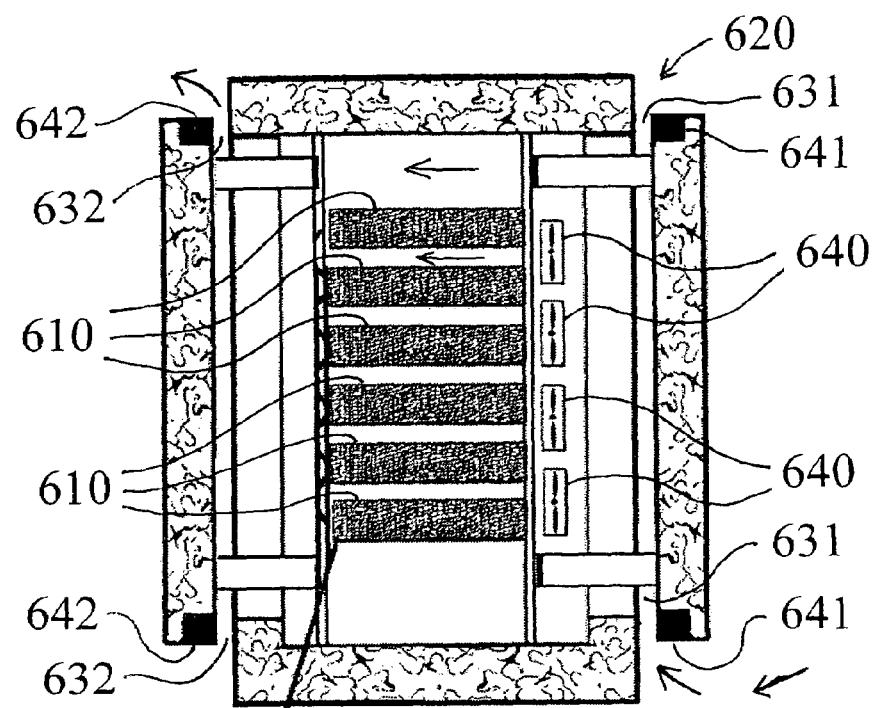
Figure 14:
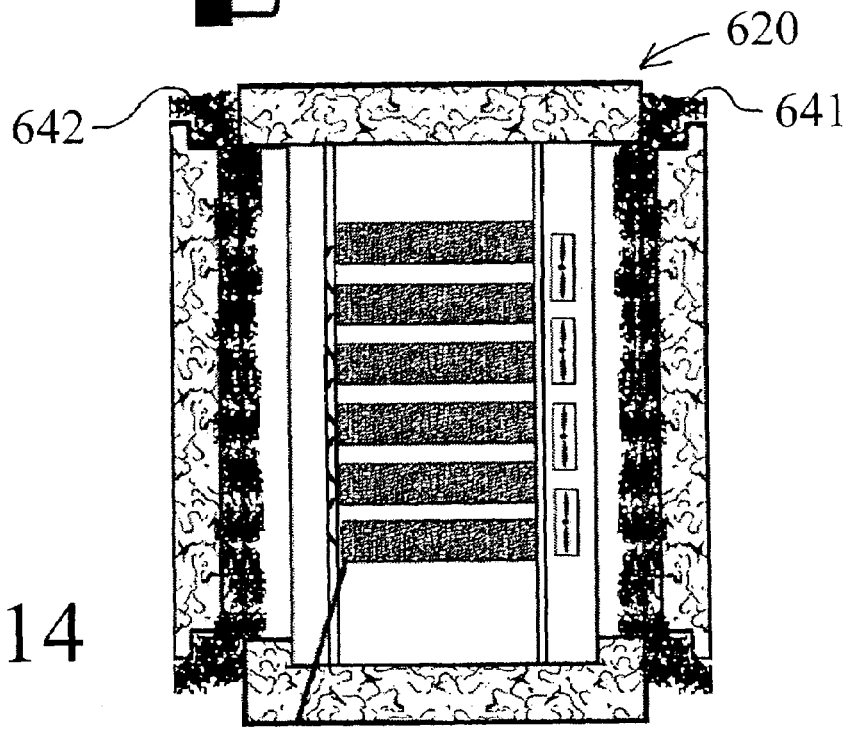

FIGS. 13 and 14 illustrate a further embodiment of the invention wherein enclosure 620 houses a plurality of six data storage devices 610. A plurality of fans 640 draws air through inlet passageway 631 and across data storage devices 640 and outwardly through exhaust passageway 632. Around the periphery of inlet passageway 631 a bead of intumescent material 641 is carried. Similarly, around the periphery of outlet passageway 632 a second bead of intumescent material 642 is carried. As shown in FIG. 14, in the event of fire, the intumescent material 641 and 642 expands, blocking inlet and outlet passageways 631 and 632, thereby blocking the entrance of high temperature air from the fire into the chamber in which the data storage devices 610 are mounted inside enclosure 620.

Figure 15:
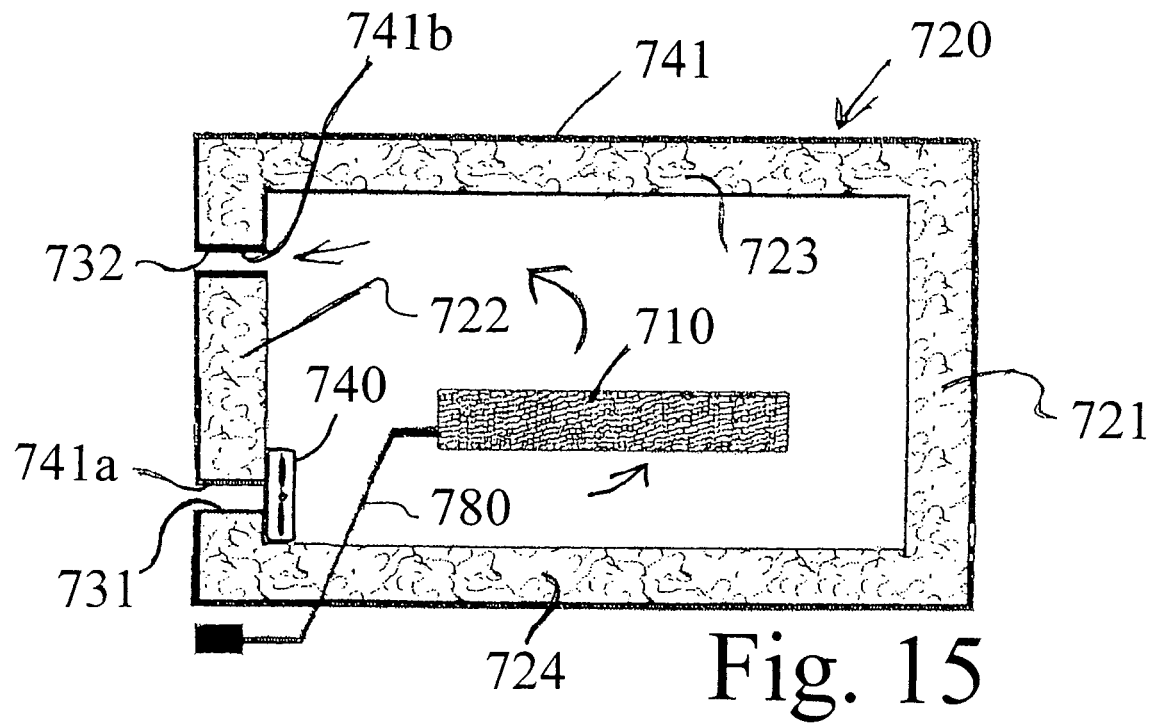
Figure 16:
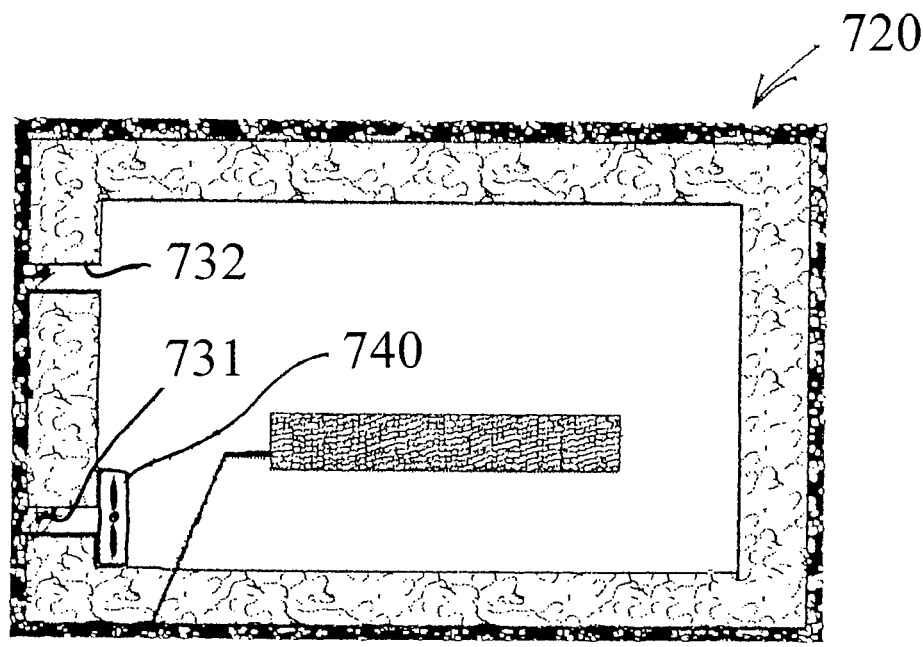

FIGS. 15 and 16 show an embodiment wherein the molded fire resistant enclosure 720 includes a molded bottom 724, molded side walls 721 and 722, and a molded top wall 723 (and molded end walls, not shown), all of which are lined with a continuous lining of intumescent material 741. Data storage device 740 receives data and power through line 780. Fan 740 draws air in through inlet passageway 731, across hard drive 710 and outwardly through exhaust passageway 732.

In the event of fire, as shown by FIG. 16, the intumescent lining 741a which lines the entire surface of inlet passageway 731 and the lining 741b which lines the entire surface of outlet passageway 732, together with lining 741 which covers the exterior surface of enclosure 720 expands, sealing passageways 731 and 732 and adding an intumescent layer around the entire exterior of enclosure 720 which increases the resistance of the device to fire.

Figure 17:
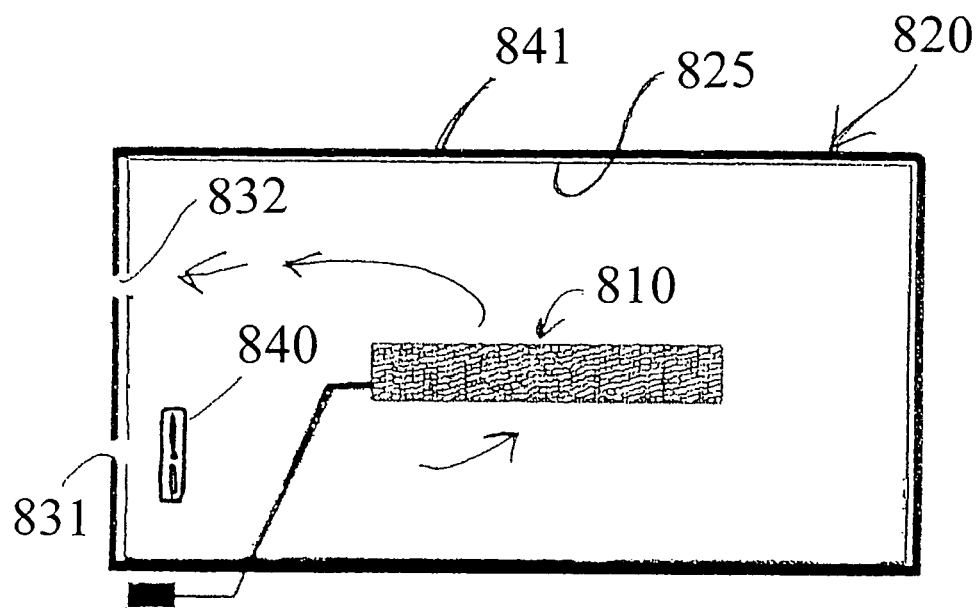
Figure 18:
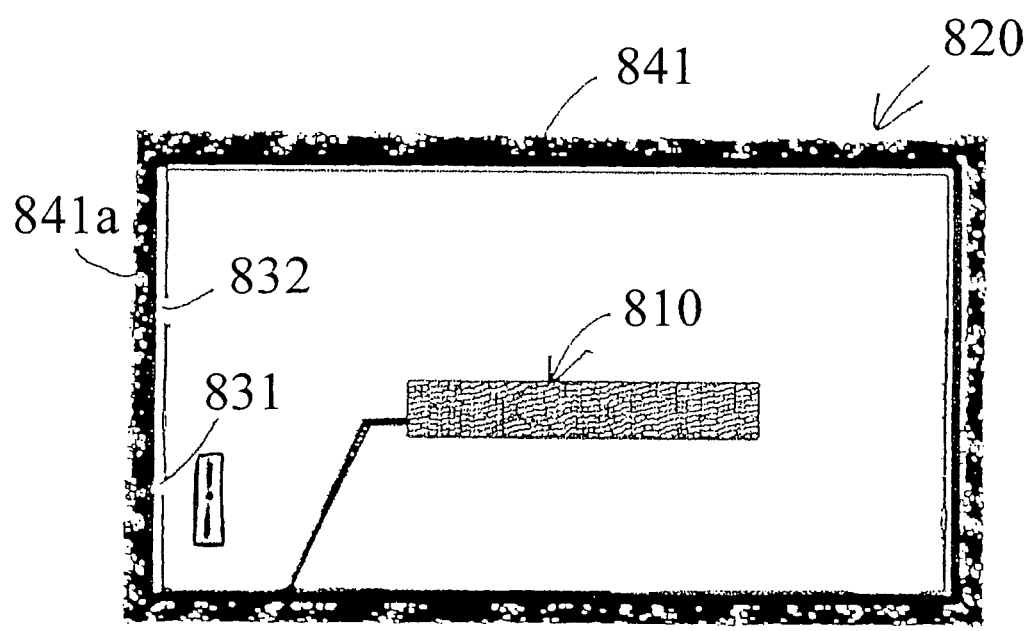

FIGS. 17 and 18 illustrate an embodiment of the invention wherein enclosure 820 comprises an inner "skin" 825 made of steel or other relatively high strength metal, ceramic, or other material capable of withstanding high temperatures and which is coated with a continuous lining of intumescent material 841. Fan 840 draws air in through inlet passageway 831 across data storage device 810 and outwardly through exhaust passageway 832. In the event of fire, the intumescent layer 841 expands and extends across passageways 831 and 832, forming a continuous layer 841a which seals off the inlets and outlets 831 and 832, thereby preventing the flow of high temperature air from the fire into the inner chamber of enclosure 820.

Figure 19:
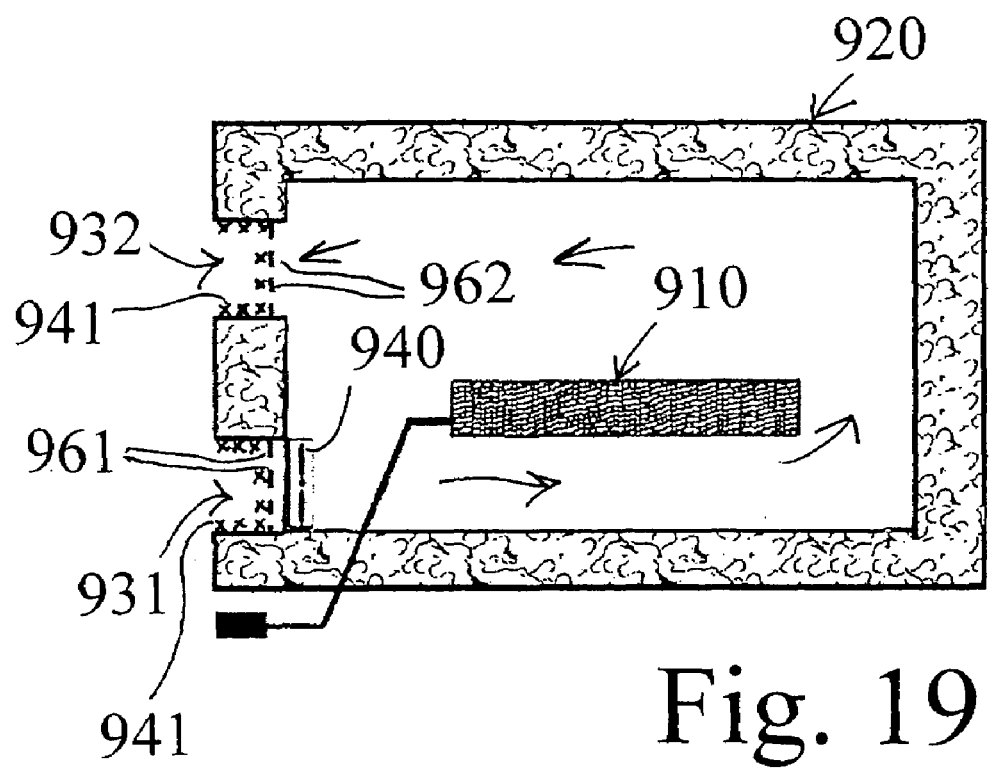
Figure 20:
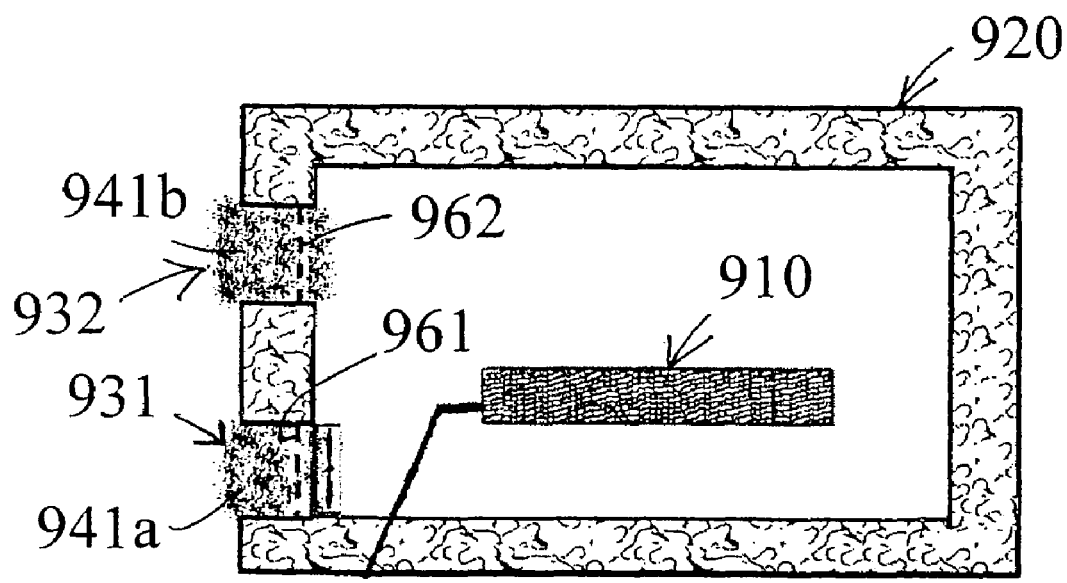

FIGS. 19 and 20 illustrate an embodiment of the invention wherein enclosure 920 is fabricated preferably from molded gypsum or other molded fire resistant material. An inlet passageway shown generally as 931 allows air to be drawn into enclosure 920 by fan 940 to cool the data storage device 910. The cooling air circulates around data storage device 910 and exits through outlet passageway shown generally as 932. This embodiment includes perforated metallic plates 961 and 962 which are fitted into passageways 931 and 932, respectively. Plates 961 and 962 are perforated to allow air to circulate and both plates 961 and 962 are lined with intumescent material 941 shown by small "x's". In the event of fire, the intumescent layer 941 expands and seals off the passageways in perforated plates 961 and 962. The expanded intumescent material is shown as 941a which blocks inlet passageway 931 and expanded intumescent material 941b which blocks outlet passageway 932.

Figure 21:
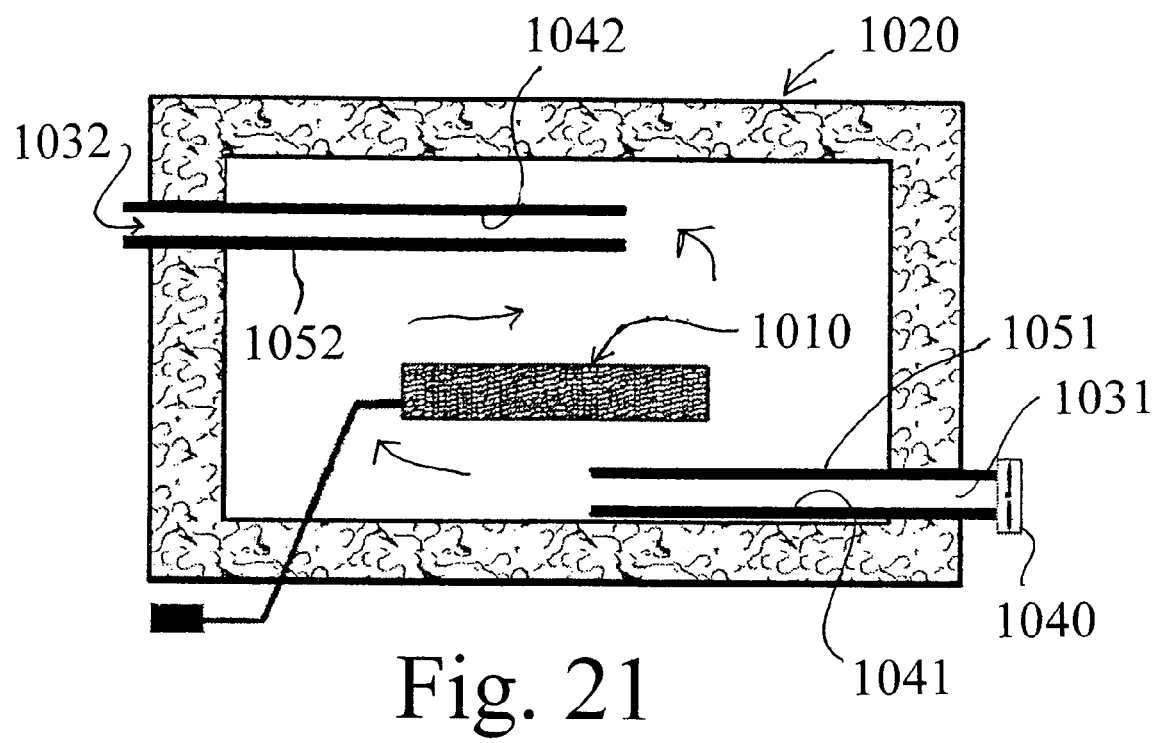
Figure 22:
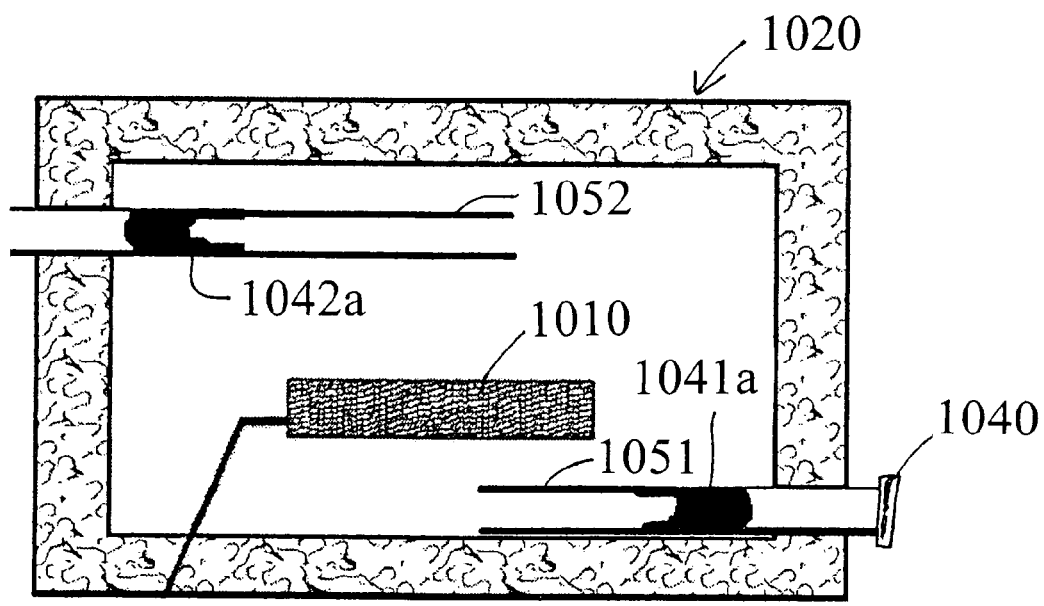

FIGS. 21 and 22 illustrate an embodiment wherein enclosure 1020 houses data storage device 1010 and wherein the inlet passageway 1031 carries an elongated fire resistant tube 1051. Tube 1051 is preferably metallic and is lined with a meltable material 1041 that melts and/or coagulates in the presence of fire and forms a blob of material that obstructs elongated tube 1051. Similarly, the outlet or exhaust passageway 1032 carries an elongated tube 1052 which is lined with a meltable material 1042. In ordinary operation, the fan 1040 draws ambient air through inlet passageway 1031 across data storage device 1010 and outwardly through exhaust passageway 1032. As shown in FIG. 22, in the presence of fire, the meltable material 1041 and 1042 melts and form blobs 1041a and 11042a which obstruct tubes 1051 and 1052, respectively.

Figure 23:
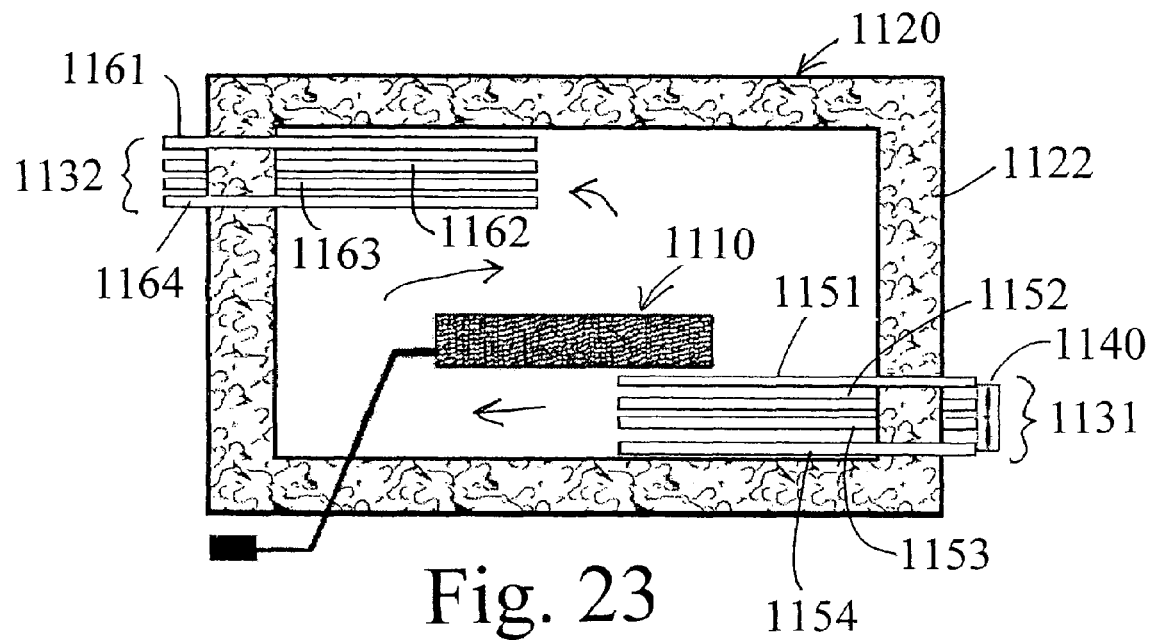
Figure 24:
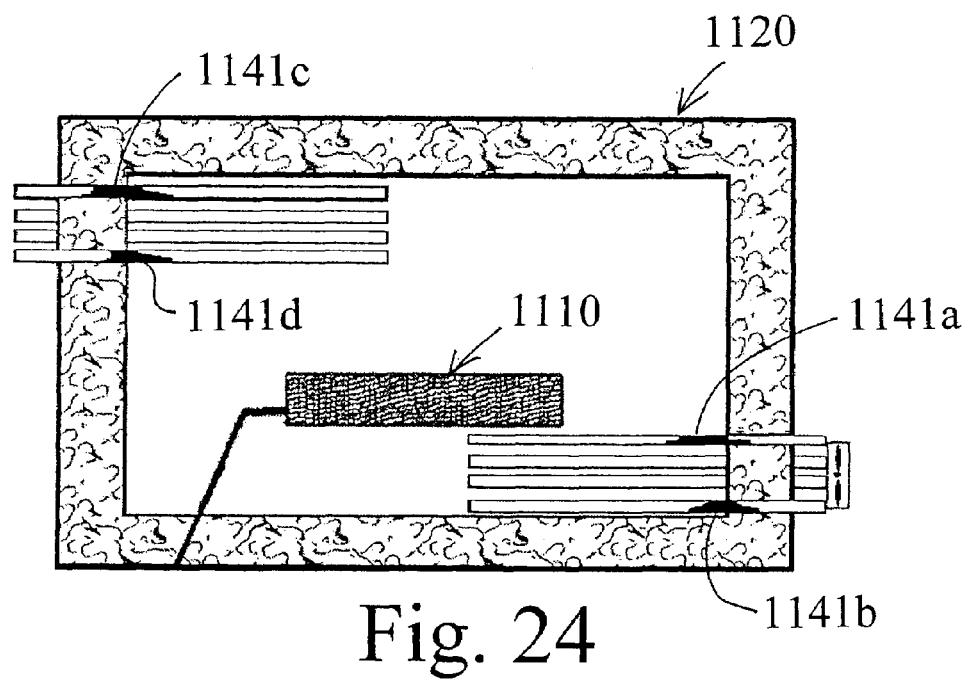

FIGS. 23 and 24 illustrate a further embodiment wherein enclosure 1120 houses data storage device 1110. In this embodiment, a plurality of fire resistant tubes 1151-1154 extend through side wall 1122 and collectively form an inlet passageway 1131. A fan 1140 is carried by the outermost edges of tubes 1151-1154 and forces ambient air into enclosure 1120 across data storage device 1110 and through exhaust passageway 1132. Exhaust passageway 1132 is formed by an array of four elongated fire resistant tubes 1161-1164. Each of the tubes 1151-1154 and 1161-1162 is lined with a meltable material. As shown in FIG. 24, in the event of fire, the meltable material coagulates and forms blobs illustrated as 1141a-1141d which are visible in FIG. 24. As shown in FIGS. 23 and 24, elongated tubes 1152, 1153 and 1162 and 1163 are not shown in sectional view and the blobs that coagulate in them are not visible in FIG. 24.

Figure 25:
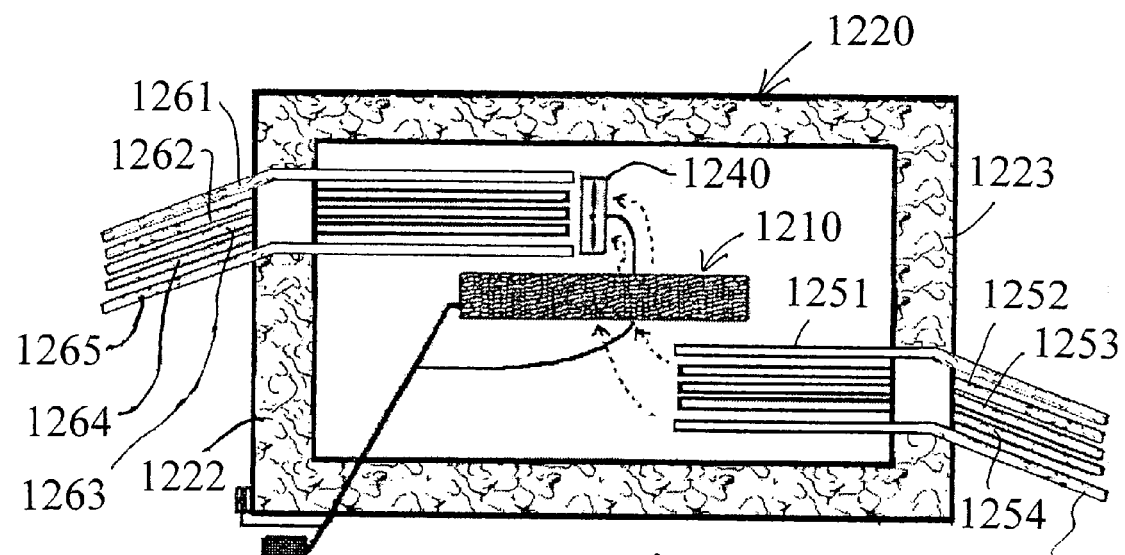
Figure 26:
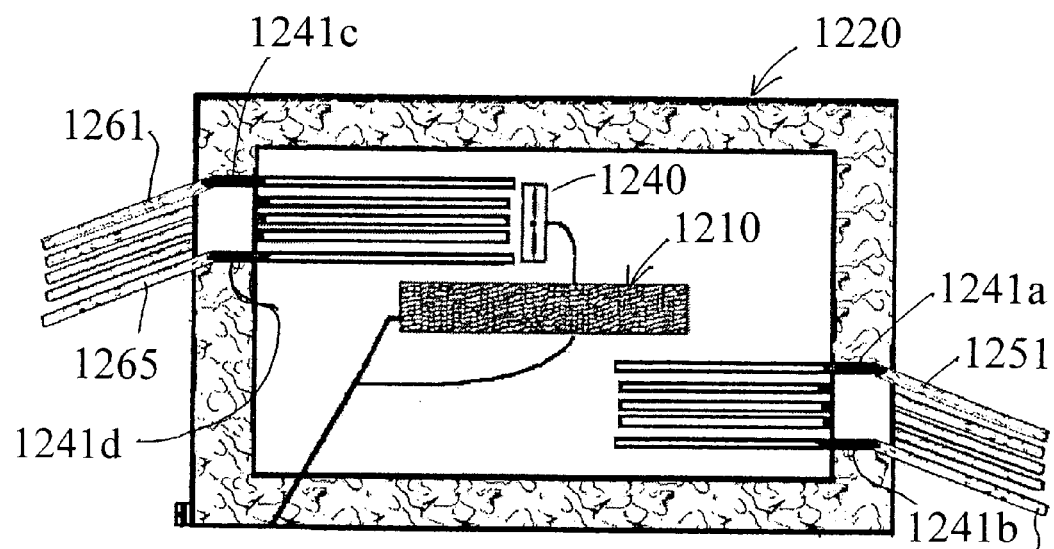

FIGS. 25 and 26 illustrate an enclosure 1220 housing data storage device 1210. This embodiment is a variation from that shown in FIGS. 23 and 24 in two respects. First, the fan 1240 is positioned inside enclosure 1220. Secondly, the array of fire resistant tubes 1251-1255 is angled downwardly away from the exterior side wall 1223 of enclosure 1220.

Similarly, the array of fire resistant tubes 1261-1265 which extend through side wall 1222 are bent at the exterior edge of side wall 1222 and are inclined downwardly and away from wall 1222. The downward inclination of tubes 1251-1255 and 1261-1265 is intended to increase the resistance of the embodiment to the influx of heat from fire through the inclined tubes. Each of the tubes 1251-1255 and 1261-1265 is lined with a meltable material that coagulates to form one or more blobs of material that totally obstruct the tube in the presence of a fire. Such blobs are illustrated as 1241a and 1241b which have obstructed tubes 1251 and 1255. Similarly, blobs 1241c and 1241d have obstructed exhaust tubes 1261 and 1265. In similar fashion, the remaining tubes, which are not visible in the sectional view of FIGS. 25 and 26, are blocked and totally occluded in the presence of fire.

C) Hatchless Enclosure Without Fan and Without Ventilation Passageways

FIGS. 27-32 illustrate embodiments of the invention wherein a hatchless enclosure is utilized without a fan and without ventilation passageways.

Figure 27:
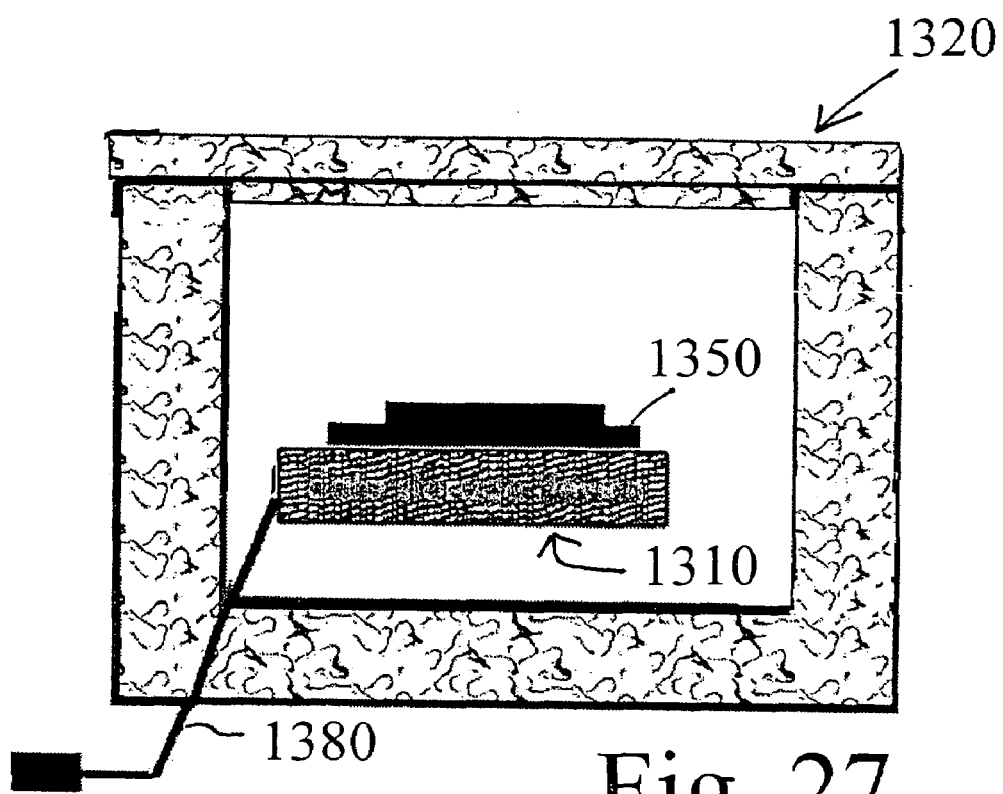
FIGS. 27-32 illustrate embodiments of the invention wherein the enclosure is hatchless and wherein no fan is utilized.
Figure 28:
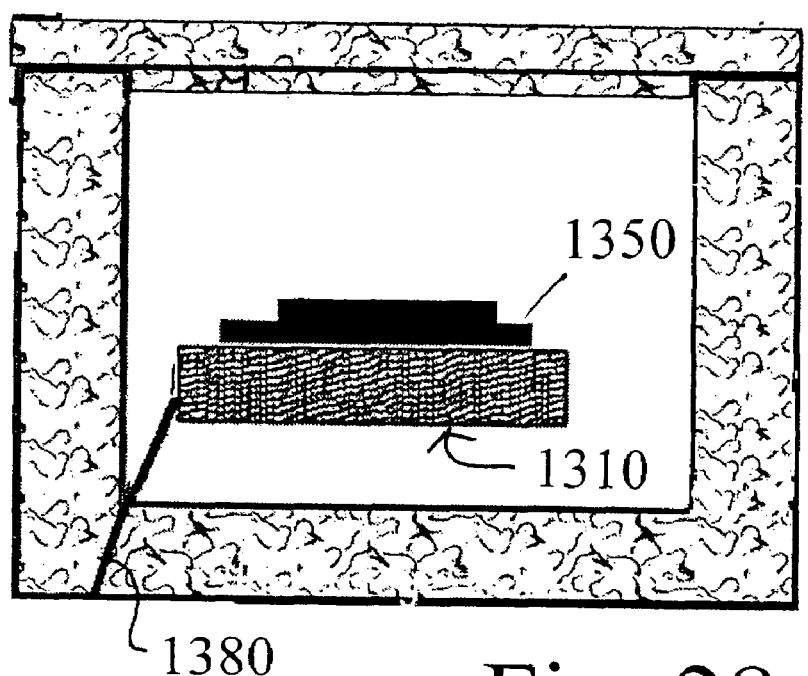

FIGS. 27-28 illustrate a data storage device 1310 within hatchless enclosure 1320. A Peltier device 1350 is mounted on top of and in thermal contact with data storage device 1310. Peltier device 1350 extends through a side wall of enclosure 1320 (not illustrated in FIG. 27). As is known in the art, the Peltier device in operation is a thermoelectric heat pump that conducts heat in one direction only, i.e. from the inside of enclosure 1320 to the external ambient atmosphere. An external temperature sensor (not shown) senses a threshold outside temperature and shuts down operation of the Peltier device 1350 in the presence of fire. Power to the data storage device is also shut down in the presence of fire by melting of the data power line 1380 or alternately power may be shut off by the external temperature sensor. FIG. 28 illustrates the loss of data and power through line 1380 in the presence of fire. Similarly, when the Peltier device is shut down by external temperature sensor, it will not transfer heat in either direction and data storage device 1350 is protected from heat damage by the fire resistant nature of enclosure 1320. The embodiment shown in FIGS. 27 and 28 has no moving parts and no ventilation passageways and is therefore water resistant. The data and power line 1380 is rendered water resistant by being coated with silicone or other water resistant material.

Figure 29:
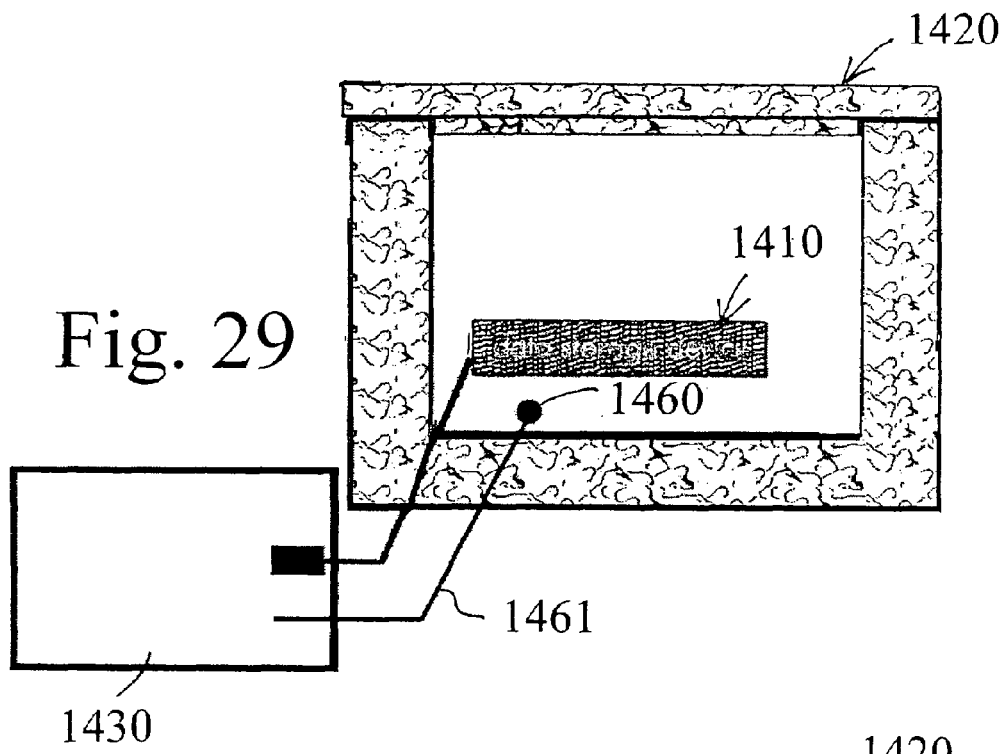
Figure 30:
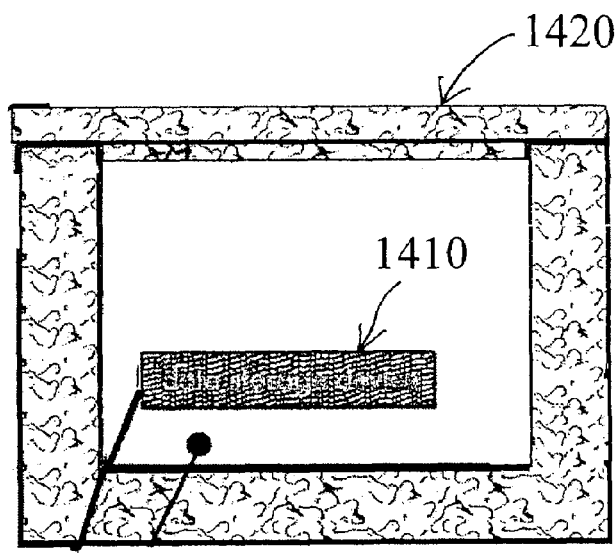

FIGS. 29 and 30 illustrate an embodiment wherein hatchless and ventless enclosure 1420 encloses data storage device 1410. In this embodiment, an external printed circuit board 1430 controls power to data storage device 1410. A temperature sensor 1460 is carried within enclosure 1420. Temperature sensor 1460 is electronically connected to printed circuit board 1430 through line 1461. When a threshold temperature is sensed by sensor 1460, the printed circuit board 1430 shuts off power to data storage device 1410. Furthermore, during ordinary operation in the absence of fire, PC board temporarily shuts off power to data storage device 1410 whenever it is not in use. By minimizing the supply of power to data storage device 1410 to those periods when it is in use, the heat generated by data storage device 1410 within enclosure 1420 is dramatically reduced. The embodiment in FIGS. 29 and 30 utilizes no moving parts. Enclosure 1420 is waterproof in that it has no hatches and no passageways formed through its side walls for ventilation purposes. Enclosure 1420 is therefore essentially water resistant. The power lines between the printed circuit board 1430 and the interior of enclosure 1420 are made water resistant by either the use of silicone or other water resistant materials.

Figure 31:
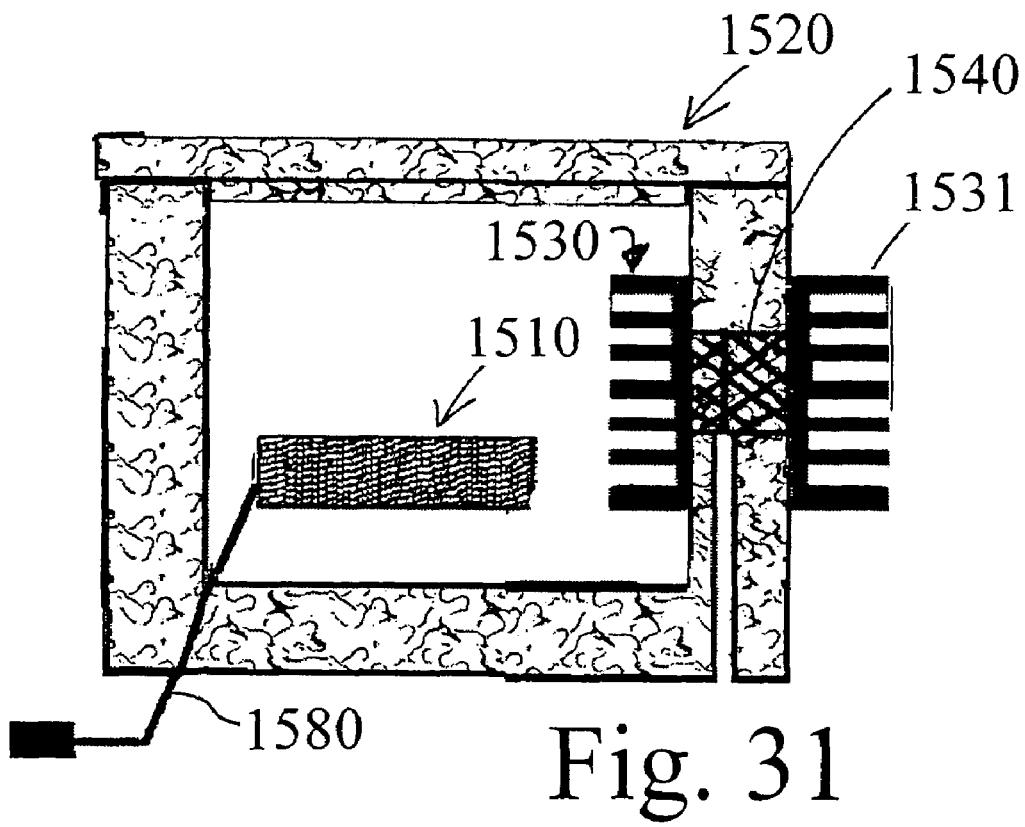
Figure 32:
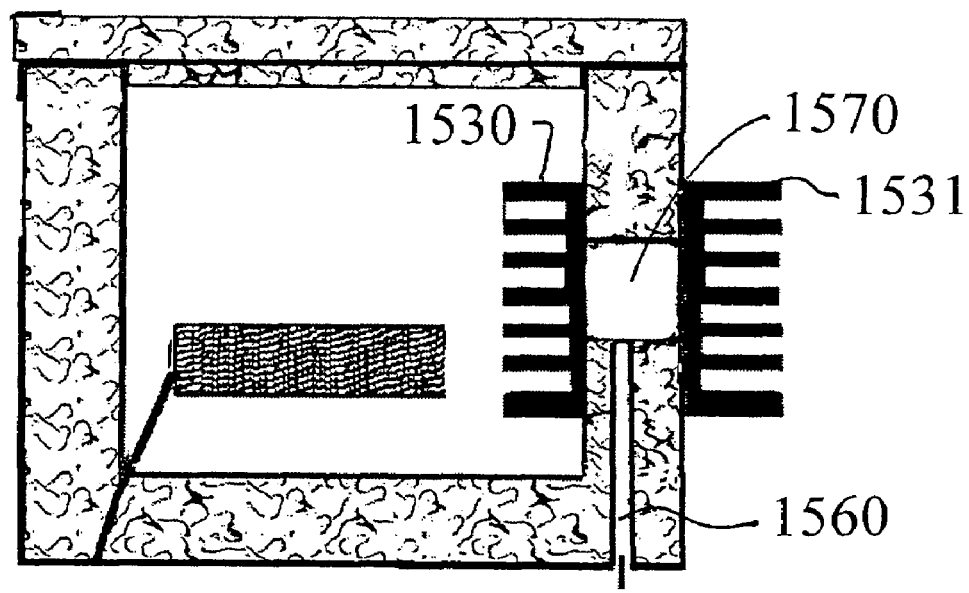

The embodiment shown in FIGS. 31 and 32 includes a hatchless enclosure 1520 which has no ventilation passageways through its walls. The data storage device 1510 receives data and is powered through power line 1580. The small hole through the enclosure 1510 through which power line 1580 extends is filled with silicone or other water resistant material. In this fashion, the enclosure 1520 is resistant to both fire and water. As shown in FIG. 31, excess heat generated by data storage device 1510 is transferred by conduction to inner heat sink 1530 and to external heat sink 1531 through a highly conductive meltable or liquid conductor 1540. Meltable link 1540 is fabricated of a conductive metal with a known and selected melting point preferably between 200° and 300° F. When data storage device 1510 is operating, heat generated by the device is conducted through inner heat sink 1530 through conductive meltable link 1540 through outer heat sink 1531 and into the ambient atmosphere. As shown in FIGS. 32, in the presence of fire, the meltable material 1540 melts and drains outwardly through passageway 1560, leaving a cavity 1570 which contains only air. Cavity 1570 is completely sealed by inner heat sink 1530 and outer heat sink 1531. Heat generated by the exterior fire is restricted from being transferred to the interior of enclosure 1520 by the air chamber 1570 formed after the meltable material 1540 has drained through passageway 1560. Enclosure 1520 is water resistant since the only passageways through the walls of enclosure 1520 are the passageways for power line 1580 which are rendered water resistant by the use of silicone or other water resistant material. The air cavity 1570 is water resistant since it is completely covered on the interior by interior heat sink 1530 and on its exterior surface by exterior heat sink 1531.

D) Water Resistant Enclosure with Pouch Surrounding Digital Data Storage Device

FIGS. 33-40 illustrate embodiments of the invention wherein the enclosure, either with or without movable hatches, includes a water resistant pouch surrounding and enclosing the data storage device. The pouch is located within the interior of the fire resistant enclosure.

Figure 33:
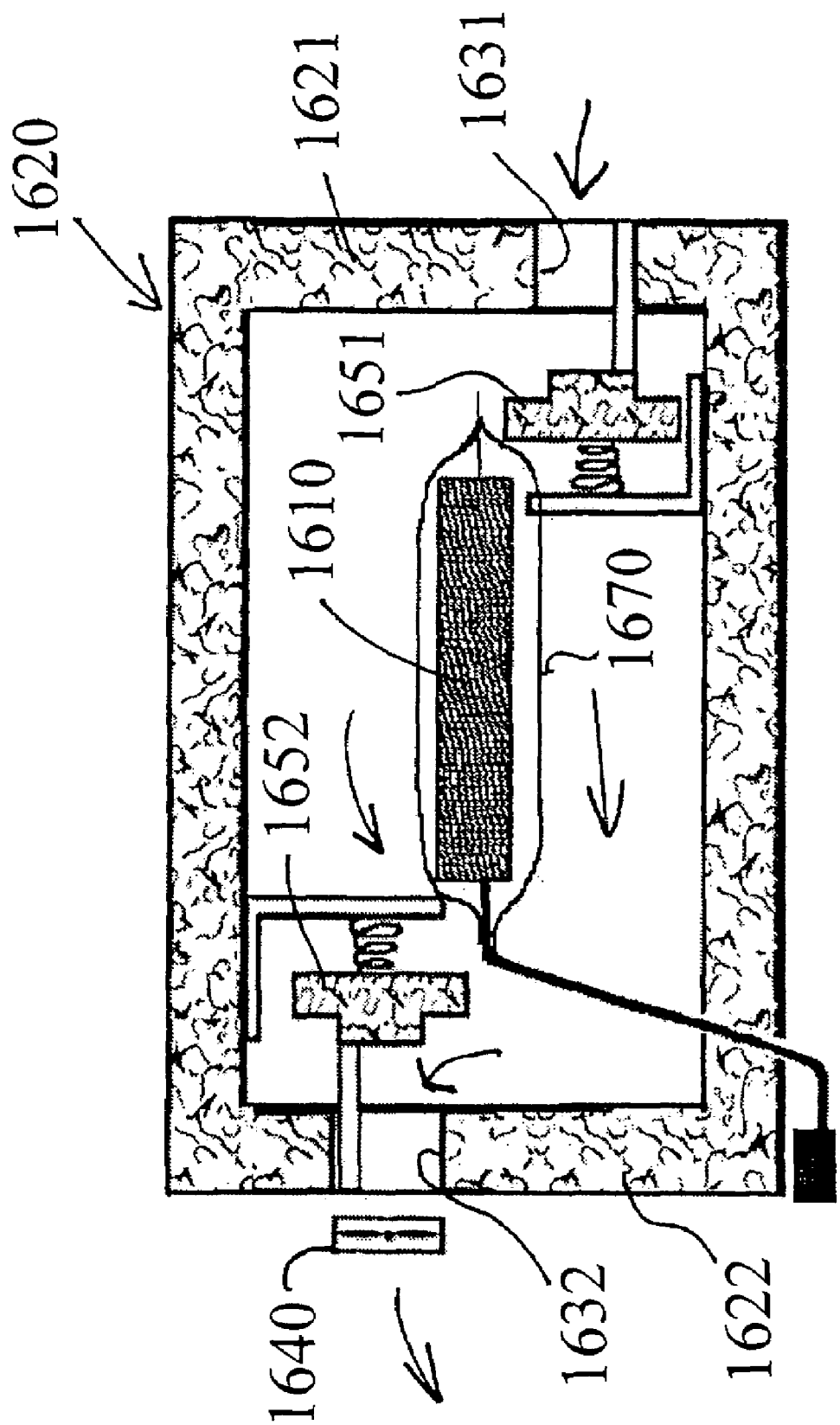
Figure 34:
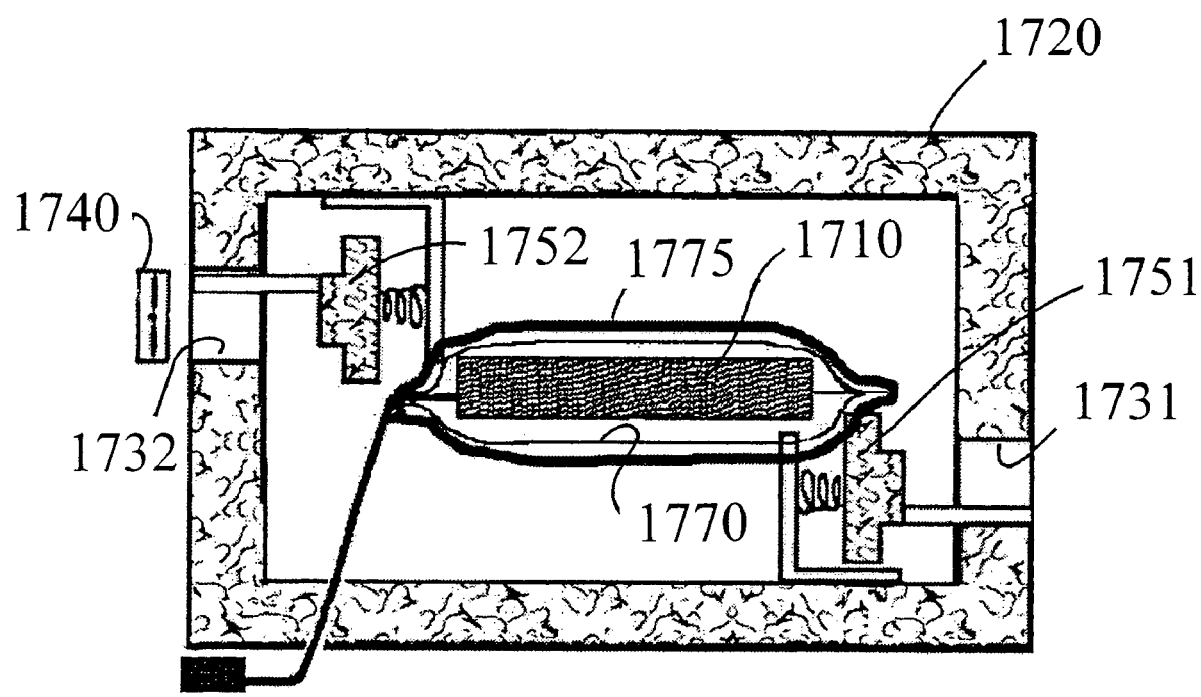

FIGS. 33 and 34 illustrate enclosure 1620 which houses data storage device 1610. Enclosure 1620 includes an inlet passageway 1631 formed in side wall 1621 to allow the flow of ambient air from outside enclosure 1620 to the interior of enclosure 1620. An outlet passageway 1632 is formed in opposite side wall 1622. A fan 1640 is mounted adjacent outlet passageway 1632 and draws air through inlet passageway 1631 across data storage device 1610 and outwardly through outlet passageway 1632 as illustrated by the arrows in FIG. 33. Movable hatches 1651 and 1652 are positioned adjacent inlet passageway 1631 and outlet passageway 1632, respectively. In the presence of fire, the hatches 1651 and 1652 seal off passageways 1631 and 1632. A more complete description of the movable hatches 1651 and 1652 is contained in U.S. application Ser. No. 11/112,552 and is not repeated here in the interest of brevity.

A "pouch" 1670 completely surrounds and encloses data storage device 1610. The pouch 1670 is water resistant and heat conductive, preferably made of aluminum foil or of a non-metallic material embedded with sufficient metal particles to render it heat conductive. The pouch 1670 must be sufficiently heat conductive to allow heat generated by storage device 1610 to be easily conducted through the pouch 1670 and ultimately carried through outlet passageway 1632. As used herein and in the claims, the word "pouch" is used in a broad sense to include: thermally conductive foil, containers formed by extrusion, die casting, injection molding, machining, and sheet metal containers. In the interest of brevity, a separate figure is not included which illustrates hatches 1651 and 1652 in their closed position in the presence of fire.

FIG. 34 illustrates enclosure 1720 which houses data storage device 1710. Inlet passageway 1731 and outlet passageway 1732 allow the flow of cooling air driven by fan 1740, as is the case with the embodiment shown in FIG. 33 above. Similarly, hatches 1751 and 1752 are positioned adjacent passageways 1731 and 1732 and close those passageways in the presence of fire. The significant difference of FIG. 34 compared with FIG. 33 is that the foil pouch 1770 is coated with an elastomeric or waterproof coating 1775. The coating 1775 may be applied by dipping the data storage device 1710 and foil pouch 1770 into a vat of elastomeric or waterproof coating. Alternately, the elastomeric or waterproof coating can be applied to pouch 1770 by spray or other techniques known in the art.

FIGS. 35 and 36 illustrate a significant embodiment of the invention wherein enclosure 1820 houses a plurality of data storage devices 1810a-1810e. Enclosure 1820 includes an inlet passageway 1831 formed in side wall 1821 and an outlet passageway 1832 formed in side wall 1822. Movable hatches 1851 and 1852 are hingedly mounted adjacent passageways 1831 and 1832. A plurality of fans 1840a-1840c are mounted adjacent outlet passageway 1832 and cause air to be drawn through inlet passageway 1831 through the interior of enclosure 1820 and outwardly through exhaust passageway 1832. The plurality of data storage devices 1810a-1810e is contained within a water resistant and thermally conductive "pouch" or enclosure 1870. Pouch 1870 may be formed of flexible metallic foil or alternately may be formed of a more rigid, metallic box which forms a robust and highly water resistant enclosure for data storage devices 1810a-1810e. An optional secondary array of fans 1890a-1890c is mounted within pouch 1870 to circulate air around data storage devices 1810a-1810e within pouch 1870. In the presence of fire, as shown in FIG. 36, solenoids 1891 and 1892, cooperating with temperature sensors 1895 and 1896 mounted on the exterior of enclosure 1820, cause hatches 1851 and 1852 to close, providing fire resistance for data storage devices 1810a-1810e and for the data stored thereon.

Figure 37:
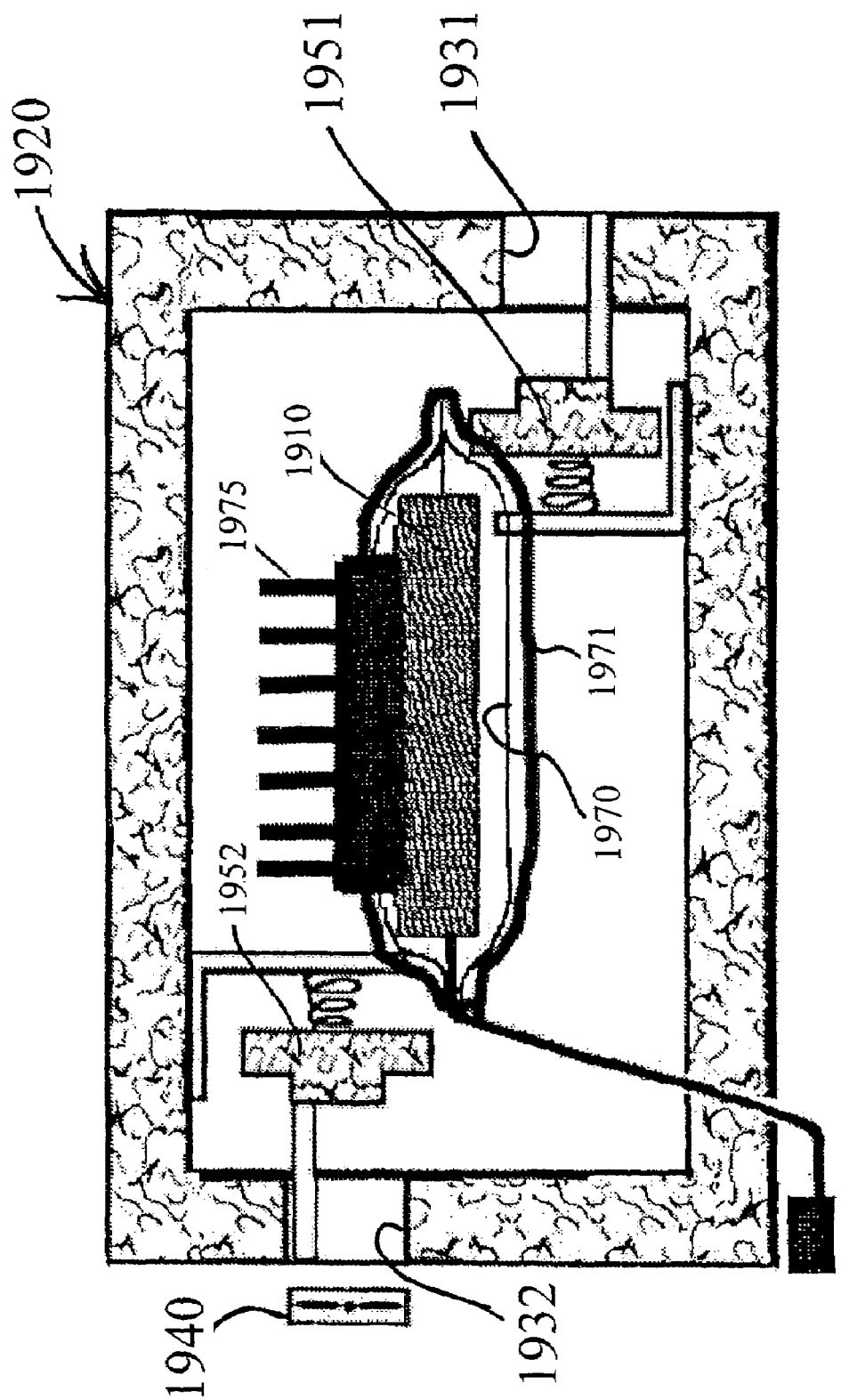

FIG. 37 illustrates an alternate embodiment wherein enclosure 1920 houses data storage device 1910. Inlet passageway 1931 and outlet passageway 1932 cooperate with fan 1940 to circulate ambient air through enclosure 1920. Movable hatches 1951 and 1952 are positioned adjacent passageways 1931 and 1932 and close those passageways in the event of fire as noted above. The embodiment of FIG. 37 is significant in that a finned heat sink 1975 is mounted on and is in thermal contact with data storage device 1910. Furthermore, the finned heat sink 1975 forms a portion of the waterproof enclosure 1970 which surrounds data storage device 1910 within the interior space of fire resistant enclosure 1920. The boundary between finned heat sink 1975 and the pouch 1970 may be sealed with a variety of water resistant adhesives or by ultrasonic welding. The metallic pouch 1970 is preferably coated with an elastomeric coating 1971.

Figure 38:
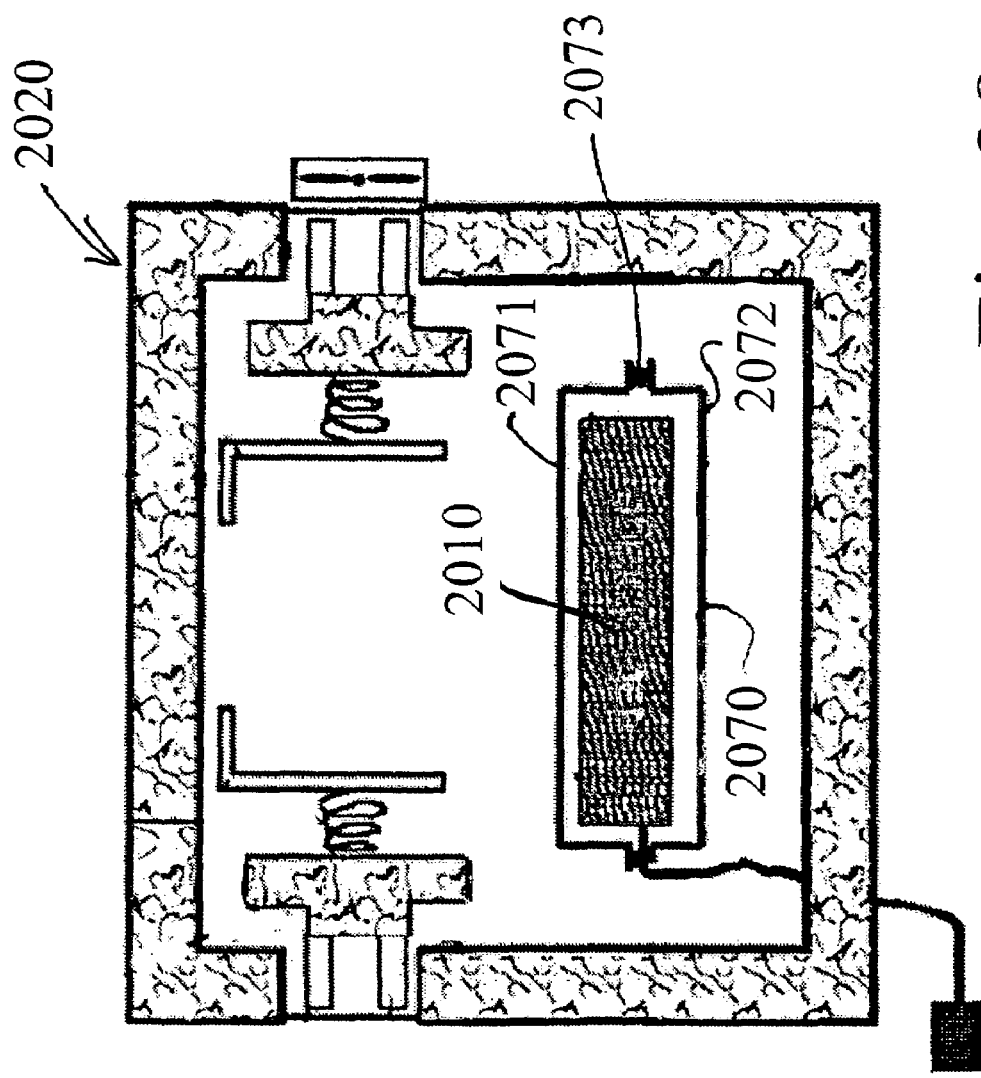

The embodiment illustrated in FIG. 38 includes a fire resistant enclosure 2020 housing a data storage device 2010 wherein the significant difference as compared with embodiments described above is that the water resistant pouch 2070 which enclosures data storage device 2010 is a rigid metal container including an upper portion 2071, a lower portion 2072 and a gasket 2073 which extends around the perimeter of the metal container 2070. The embodiment shown in FIG. 38 includes a robust metallic container surrounding data storage device 2010 which is water resistant and which is able to conduct heat outwardly from data storage device 2010 but which also is able to provide significant water resistance in extreme depths of water, i.e. as much as 1,000 feet in depth.

Figure 39:
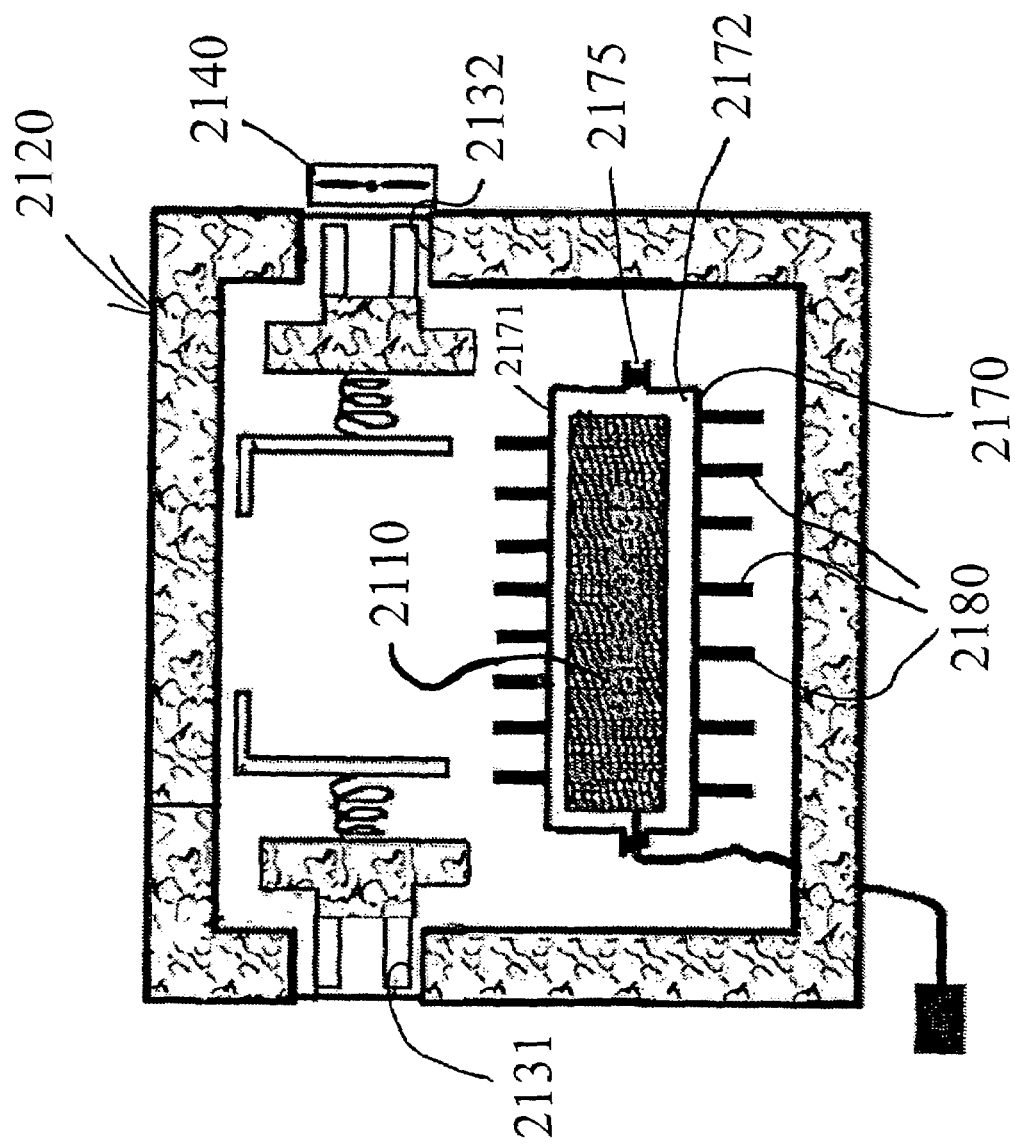

FIG. 39 illustrates yet another enclosure 2120 housing data storage device 2110 which is similar to embodiments described above except that the pouch 2170 that forms a water resistant enclosure for data storage device 2120 is a finned and extruded metal enclosure including an upper portion 2171 and a lower portion 2172. A gasket 2175 extends around the outer perimeter of pouch or container 2170 to provide a robust as well as finned water resistant enclosure for data storage device 2110. The use of fins 2180 increases the efficiency of heat transfer from data storage device to the interior chamber of enclosure 2120 and to the external ambient atmosphere as described above by the cooperation of fan 2140, inlet passageway 2131 and outlet passageway 2132.

Figure 40:
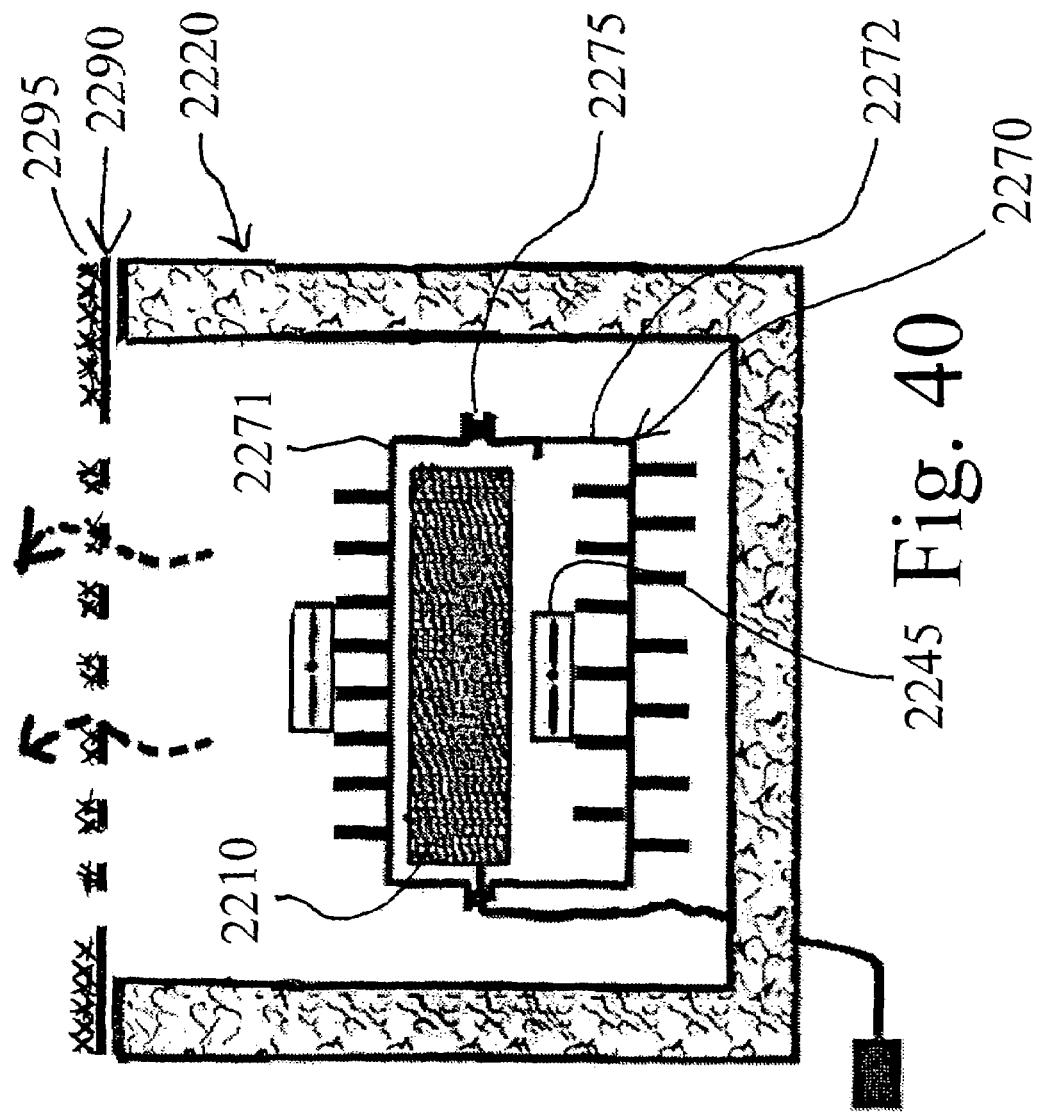

FIG. 40 illustrates enclosure 2220 housing data storage device 2210. In this embodiment, a finned waterproof extruded pouch or enclosure 2270 is provided with upper and lower portions 2271 and 2272, respectively. A gasket 2275 extends around the perimeter of pouch or container 2270, providing a robust and effective water resistant enclosure for data storage device 2210, all within the interior space of fire resistant enclosure 2220. A perforated plate 2290 forms the upper surface of enclosure 2220 and includes a series of perforations 2291. The perforated plate 2290 coated with an intumescent coating 2295 is applied to the surface of perforated plate 2290 and upon exposure to fire expands and seals off the perforations 2291, thereby forming a highly fire resistant enclosure. A fan 2240 is mounted adjacent the upper surface of finned pouch 2270, and forces air outwardly through perforated plate 2290 to increase the heat transfer from data storage device 2210 to the ambient atmosphere. An optional internal fan 2245 is provided within a waterproof pouch or container 2270 to increase the heat transfer from data storage device 2210 through pouch 2270.

Figure 41:
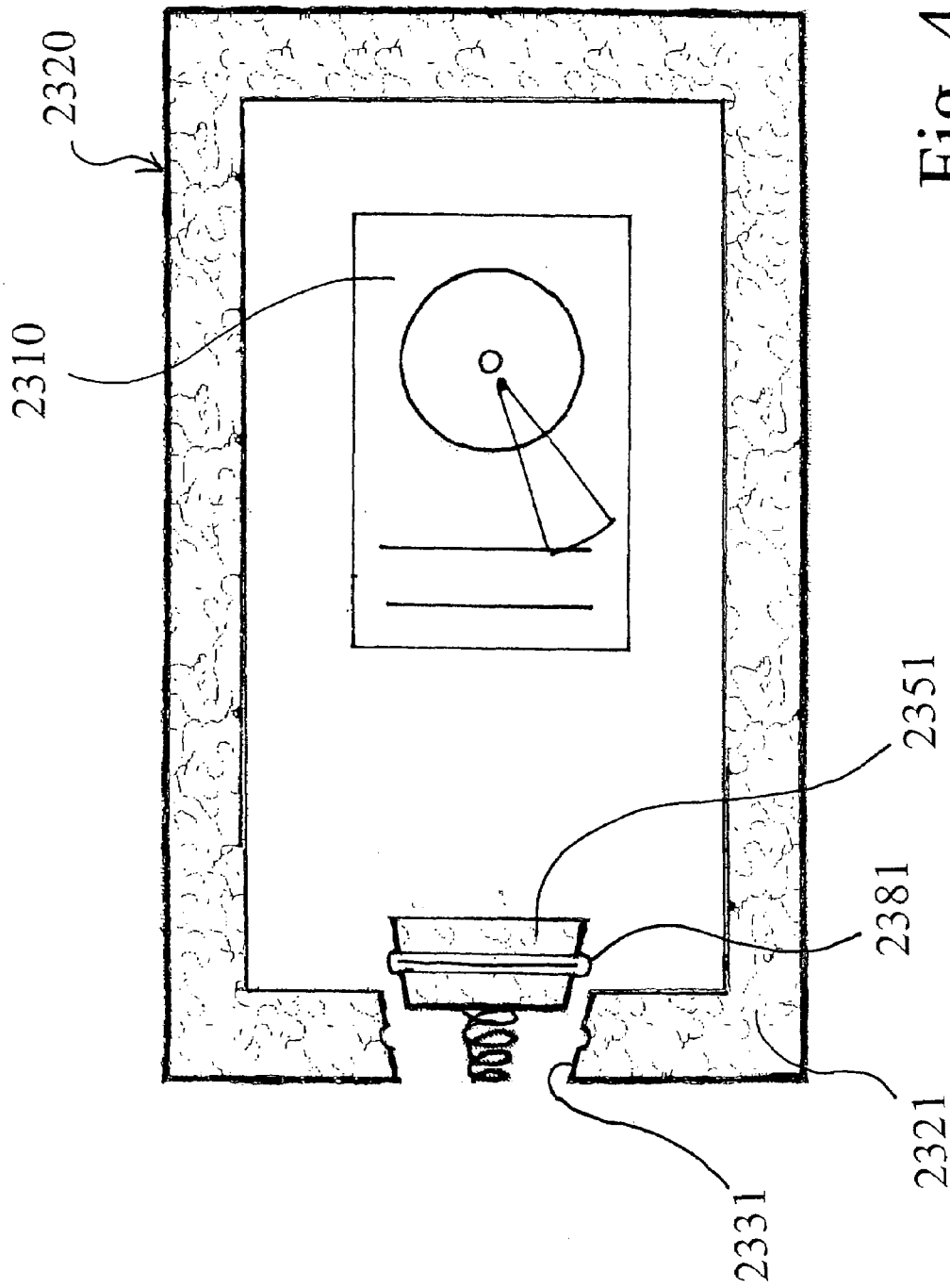
FIG. 41 illustrates an enclosure wherein a movable hatch carries a water resistant O-ring.
Figure 42:
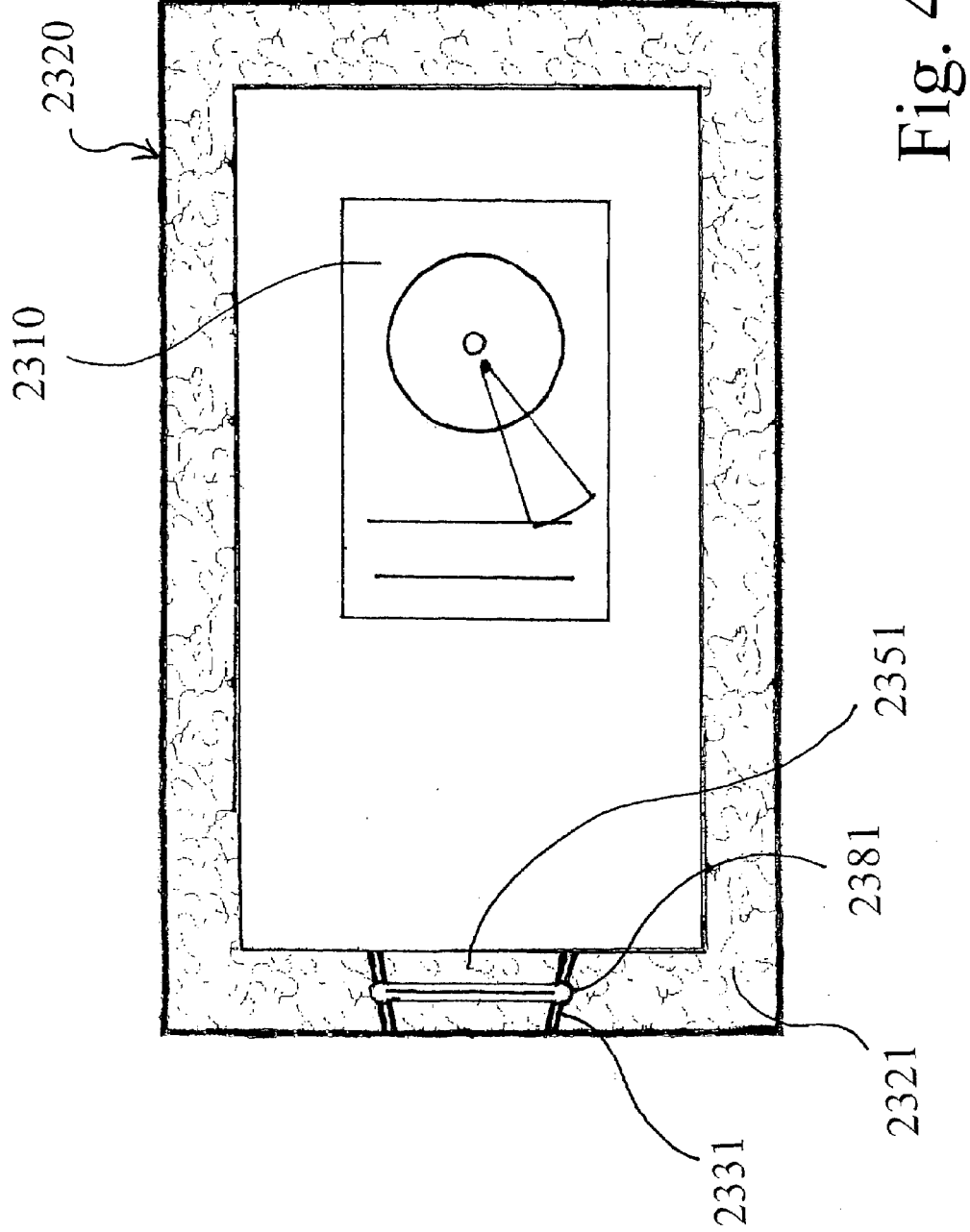
FIG. 42 illustrates the embodiment of FIG. 41 after exposure to fire and/or water.

FIGS. 41 and 42 illustrate a fire resistant enclosure 2320 housing a data storage device 2310. A ventilation passageway 2331 is provided in side wall 2321. The ventilation passageway 2331 is tapered and frusto-conical in shape so that its internal diameter is greater than its diameter at the outer edge of enclosure 2320. A movable hatch 2351 carries an O-ring 2381 which extends around the perimeter of hatch 2351. The O-ring 2381 forms a water resistant seal against ventilation passageway 2331 when hatch 2351 is caused by the presence of fire or water to be seated against passageway 2331 as illustrated in FIG. 42.

E) Enclosures of Molded Gypsum with Integrally Molded Component Supports

FIGS. 43-46 illustrate enclosures molded from gypsum (or other fire resistant moldable material) having integrally molded component supports. As described below, a low cost enclosure is achieved by molding it from gypsum or other inexpensive moldable fire resistant material. The enclosure is molded preferably in two separate parts. Preferably, supports for the hard drive, any air ducting features and ventilating fan are integrally formed into the molded gypsum parts that make up the final enclosure. Optionally, supports for a hatch and hatch actuating spring are also integrally molded into the enclosure. Furthermore, any fixed ventilation passageways that are ultimately utilized in the finished product to allow air to flow through an exterior wall of the enclosure are integrally formed in the molded gypsum parts. By molding the gypsum with integral supports for these components, it is not necessary to provide separate attachment parts to support various components inside the finished enclosure. By reducing the need for these separate components, the cost of parts and labor is significantly reduced. A lower cost enclosure with a reduced number of parts is therefore made available as a result of utilizing the present invention.

Figure 43:
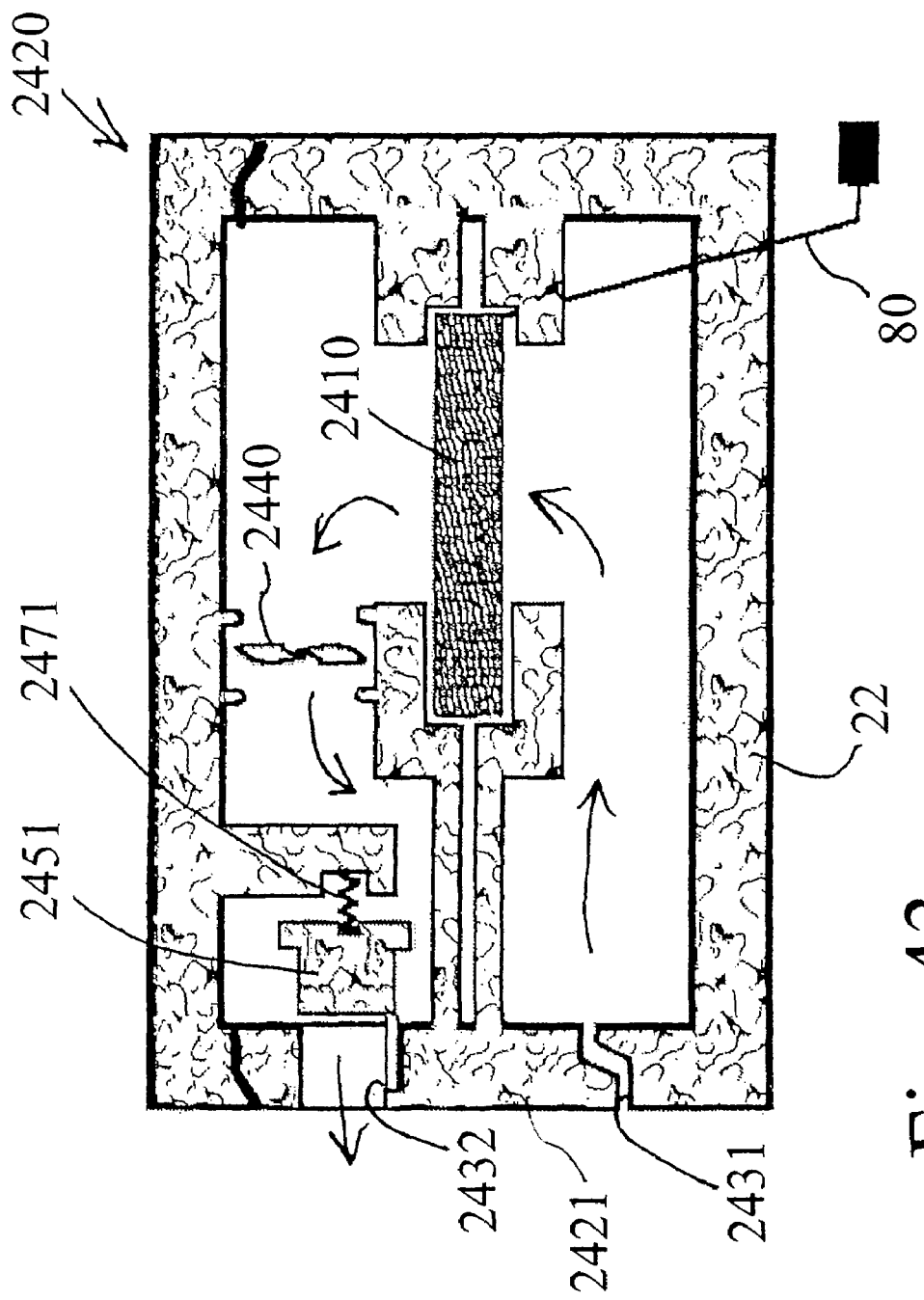
FIGS. 43-46 illustrate enclosures formed by molding with gypsum or other fire resistant moldable material.

FIG. 43 illustrates a fully assembled "disaster resistant" enclosure 2420 molded in accordance with the present invention. A hard drive 2410 is carried within the enclosure. The ventilating air enters the enclosure through inlet passageway 2431, formed in side wall 2421 and exits through outlet passageway 2432 formed in side wall 2421 of enclosure 2420. Hatch 2451 is mounted adjacent the outlet passageway 2432 and is driven to its closed position by a spring 2471, as described more fully in application Ser. No. 11/112,552 noted above. Fan 2440 actively causes ambient air to be drawn inwardly through passageway 2431 circulated over the operating data storage device 2410 and driven outwardly through outlet passageway 2432.

Figure 44:
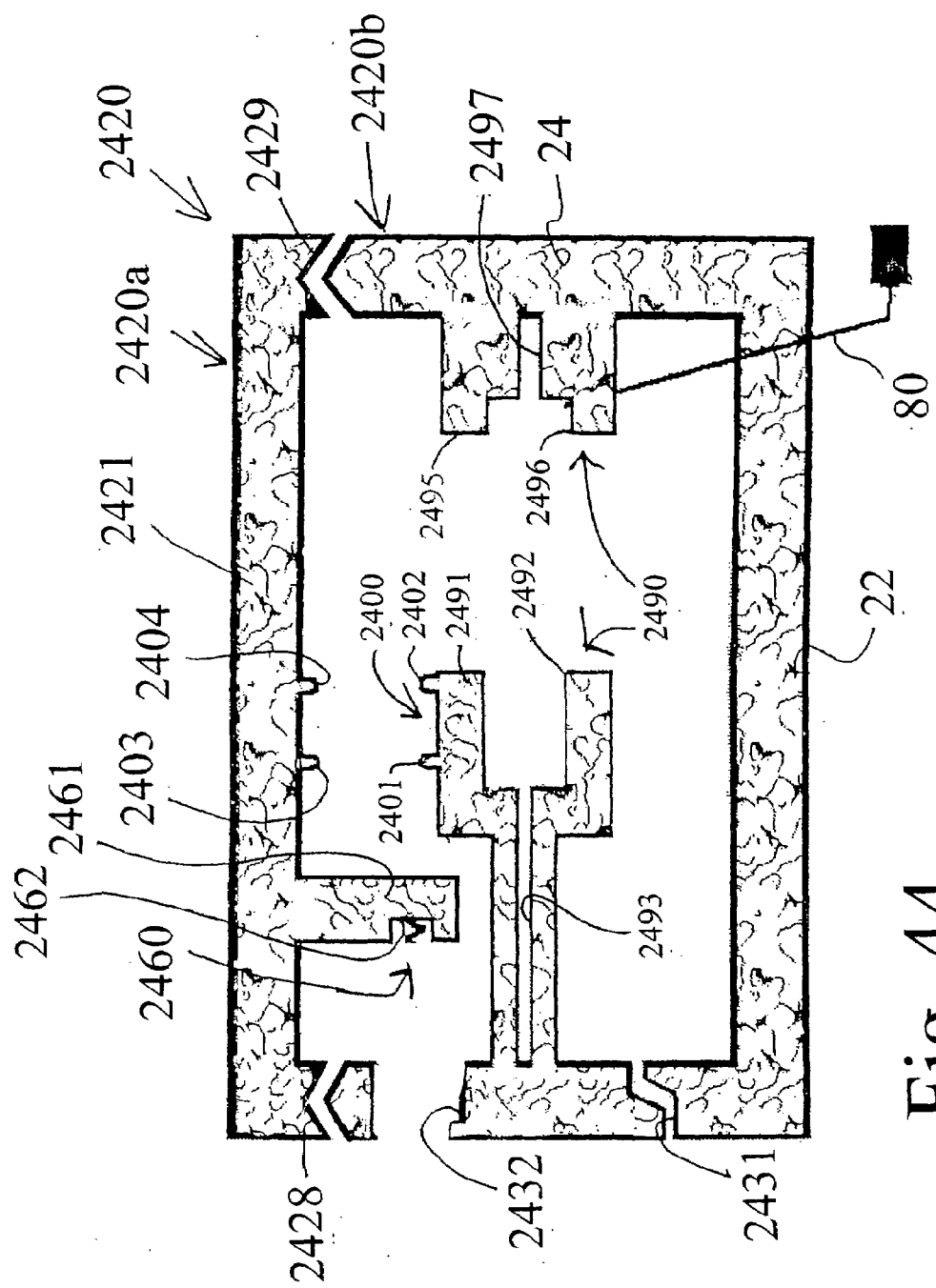

FIG. 44 illustrates the two sections 2420a and 2420b which make up the molded enclosure 2420. The two parts 2420a and 2420b contain molded component supports for the hard drive 2410, the fan 2440, the hatch drive spring 2471, all as shown in FIG. 43. A molded support shown generally as 2490 supports the hard drive 2410. The support 2490 includes a first generally C-shaped section including an upper molded jaw 2491 and a lower molded jaw 2492. Jaws 2491 and 2492 are separated by an elongated passageway 2493 that provides a degree of resilience to jaws 2491 and 2492. The resilience between jaws 2491 and 2492 is utilized to apply minor pressure to secure hard drive 2410 in its assembled position. The molded support 2490 also includes a second generally C-shaped support including upper jaw 2495 and lower jaw 2496. Jaws 2495 and 2496 are separated by an elongated slit 2497 which provides resilience between jaws 2495 and 2496. Alternatively, not shown, the jaws can be rigid and the hard drive can be supported with a resilient gasket-type material to absorb shock loads and to secure the position of drive 2410.

A fan support shown generally as 2400 includes a series of four molded lugs 2401-2404. Lugs 2401 and 2402 are carried by and formed in the upper surface of jaw 2491. The upper molded section 2420a carries lugs 2403 and 2404 that are positioned oppositely to fan support lugs 2401 and 2402. The purpose of lugs 2401-2404 is to slidably receive fan 2440 in its housing (not shown for clarity), all as shown best in FIG. 43.

The upper molded segment 2420a also includes a molded hatch and hatch spring support shown generally as 2460. The support 2460 includes a downwardly extending member 2461 in which a recessed spring seat 2462 is formed. Spring seat 2462 is simply a cylindrical recess which carries the spring 2471 (see FIG. 43) for causing hatch 2451 to close when fire is sensed.

The significance of integrally molding the hard drive support 2490, the fan support 2400 and the hatch and hatch spring support 2460 as part of enclosure 2420, is to eliminate the need for attachment parts for the hard drive, fan, hatch and hatch spring. Those attachment parts are shown and described in application Ser. No. 11/112,552. It is to be understood that the generally inverted V-shaped dividing lines 2428 and 2429 between the upper and lower segments of the mold can be located at other positions than adjacent the top wall 2421 as shown in FIG. 44.

A further aspect of the present invention is that the ventilation passageways, such as inlet passageway 2431 and outlet passageway 2432, may be integrally formed in the lower molded segment 2420b. Integrally molding the ventilation passageways avoids the time and cost of forming those passageways through a solid molded wall and furthermore allows the use of rather tortuous pathways as illustrated by inlet passageway 2431. Tortuous pathways are relatively difficult to fabricate in a solid molded wall.

Figure 45:
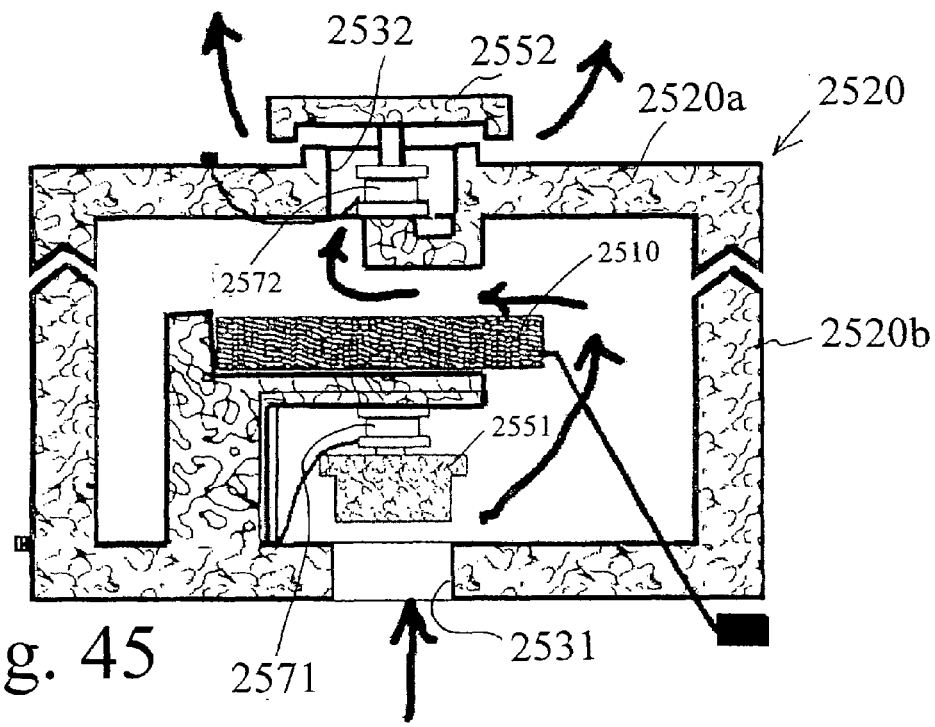
Figure 46:
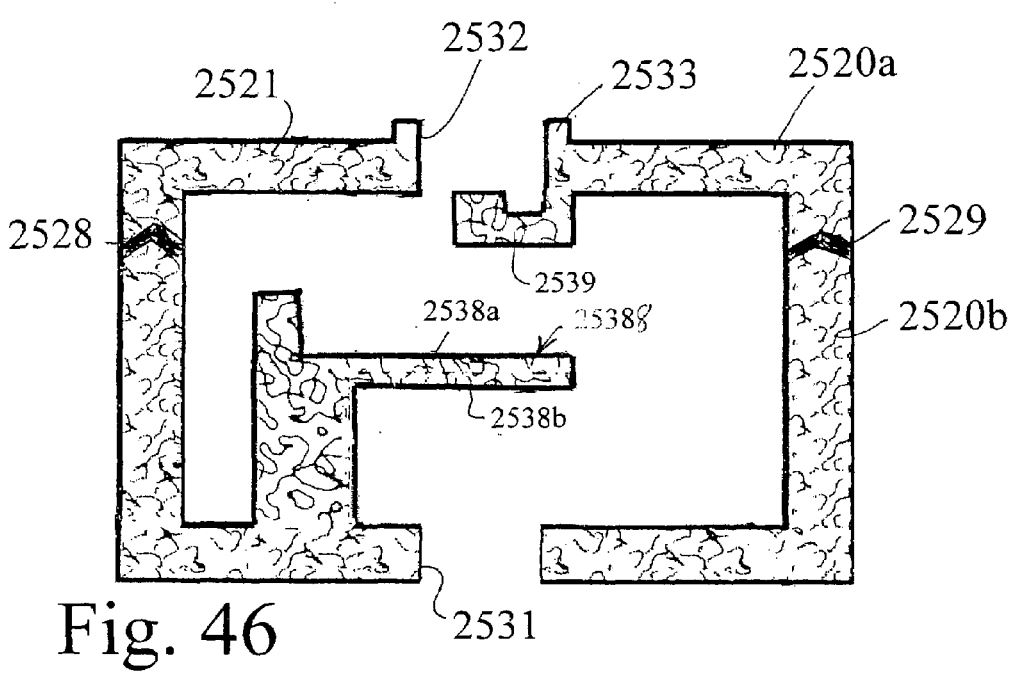

FIGS. 45 and 46 illustrate an embodiment wherein the hard drive 2510 is mounted within molded enclosure 2520. The embodiment shown in FIGS. 45 and 46 utilizes passive convection to cool the hard drive 2510, i.e., no fan is utilized as in the embodiment shown in FIGS. 43 and 44. Enclosure 2520 has an upper molded segment 2520a and a lower molded segment 2520b. Inlet passageway 2531 allows air to flow upwardly across hard drive 2510. The air flows by convection alone across the hard drive 2510 and outwardly through exhaust passageway 2532. Movable hatches 2551 and 2552 are carried by solenoids 2571 and 2572, respectively. When fire is sensed, solenoids 2571 and 2572 are actuated, and hatches 2551 and 2552 are closed, as described more fully in application Ser. No. 11/112,552 referred above.

FIG. 46 illustrates a molded gypsum (or other fire resistant material) segments 2520a and 2520b. The dividing line between the segments is the generally inverted V-shape lines 2528 and 2529 located near the top wall 2521. Ventilation passageways 2531 and 2532 are circular holes molded in segments 2520a and 2520b, respectively. A molded solenoid and exhaust hatch support 2539 is molded as an integral portion of upper segment of 2520a. A circular, upwardly protruding lip 2533 extends around exhaust opening 2532. Lip 2533 creates a tortuous pathway for exhaust air. A support arm 2538 is molded integrally as part of lower segment 2520b and serves dual purposes. Support arm 2538 supports hard drive 2510 on its upper surface 2538a and supports inlet hatch 2551 and solenoid 2571 on its lower surface 2538b. The arm 2538 causes air to flow around hard drive 2510 in a manner to transfer and remove maximum heat from the hard drive 2510. The hatches 2551 and 2552 (not shown in FIG. 46) are separately molded of gypsum or other fire resistant material.

F) Enclosures that Utilize Free Convection to Cool the Data Storage Device

FIGS. 47-66 illustrate embodiments of the invention wherein "free convection" is utilized to cool the digital data storage device. In other words, no fan is utilized.

Figure 47:
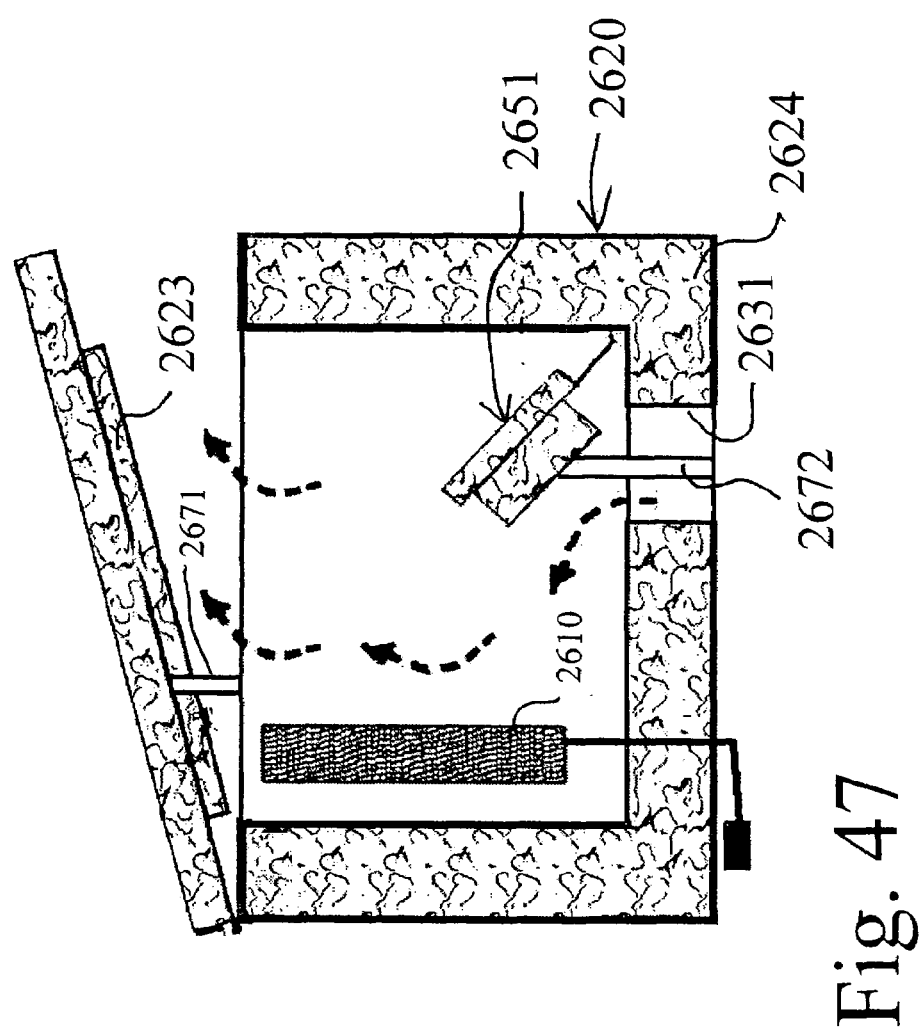
FIGS. 47-66 illustrate "free convection" embodiments of the invention wherein no fans are utilized.

FIG. 47 illustrates an enclosure 2620 having a hinged top 2623 which, in the absence of fire, is held in its open position shown in FIG. 47 by a meltable element 2671. In the presence of fire, meltable element 2671 melts and allows the cover 2623 to close. Hard drive 2610 is mounted within enclosure 2620. A ventilation inlet passageway 2631 is formed in the lower wall 2624 of enclosure 2620. A movable hatch 2651 is positioned adjacent opening 2631 and is held in its open position by a meltable element 2672. In the absence of fire, ambient air flows by "free convection" through inlet passageway 2631 upwardly through the interior of enclosure 2620 and outwardly beneath the raised top or cover 2623 of enclosure 2620. In the presence of fire the meltable elements 2671 and 2672 melt allowing the cover 2623 and hatch 2651 to close, sealing the top of enclosure 2620 and inlet passageway 2631 and forming a highly fire resistant enclosure for hard drive 2610 and data stored thereon.

Figure 48:
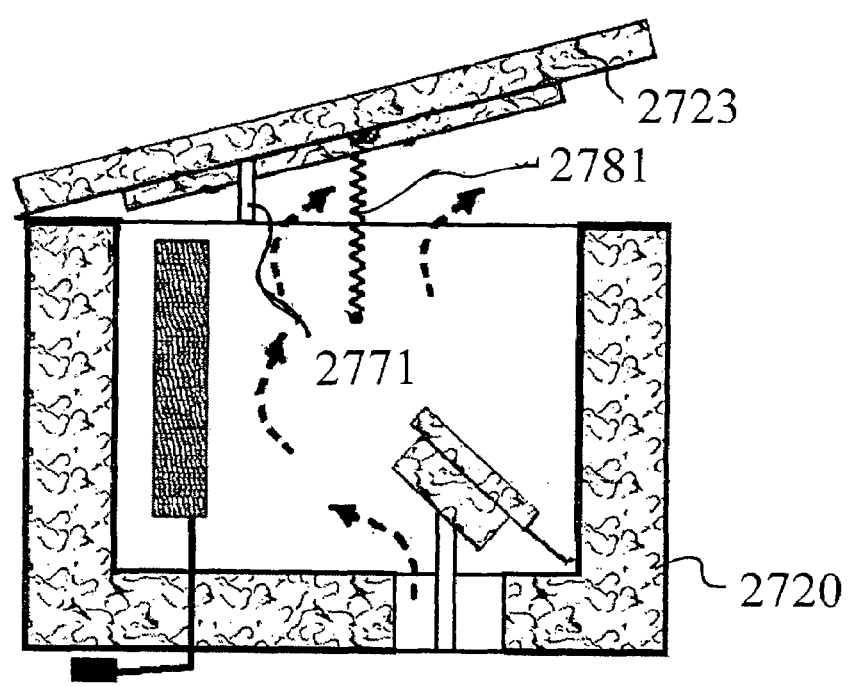

FIG. 48 illustrates enclosure 2720, which is similar to enclosure 2620 illustrated in FIG. 47, except that a spring 2781 is connected to the cover 2723 of enclosure 2720 and draws cover 2723 downwardly as the meltable element 2771 is melting.

Figure 49:
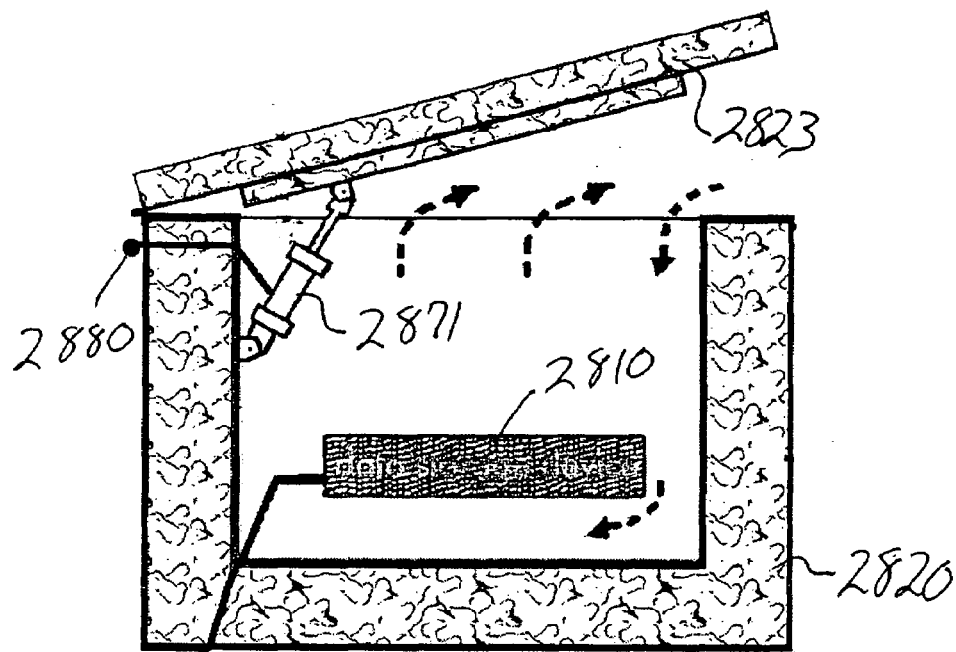
Figure 50:
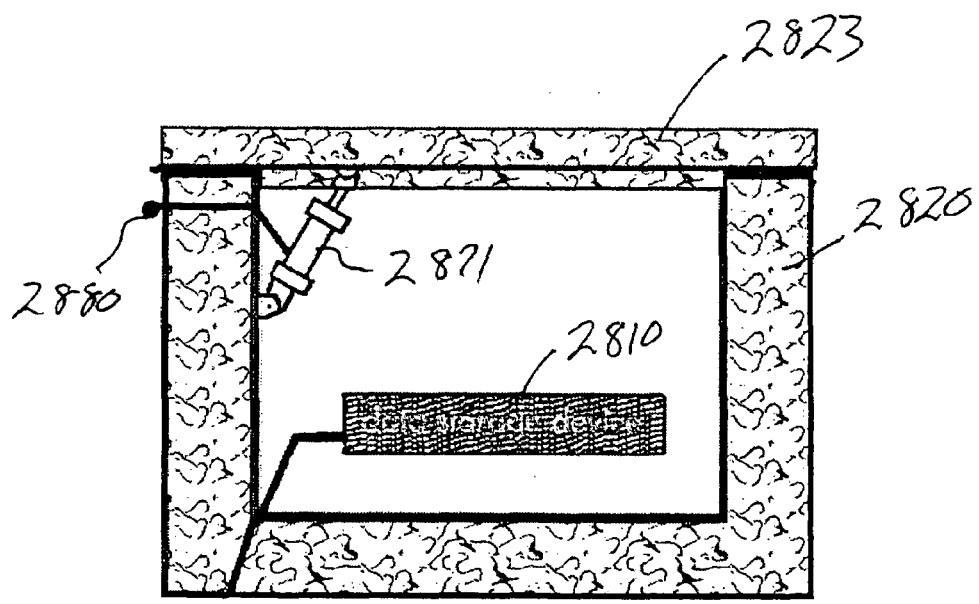

FIGS. 49 and 50 illustrate another "free convection" enclosure 2820, housing data storage device 2810. In this embodiment, the cover or lid 2823 is held in its raised or open position by solenoid 2871 and acts as a single inlet and outlet ventilation passageway. Air is free to move inwardly into the interior space of enclosure 2820 and carry heat generated by data storage device 2810 upwardly and outwardly beneath the raised cover or lid 2823. A temperature sensor 2880 causes solenoid 2871 to retract in the presence of fire, as shown in FIG. 50, causing the cover or lid 2823 to close forming a highly fire resistant enclosure.

Figure 51:
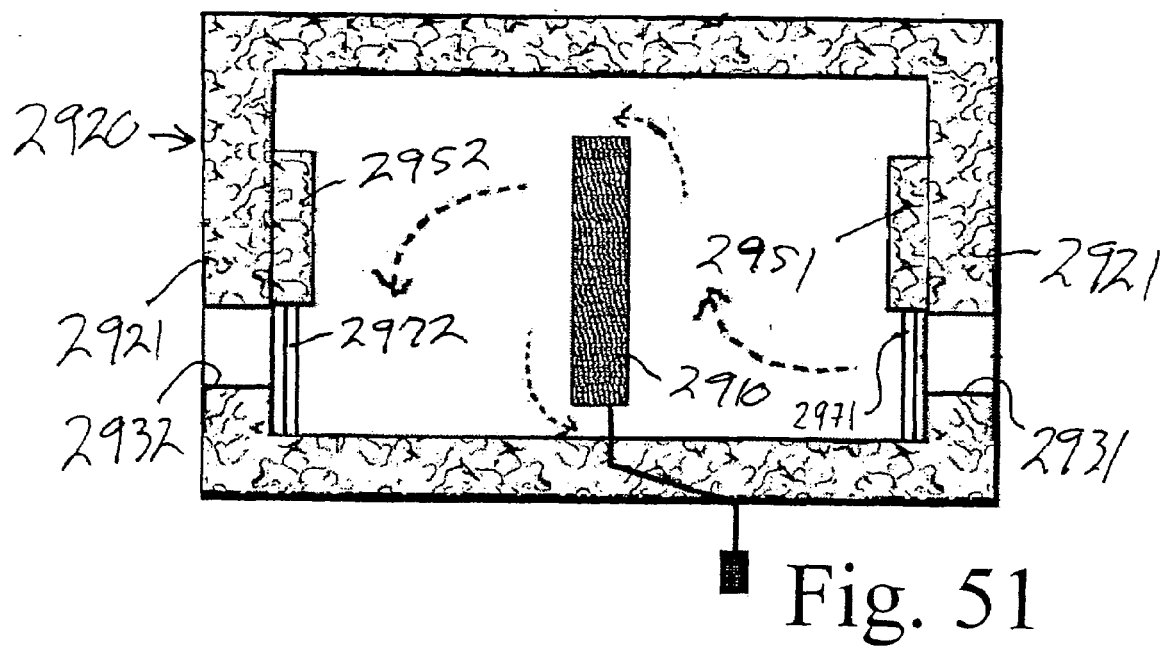
Figure 52:
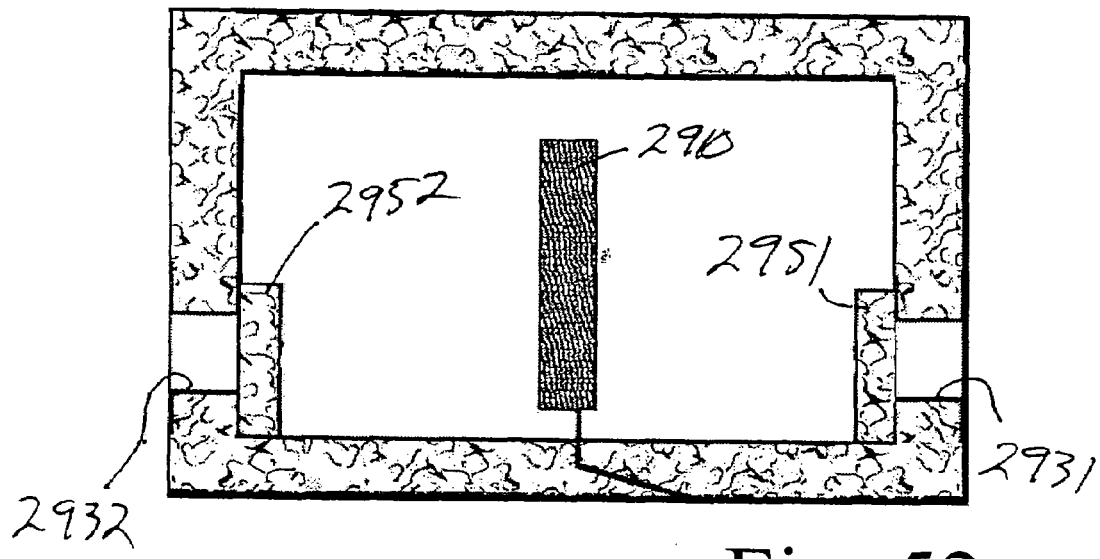

FIGS. 51 and 52 illustrate a further "free convection" variation wherein enclosure 2920 includes an inlet passageway 2931 formed in side wall 2921 and an outlet passageway 2932 formed in side wall 2921. Slidable hatches 2951 and 2952 are mounted adjacent inlet and outlet passageways and are held in their open positions above the passageways by meltable elements 2971 and 2972, respectively. In the presence of fire, the elements 2971 and 2972 melt allowing the hatches 2951 and 2952 to move by the force of gravity alone to their closed position, as shown in FIG. 52, wherein passageways 2931 and 2932 are sealed and a fire resistant enclosure is formed protecting the data storage device 2910 and its contents.

Figure 53:
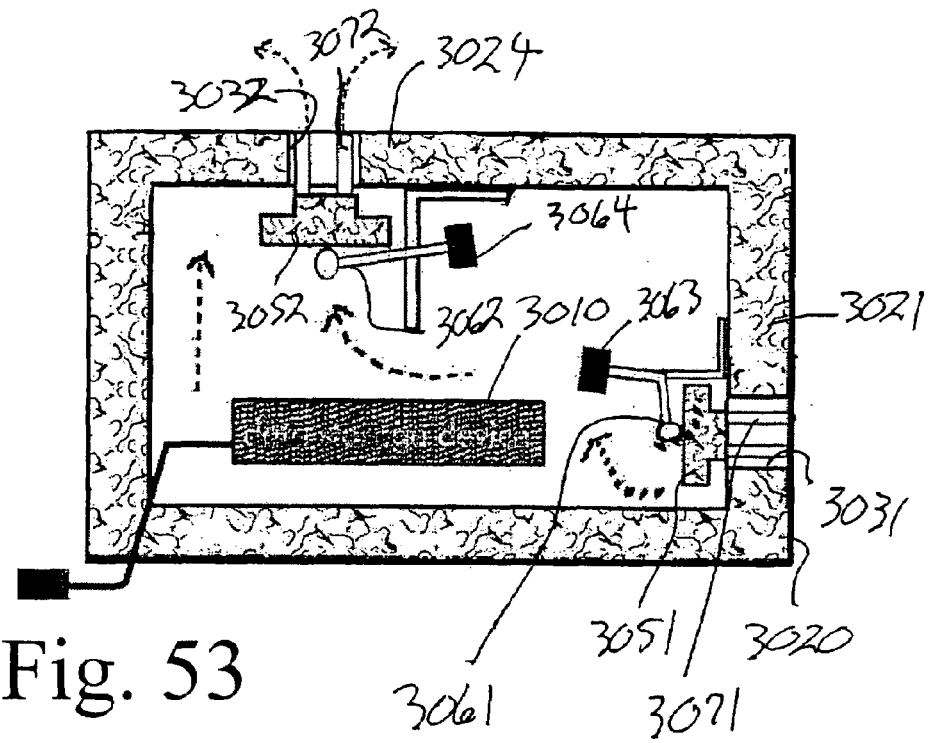
Figure 54:
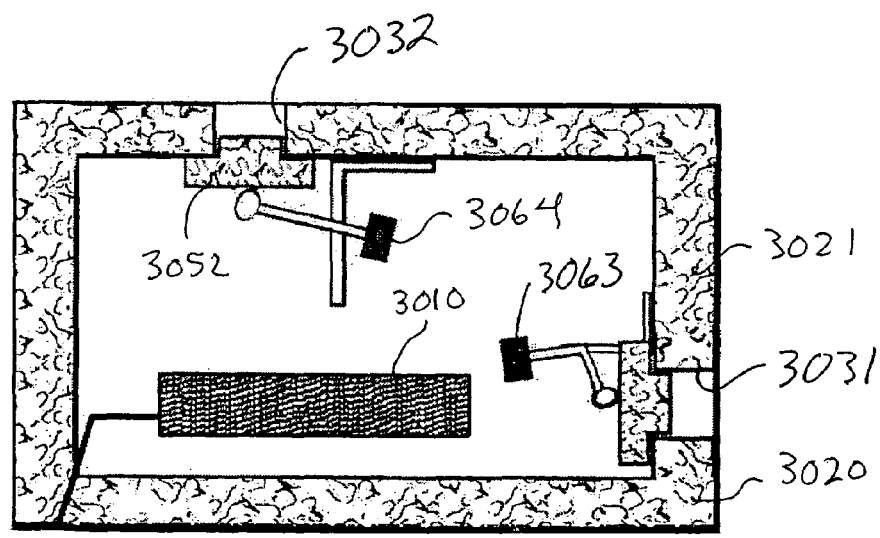

FIGS. 53 and 54 illustrate an enclosure 3020 having an inlet passageway 3031 formed in side wall 3021 and an outlet passageway 3032 formed in the top wall or cover 3024 of enclosure 3020. Cooling air moves by "free convection" alone through inlet passageway 3031 across data storage device 3010 and outwardly through the exhaust or outlet passageway 3032. Hatches 3051 and 3052 are mounted adjacent passageways 3031 and 3032. Meltable elements 3071 and 3072 hold the hatches in their open position shown in FIG. 53. In the presence of fire, as the meltable elements 3071 and 3072 begin to melt, the hatches 3051 and 3052 are driven to their closed position by hatch actuators 3061 and 3062. Hatch actuators are gravity driven by counterweights 3063 and 3064 that are pivotally mounted as to constantly urge hatches 3051 and 3052 toward their closed positions. In the presence of fire, the counterweights 3063 and 3064 move downwardly, causing respective hatches 3051 and 3052 to their closed and fully fire resistant positions shown in FIG. 54.

Figure 55:
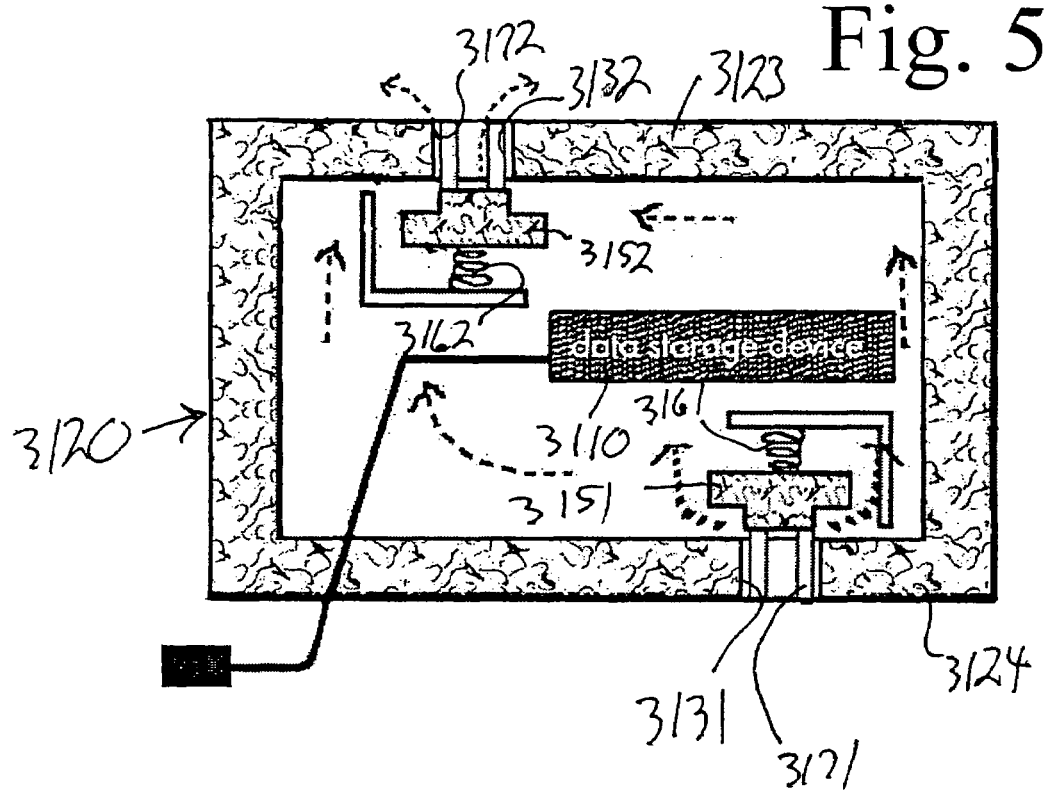
Figure 56:
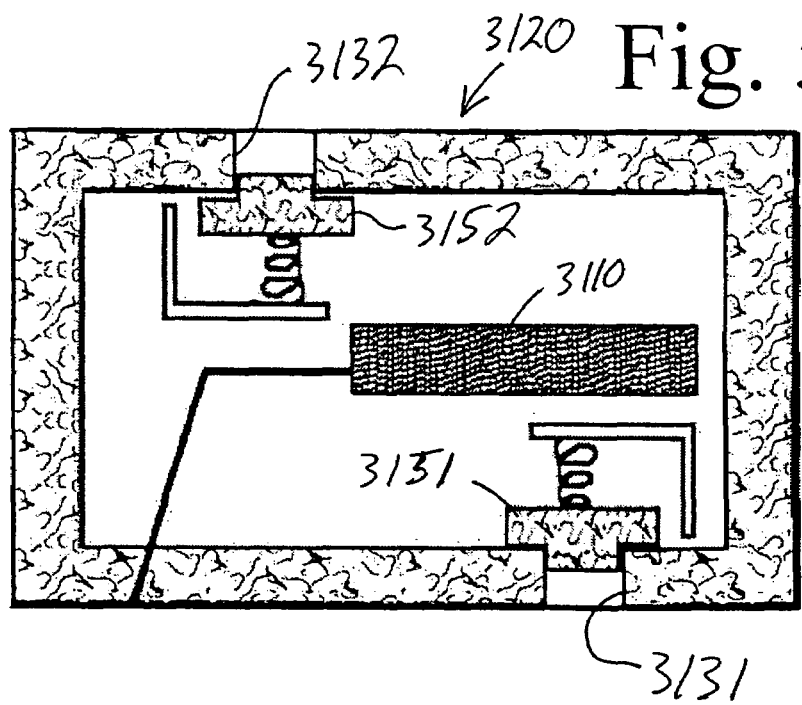

FIGS. 55 and 56 illustrate an embodiment wherein enclosure 3120 includes an inlet passageway 3131 formed in its lower wall 3124 and an outlet passageway 3132 formed in its upper wall 3123. Air moves by "free convection" alone through inlet passageway 3131, across data storage device 3110 and outwardly through outlet or exhaust passageway 3132. Movable hatches 3151 and 3152 are mounted adjacent passageways 3131 and 3132 and are held in their open positions by meltable elements 3171 and 3172. In the presence of fire, as the meltable elements 3171 and 3172 melt, the hatches 3151 and 3152 are urged to their closed positions by springs 3161 and 3162, as shown in FIG. 56.

Figure 57:
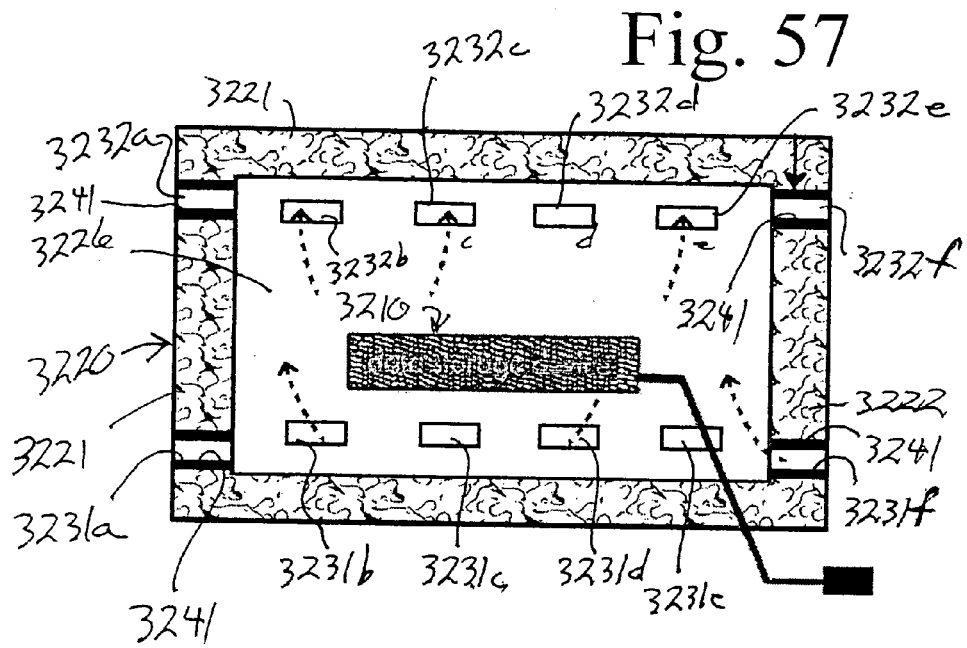
Figure 58:
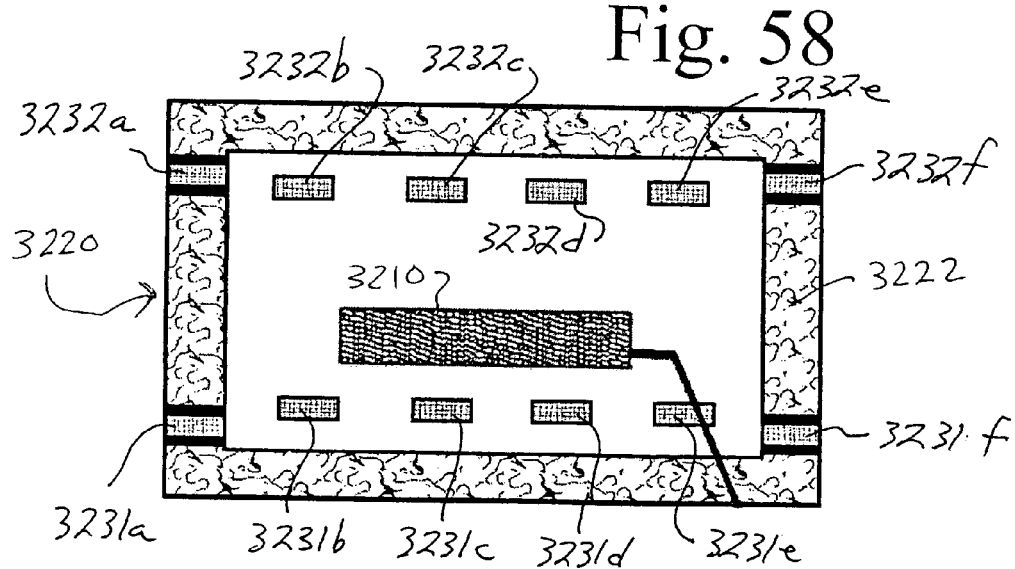

FIGS. 57 and 58 illustrate enclosure 3220 having an array of inlet passageways 3231a-3231f which are formed along the lower portions of side walls 3221, 3222 and the end wall 3226. Similarly, outlet or exhaust passageways 3232a-3232f are formed in the side walls and end wall above the inlet passageways 3231a-3231f and adjacent the top wall 3221. Cooling air flows by "free convection" alone through the inlet passageways across the data storage device 3210 and outwardly through the exhaust passageways. Each of the inlet and outlet passageways is lined with a temperature activated coating shown as 3241 and illustrated only in passageways 3231a, 3231f, 3232a and 3232f for clarity. In the presence of fire, the temperature activated coating expands or foams upwardly and outwardly to seal off each of the respective vents as shown in FIG. 58.

Figure 59:
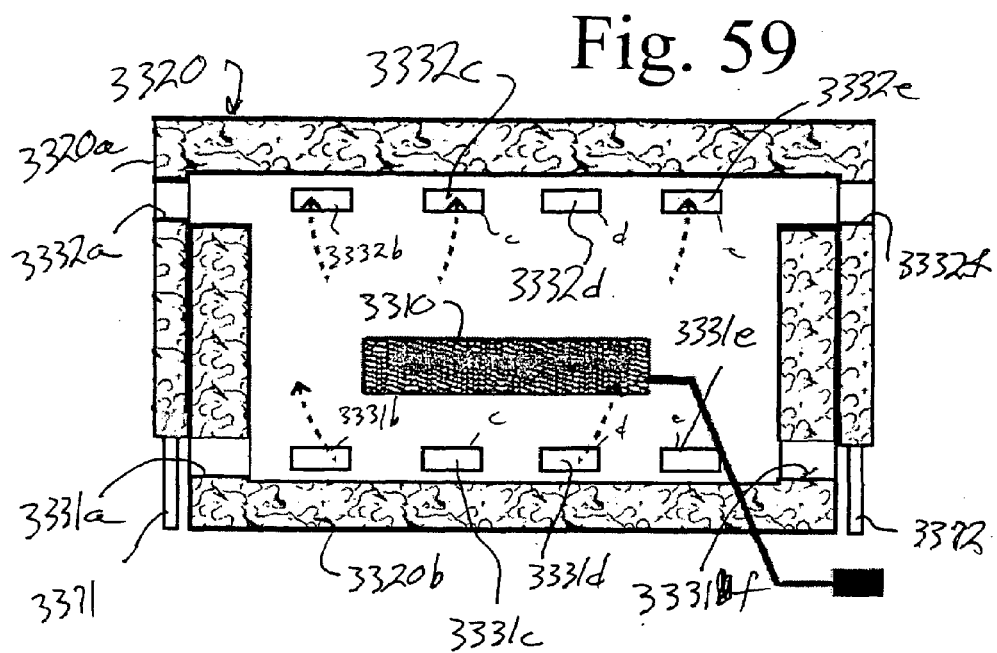
Figure 60:
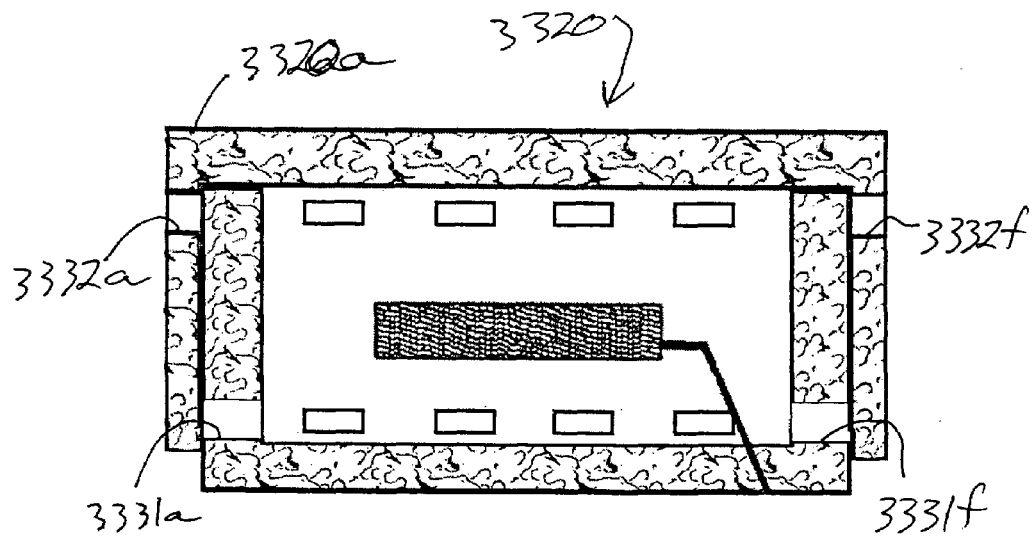

FIGS. 59 and 60 illustrate enclosure 3320 wherein the enclosure includes a movable upper segment 3320a and a stationary lower segment 3320b. The upper segment 3320a is movable between its first position shown in FIG. 59 wherein inlet passageways 3331a-3331f are open and which allows air to flow inwardly and across data storage device 3310. Similarly, exhaust or outlet passageways 3332a-3332f are open in this first position of the two segments 3320a and 3320b. The first segment 3320a of enclosure 3320 is held in its first or uppermost position shown in FIG. 59 by meltable elements 3371 and 3372. In the presence of fire, the meltable elements 3371 and 3372 melt away allowing the upper segment to move to its second position shown in FIG. 60 wherein all of the inlet and outlet passageways 3331a-f and 3332a-f are closed. The upper segment 3320a moves to its second or closed position shown in FIG. 60 by gravity alone once the meltable elements 3371 and 3372 begin to melt in the presence of fire.

Figure 61:
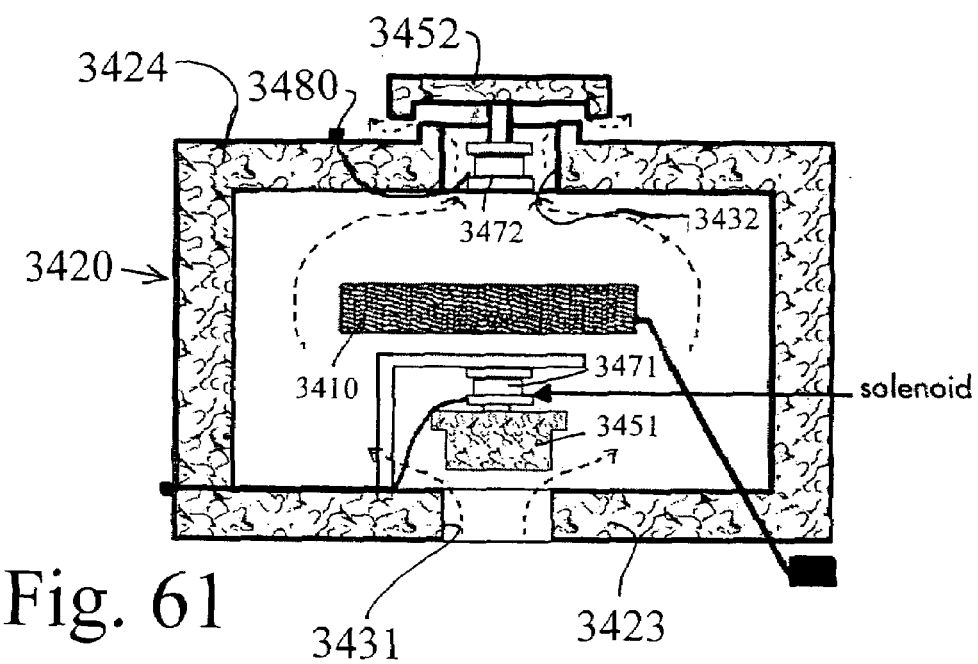
Figure 62:
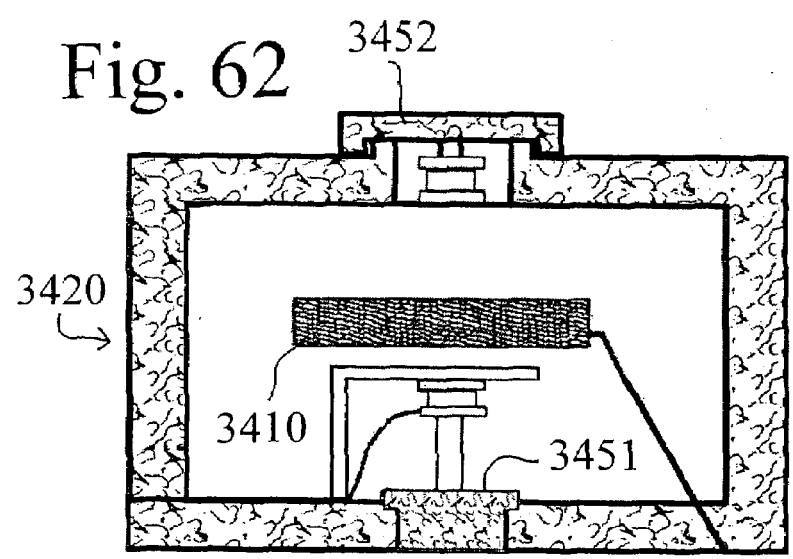

FIGS. 61 and 62 illustrate an enclosure 3420 having an inlet passageway 3431 formed in its lower wall 3423 and an outlet or exhaust passageway 3432 formed in its cover or top wall 3424. Cooling air flows by "free convection" alone through inlet passageway 3431, upwardly and across data storage device 3410 and outwardly through the exhaust or outlet passageway 3432 at the top of enclosure 3420. Movable hatches 3451 and 3452 are positioned adjacent to and above the inlet and outlet passageways 3431 and 3432, respectively, and are held in their open positions by solenoids 3471 and 3472. A temperature sensor 3480 activates both solenoids 3471 and 372 at a predetermined temperature causing the hatches to be closed as shown in FIG. 62. Hatch 3552 is mounted on the exterior of enclosure 3420 whereas hatch 3451 is mounted in the interior of enclosure 3420.

Figure 63:
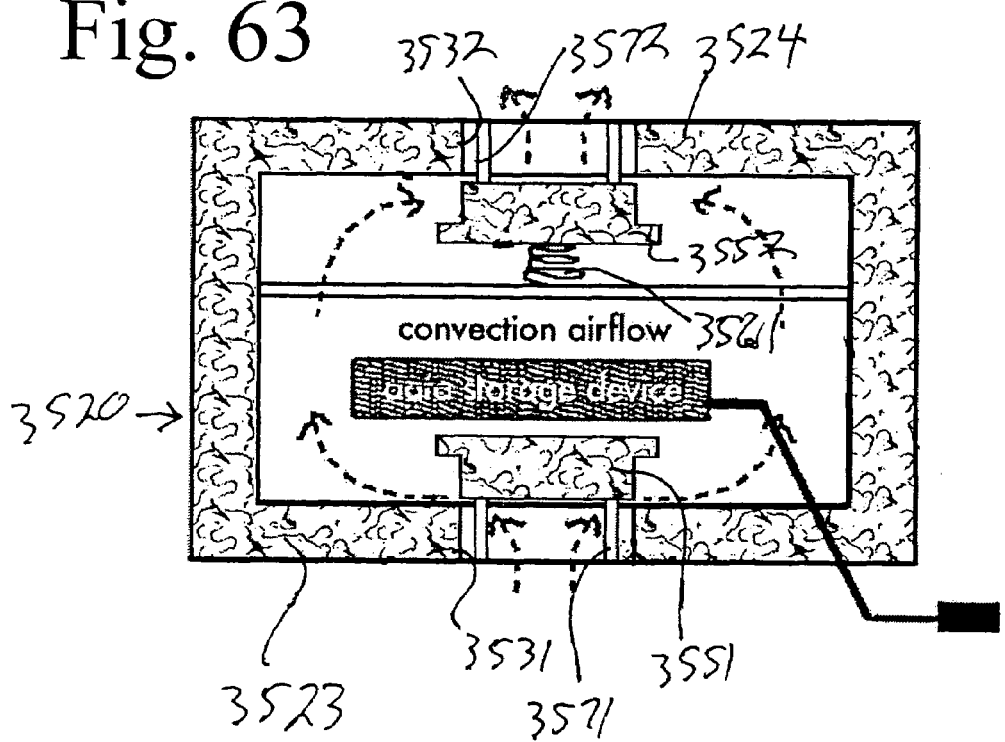
Figure 64:
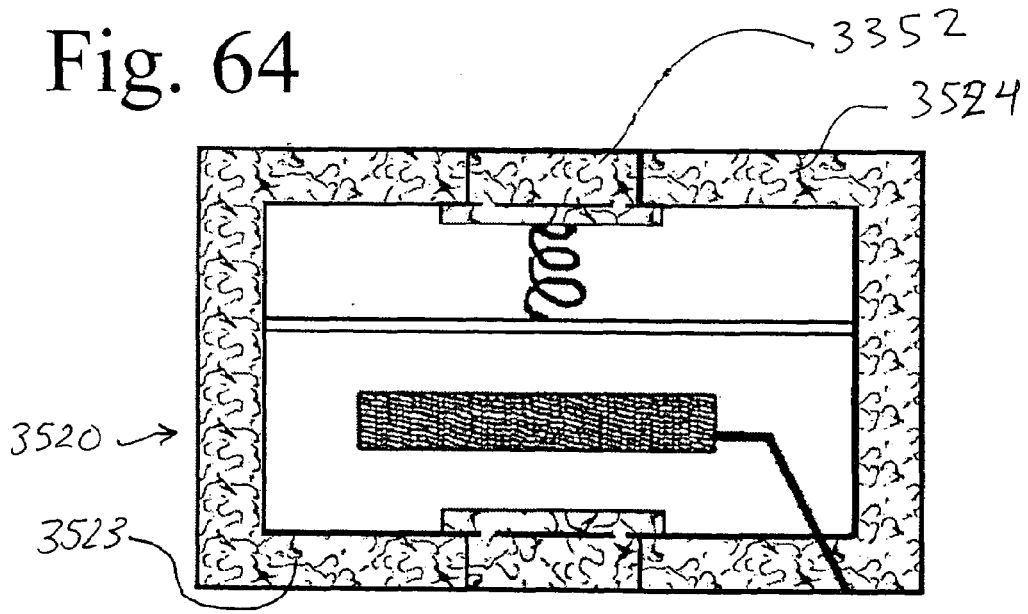

FIGS. 63 and 64 illustrate another embodiment wherein enclosure 3520 includes an inlet passageway 3531 formed in its lower or bottom wall 3523 and an outlet passageway 3532 formed in its upper or top wall 3524. In this embodiment, hatches 3551 and 3552 are mounted internally of enclosure 3520 adjacent passageways 3531 and 3532, respectively. Both hatches are held in their open position by meltable elements 3571 and 3572. In the presence of fire, as meltable elements 3571 and 3572 melt away, the hatches are moved to their closed position. Hatch 3551 closes by the force of gravity and hatch 3552 is moved to its closed position by spring 3561.

Figure 65:
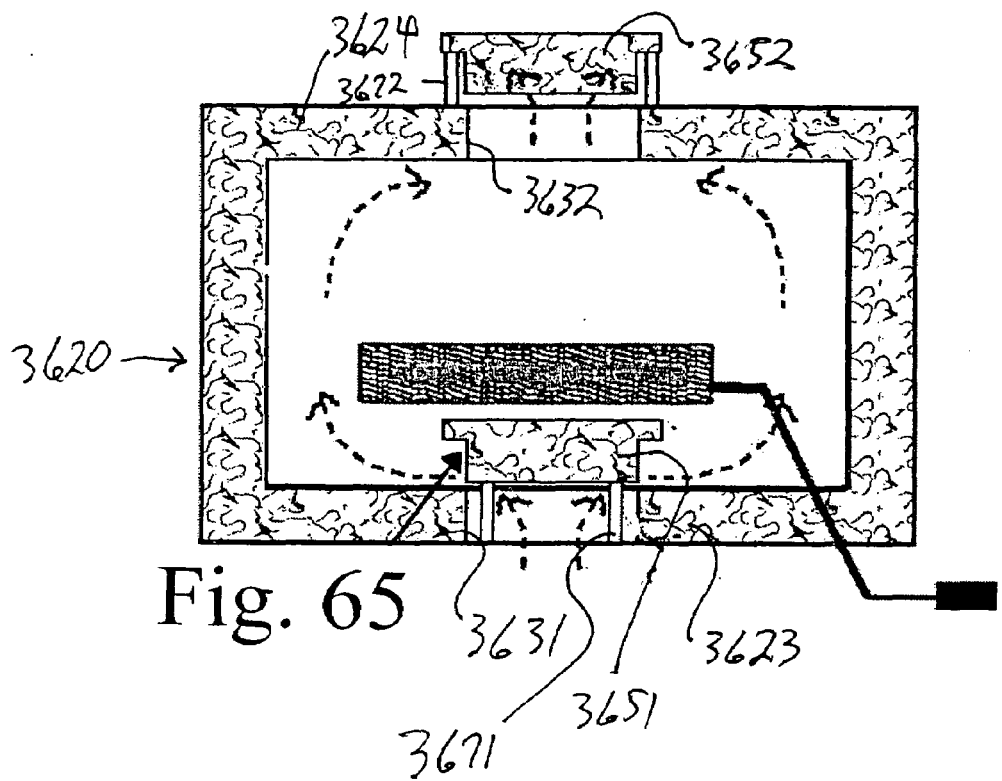
Figure 66:
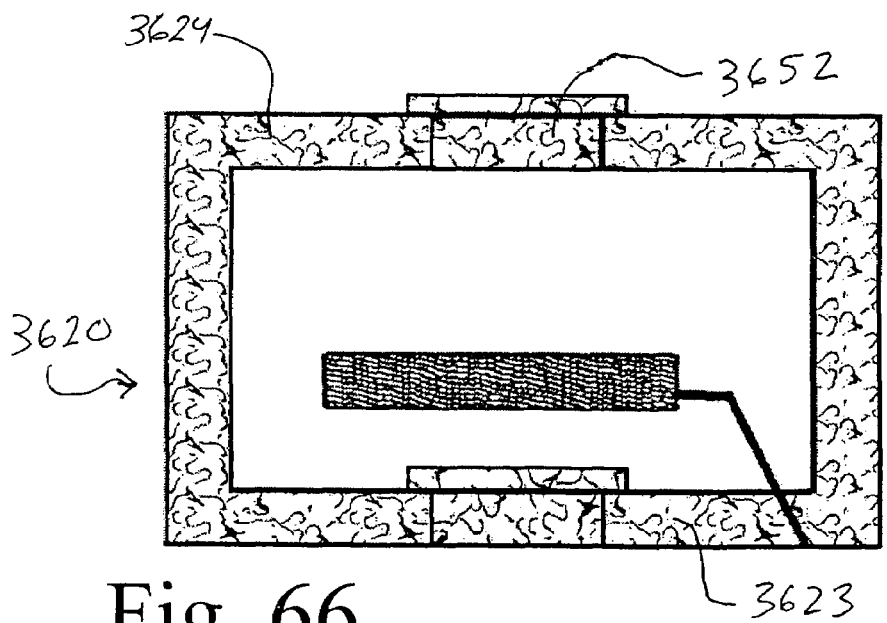

FIGS. 65 and 66 illustrate an enclosure 3620 having an inlet passageway 3631 formed in the lower or bottom wall 3623 of enclosure 3620 and an outlet or exhaust passageway 3632 formed in the top or upper wall 3624 of enclosure 3620. Movable hatches 3651 and 3652 are mounted adjacent to and above openings 3631 and 3632. Hatch 3652 is mounted above the top wall 3624. In this embodiment, both hatches 3651 and 3652 are held in their open position by meltable elements 3671 and 3672, respectively. In the event of fire, the meltable elements 3671 and 3672 melt away and the hatches close by gravity alone to the positions shown in FIG. 66.

G) Other Embodiments

Figure 67:
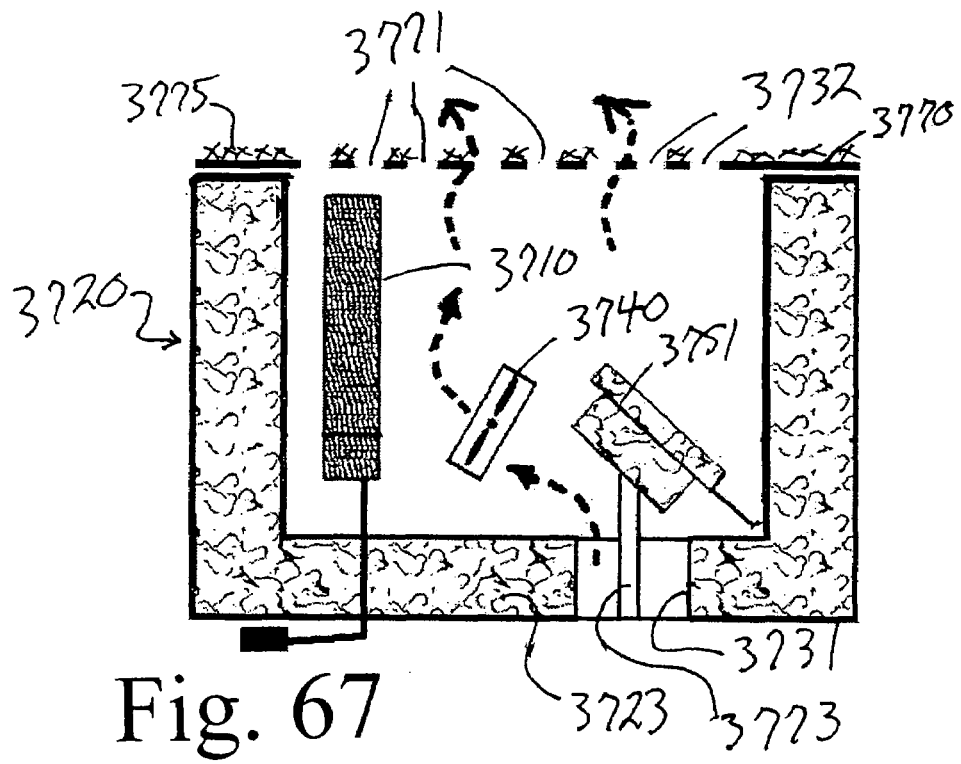
FIGS. 67-70 illustrate miscellaneous enclosures with a variety of components.
Figure 68:
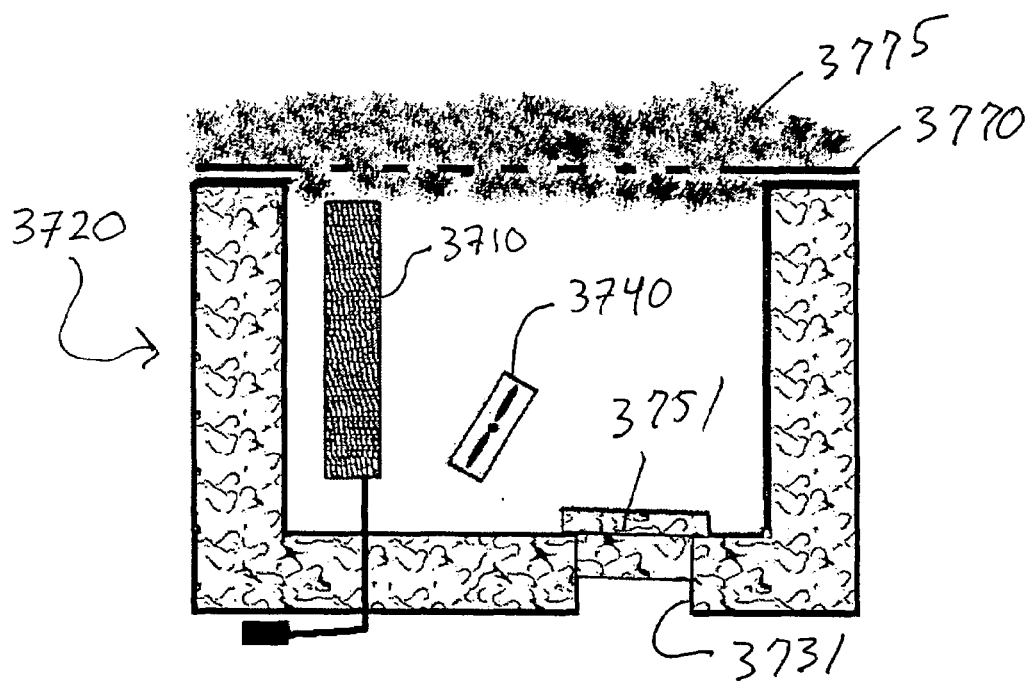

FIGS. 67 and 68 illustrate an enclosure which includes various attributes of the enclosures described above. An inlet ventilation passageway 3731 is formed in the lower or bottom wall 3723 of enclosure 3720. A plurality of exhaust passageways 3732 are formed in perforated plate 3770 which forms the top or cover of enclosure 3720. An array of perforations 3771 in plate 3770 allows exhaust of air flowing across data storage device 3710. A fan 3740 mounted in the interior of enclosure 3720 and adjacent the data storage device 3710 forcibly draws air through inlet 3731 and across data storage device 3710 and through the outlet passageways 3732 formed by perforations in plate 3770. Plate 3770 is covered with an intumescent coating 3775. In the presence of fire, the intumescent coating expands and seals the perforations 3771 in plate 3770. Simultaneously, the meltable element 3773, which holds hatch 3751 in its open position shown in FIG. 67, melts and allows hatch 3751 to close, forming the fire resistant enclosure illustrated in FIG. 68.

Figure 69:
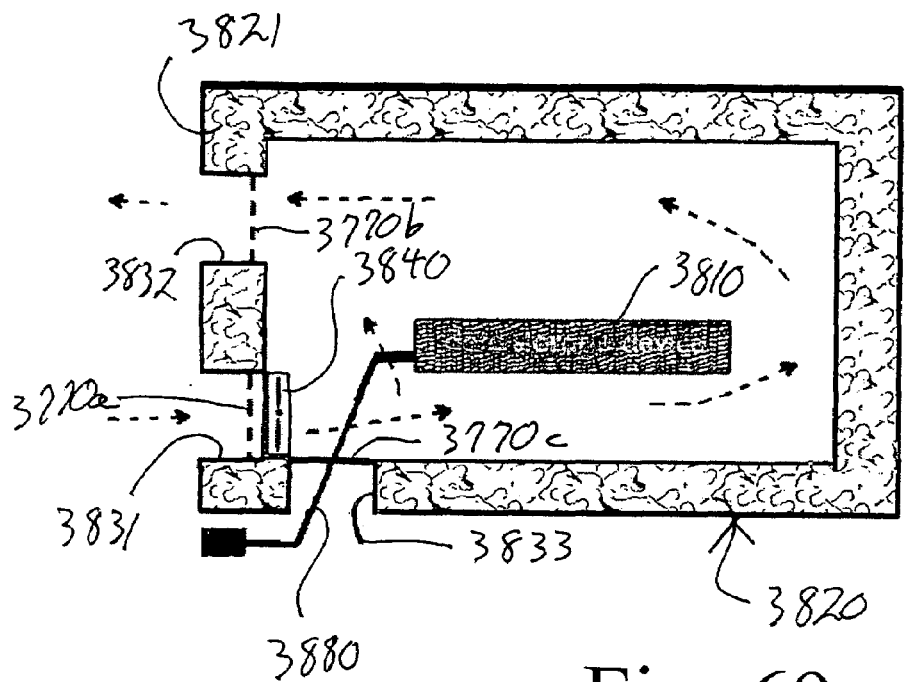
Figure 70:
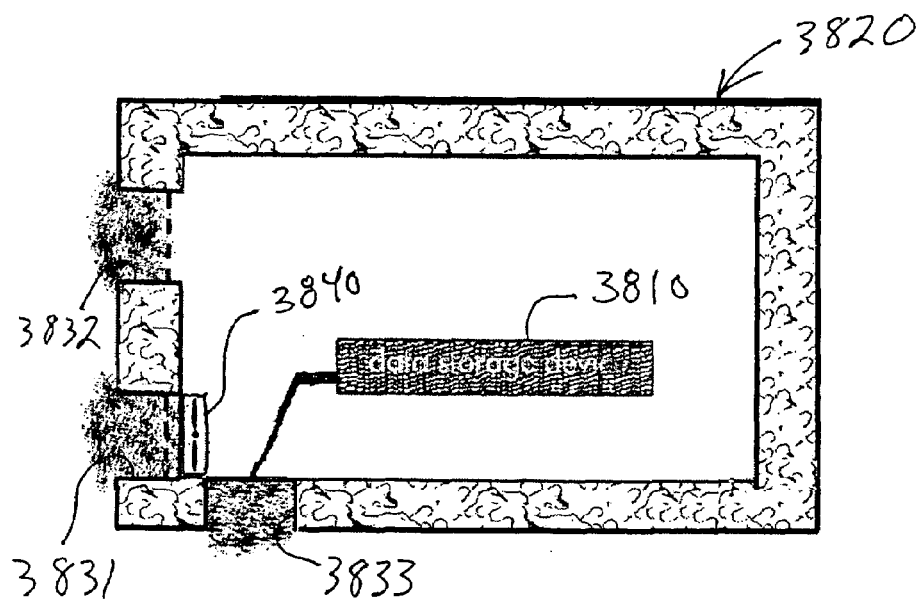

FIGS. 69 and 70 illustrate an enclosure 3820 housing a digital data storage device 3810. The significance of this embodiment is that it includes, in addition to an inlet passageway 3831 and an outlet passageway 3832, a third passageway 3833 which is adapted to receive cables 3880 for transmitting power and data to and from data storage device 3810. Perforated plates 3770a, 3770b and 3770c extend across ventilation passageways 3831, 3832 and cable passageway 3833, respectively. Each of the perforated plates 3770a-c is covered with an intumescent lining (not shown in FIG. 69 for clarity). Upon exposure to fire, the intumescent lining on perforated plates 3770a-c expands and blocks the openings 3831, 3832 and 3833 as illustrated in FIG. 70.

The foregoing description of the invention has been presented for purposes of illustration and description and is not intended to be exhaustive or to limit the invention to the precise form disclosed. Modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. Apparatus for protecting an operable computer digital data storage device from damage or loss of data caused by fire and/or water, comprising:
    an operable digital data storage device,
    a fire resistant enclosure for said operable digital data storage device,
    an opening formed in said enclosure,
    a movable fire resistant hatch positioned adjacent said opening, said hatch movable between a closed position, in which said hatch closes said opening, and an open position wherein ambient air may pass through said opening,
    a water resistant gasket carried by said hatch,
    fan means for actively driving ambient air through said opening to cool said data storage device, and
    hatch closure means for closing said hatch automatically in the presence of a threshold temperature, said hatch closure means including a temperature sensitive element which normally causes said hatch to stay open but which is activated in the presence of said threshold temperature and causes said hatch to move to said closed position.

2. The apparatus of claim 1 further comprising a second opening in said enclosure and a second, movable fire resistant hatch carrying a water resistant gasket positioned adjacent said second opening.

3. The apparatus of claim 1 wherein said movable hatch comprises:
    a body portion which slidably engages said opening in said closed position
    a cap which is carried by said body, said cap being adapted to close against said enclosure in its closed position, and
    said temperature sensitive element comprises a plurality of planar tabs.

4. Apparatus for protecting an operable computer digital data storage device from damage or loss of data caused by fire and/or water, comprising:
    an operable digital data storage device,
    a fire resistant enclosure for said operable digital data storage device,
    an opening formed in said enclosure,
    a movable fire resistant hatch positioned adjacent said opening, said hatch movable between a closed position, in which said hatch closes said opening, and an open position wherein ambient air may pass through said opening,
    fan means for actively driving ambient air through said opening to cool said data storage device, and
    hatch closure means for closing said hatch automatically in the presence of a threshold temperature, said hatch closure means including a temperature sensitive element which normally causes said hatch to stay open but which is activated in the presence of said threshold temperature and causes said hatch to move to said closed position,
    said enclosure being made of molded gypsum, wherein said molded enclosure includes an integrally molded support for said fan means, an integrally molded support for said hatch closure means, and wherein said opening is formed as an integral part of said molded enclosure.

5. Apparatus for protecting an operable computer digital data storage device from damage or loss of data caused by fire, comprising:
    an operable digital data storage device,
    a fire resistant enclosure for said operable digital data storage device,
    an opening formed in said enclosure, said opening adapted to allow free convection of ambient air to cool said data storage device,
    a movable fire resistant hatch positioned adjacent said opening, said hatch movable between a closed position, in which said hatch closes said opening, and an open position wherein ambient air may pass through said opening, and
    hatch closure means for closing said hatch automatically in the presence of a threshold temperature, said hatch closure means including a temperature sensitive element which normally causes said hatch to stay open but which is activated in the presence of said threshold temperature and causes said hatch to move to said closed position.

6. The apparatus of claim 5 further comprising a second opening in said enclosure and a second, movable fire resistant hatch positioned adjacent said second opening, said openings adapted to provide cooling of said data storage device by free convection.

7. The apparatus of claim 5 wherein said movable hatch comprises:
- a body portion which slidably engages said opening in said closed position
- a cap which is carried by said body, said cap being adapted to close against said enclosure in its closed position, and
- said temperature sensitive element comprises a plurality of planar tabs.

8. The apparatus of claim 7 wherein said temperature sensitive element, in the presence of fire, melts and forms a seal between said movable hatch and said enclosure.

9. The apparatus of claim 5 wherein said hatch closure means further comprises a spring connected to said hatch, said spring urging said hatch toward said closed position.

10. The apparatus of claim 5 wherein said hatch closure means includes a solenoid.

* * * * *